(12) United States Patent
Park et al.

(10) Patent No.: US 10,159,158 B2
(45) Date of Patent: Dec. 18, 2018

(54) DEVICE WITH A ROTATABLE DISPLAY

(71) Applicant: Microsoft Technology Licensing, LLC, Redmond, WA (US)

(72) Inventors: Daniel C. Park, Woodinville, WA (US); Anthony J. Hewett, Duvall, WA (US); Mike F. Deily, Bellevue, WA (US); Marlo E. Castillo, Seattle, WA (US); Nishant Srinivasan, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 147 days.

(21) Appl. No.: 15/099,501

(22) Filed: Apr. 14, 2016

(65) Prior Publication Data

US 2017/0303413 A1     Oct. 19, 2017

(51) Int. Cl.
*H05K 5/02* (2006.01)
*H05K 5/00* (2006.01)
*F16M 11/20* (2006.01)
*G06F 1/16* (2006.01)

(52) U.S. Cl.
CPC ....... *H05K 5/0226* (2013.01); *F16M 11/2021* (2013.01); *G06F 1/1601* (2013.01); *H05K 5/0017* (2013.01); *H05K 5/0234* (2013.01); *F16M 2200/063* (2013.01)

(58) Field of Classification Search
CPC ............ F16M 2200/041; G06F 1/1601; G06F 1/1681; H05K 5/0226; Y10S 248/923
See application file for complete search history.

(56) References Cited

U.S. PATENT DOCUMENTS

| | | | |
|---|---|---|---|
| 3,955,241 A | 5/1976 | Little | |
| 4,006,839 A | 2/1977 | Thiel et al. | |
| 4,246,802 A | 1/1981 | Rasmussen et al. | |
| 4,438,458 A | 3/1984 | Munscher | |
| 4,447,026 A | 5/1984 | Maraghe | |
| 4,589,613 A | 5/1986 | Opsahl | |
| 4,802,605 A | 2/1989 | Salmon et al. | |
| 4,825,395 A | 4/1989 | Kinser et al. | |
| 4,834,329 A | 5/1989 | Delapp | |
| 5,200,913 A | 4/1993 | Hawkins et al. | |
| 5,235,495 A | 8/1993 | Blair et al. | |
| 5,239,730 A | 8/1993 | Grass | |
| 5,278,725 A | 1/1994 | Konno et al. | |
| 5,394,297 A | 2/1995 | Toedter | |

(Continued)

FOREIGN PATENT DOCUMENTS

| | | |
|---|---|---|
| CN | 201651697 U | 11/2010 |
| EP | 1344972 A2 | 9/2003 |

(Continued)

OTHER PUBLICATIONS

Non-Final Office Action dated Jul. 13, 2017 from U.S. Appl. No. 15/099,441, 46 pages.

(Continued)

*Primary Examiner* — Bradley Duckworth
(74) *Attorney, Agent, or Firm* — Rainier Patents, P.S.

(57) ABSTRACT

The description relates to devices, such as computing devices having displays that can be rotated through a range of travel. The device can counter-balance the display to create a near weightless feel for the user when repositioning the display.

25 Claims, 34 Drawing Sheets

(56) References Cited

U.S. PATENT DOCUMENTS

| | | |
|---|---|---|
| 5,498,165 A | 3/1996 | Tseng |
| 5,600,868 A | 2/1997 | Tourville et al. |
| 5,640,690 A | 6/1997 | Kudrna |
| 5,729,429 A | 3/1998 | Margaritis et al. |
| 5,876,008 A | 3/1999 | Sweere et al. |
| 5,954,642 A | 9/1999 | Johnson et al. |
| 6,079,993 A | 6/2000 | Laine |
| 6,223,393 B1 | 5/2001 | Knopf |
| 6,262,885 B1 | 7/2001 | Emma et al. |
| 6,381,125 B1 | 4/2002 | Mizoguchi et al. |
| 6,503,167 B1 | 1/2003 | Sturm |
| 6,505,382 B1 | 1/2003 | Lam et al. |
| 6,530,123 B1 | 3/2003 | Wahlstedt |
| 6,730,867 B2 | 5/2004 | Hyp |
| 6,766,180 B2 | 7/2004 | Doraiswamy et al. |
| 6,816,364 B2 | 11/2004 | Helot et al. |
| 6,822,857 B2 | 11/2004 | Jung et al. |
| 6,871,384 B2 | 3/2005 | Novin et al. |
| 7,043,797 B2 | 5/2006 | Cau |
| 7,054,147 B2 | 5/2006 | Maatta et al. |
| 7,145,768 B2 | 12/2006 | Hillman et al. |
| 7,289,315 B2 | 10/2007 | Hillman et al. |
| 7,301,759 B2 | 11/2007 | Hsiung |
| 7,461,433 B2 | 12/2008 | Pan et al. |
| 7,478,786 B2 | 1/2009 | Copeland |
| 7,506,853 B2 | 3/2009 | Sweere et al. |
| 7,643,275 B2 | 1/2010 | Williams et al. |
| 7,654,755 B2 | 2/2010 | Orf et al. |
| 7,694,919 B2 | 4/2010 | Lee |
| 7,766,288 B2 | 8/2010 | Kim et al. |
| 7,886,903 B1 | 2/2011 | Wurzelbacher, Jr. et al. |
| 8,011,623 B2 | 9/2011 | Hwang et al. |
| 8,035,957 B2 | 10/2011 | Jung |
| 8,075,128 B2 | 12/2011 | Park et al. |
| 8,104,142 B2 | 1/2012 | Lowry et al. |
| 8,230,553 B2 | 7/2012 | Degner et al. |
| 8,230,992 B2 | 7/2012 | Law et al. |
| 8,259,437 B2 | 9/2012 | Vesely |
| 8,310,468 B2 | 11/2012 | Martin |
| 8,400,767 B2 | 3/2013 | Yeon et al. |
| 8,505,169 B2 | 8/2013 | Wood et al. |
| 8,534,635 B2 | 9/2013 | Yang et al. |
| 8,537,533 B2 | 9/2013 | Sung |
| 8,549,710 B2 | 10/2013 | Novin |
| 8,608,221 B1 | 12/2013 | Krajenke et al. |
| 8,672,277 B2 | 3/2014 | Hsu |
| 8,724,306 B2 | 5/2014 | Ashcraft et al. |
| 8,769,772 B2 | 7/2014 | Griffin et al. |
| 8,787,016 B2 | 7/2014 | Rothkopf et al. |
| 8,811,005 B2 | 8/2014 | Casebolt et al. |
| 8,888,062 B2 | 11/2014 | Novin |
| 8,897,033 B2 | 11/2014 | Slipy et al. |
| 8,922,995 B2 | 12/2014 | Su |
| 8,925,153 B1 | 1/2015 | McGrath |
| 9,004,436 B2 | 4/2015 | Chen |
| 9,010,822 B2 | 4/2015 | Rasmussen et al. |
| 9,013,865 B2 | 4/2015 | Chen et al. |
| 9,064,431 B2 | 6/2015 | Ahn et al. |
| 9,072,179 B2 | 6/2015 | Su |
| 9,095,253 B2 | 8/2015 | Hinman et al. |
| 9,104,372 B2 | 8/2015 | Frenael |
| 9,155,235 B2 | 10/2015 | Lindblad et al. |
| 9,291,299 B2 | 3/2016 | Richard et al. |
| 9,448,583 B1 | 9/2016 | Lee et al. |
| 9,936,593 B2 | 4/2018 | Deily et al. |
| 9,946,309 B2 | 4/2018 | Hewett et al. |
| 2003/0223188 A1 | 12/2003 | Ha et al. |
| 2004/0021051 A1 | 2/2004 | Chiu |
| 2004/0066614 A1 | 4/2004 | Hong |
| 2004/0127266 A1 | 7/2004 | Aagaard et al. |
| 2004/0216273 A1 | 11/2004 | Kang et al. |
| 2005/0088808 A1 | 4/2005 | Michaux et al. |
| 2005/0108854 A1* | 5/2005 | Lee ................. F16M 11/10 16/340 |
| 2005/0128695 A1 | 6/2005 | Han |
| 2005/0247832 A1 | 11/2005 | Cho et al. |
| 2005/0254203 A1 | 11/2005 | Choi et al. |
| 2006/0039104 A1 | 2/2006 | Wang et al. |
| 2006/0133016 A1 | 6/2006 | North et al. |
| 2006/0176655 A1 | 8/2006 | Hillman et al. |
| 2007/0028419 A1 | 2/2007 | Lu et al. |
| 2007/0047186 A1 | 3/2007 | Jang |
| 2007/0058329 A1 | 3/2007 | Ledbetter et al. |
| 2007/0086155 A1 | 4/2007 | Chen et al. |
| 2007/0151079 A1 | 7/2007 | Lu et al. |
| 2007/0152125 A1 | 7/2007 | Lee |
| 2007/0230095 A1 | 10/2007 | Wu |
| 2008/0068494 A1 | 3/2008 | Kim |
| 2008/0094792 A1 | 4/2008 | Chen et al. |
| 2008/0122736 A1 | 5/2008 | Ronzani et al. |
| 2009/0166501 A1 | 7/2009 | Wang et al. |
| 2010/0059648 A1 | 3/2010 | Zhang et al. |
| 2010/0084522 A1 | 4/2010 | Zhou et al. |
| 2010/0124009 A1 | 5/2010 | Jiang et al. |
| 2011/0051437 A1 | 3/2011 | Ng et al. |
| 2011/0062304 A1 | 3/2011 | Hsieh et al. |
| 2011/0127392 A1 | 6/2011 | Carter |
| 2011/0286171 A1 | 11/2011 | Franz et al. |
| 2011/0299233 A1 | 12/2011 | Kim |
| 2012/0036679 A1 | 2/2012 | Chen |
| 2012/0091298 A1 | 4/2012 | Huang |
| 2012/0262857 A1 | 4/2012 | Fukaya et al. |
| 2012/0102675 A1 | 5/2012 | Lee et al. |
| 2012/0328222 A1 | 12/2012 | Chen et al. |
| 2013/0010424 A1 | 1/2013 | Degner et al. |
| 2013/0021723 A1 | 1/2013 | Harper et al. |
| 2013/0044454 A1 | 2/2013 | Lin et al. |
| 2013/0112818 A1 | 5/2013 | Hsu |
| 2013/0144446 A1 | 6/2013 | Rihn et al. |
| 2014/0063750 A1 | 3/2014 | Mau et al. |
| 2014/0085798 A1 | 3/2014 | Myerchin |
| 2014/0159995 A1 | 6/2014 | Adams et al. |
| 2014/0215758 A1 | 8/2014 | Franklin et al. |
| 2014/0218854 A1 | 8/2014 | Onda |
| 2014/0268555 A1 | 9/2014 | Kurczewski |
| 2014/0298616 A1 | 10/2014 | Baer |
| 2014/0321041 A1 | 10/2014 | Hsu et al. |
| 2014/0353453 A1 | 12/2014 | Quijano et al. |
| 2015/0000435 A1 | 1/2015 | Zhang et al. |
| 2015/0048230 A1 | 2/2015 | Satterfield |
| 2015/0092335 A1 | 4/2015 | Patrick et al. |
| 2015/0097092 A1 | 4/2015 | Fu et al. |
| 2015/0121654 A1 | 5/2015 | Novin |
| 2015/0185709 A1 | 7/2015 | Vroom et al. |
| 2015/0265048 A1 | 9/2015 | Lindblad |
| 2015/0277506 A1 | 10/2015 | Cheah et al. |
| 2015/0285233 A1 | 10/2015 | Theodore et al. |
| 2015/0336480 A1 | 11/2015 | Szakelyhidi et al. |
| 2015/0362692 A1 | 12/2015 | Lee et al. |
| 2015/0362962 A1 | 12/2015 | Lee et al. |
| 2016/0161045 A1 | 6/2016 | Lee et al. |
| 2017/0300082 A1 | 10/2017 | Park et al. |
| 2017/0300083 A1 | 10/2017 | Park et al. |
| 2017/0303415 A1 | 10/2017 | Deily et al. |
| 2017/0311464 A1 | 10/2017 | Park et al. |
| 2017/0357293 A1 | 12/2017 | Hewett et al. |

FOREIGN PATENT DOCUMENTS

| | | |
|---|---|---|
| EP | 1507387 A1 | 2/2005 |
| EP | 1526436 A2 | 4/2005 |
| TW | M430129 U1 | 5/2012 |
| WO | 1998016144 A1 | 4/1998 |
| WO | 2006/095987 A1 | 9/2006 |
| WO | 2015/016837 A1 | 2/2015 |

OTHER PUBLICATIONS

Notice of Allowance dated Aug. 11, 2017 from U.S. Appl. No. 15/179,383, 22 pages.

Corrected Notice of Allowability dated Jun. 20, 2017 from U.S. Appl. No. 15/099,238, 8 pages.

(56) References Cited

OTHER PUBLICATIONS

Corrected Notice of Allowability dated Jul. 13, 2017 from U.S. Appl. No. 15/099,238, 8 pages.
Lenovo Yoga 3 Pro, captured by the Internet archive on Aug. 11, 2015 at <<http://shop.lenovo.com/us/en/laptops/lenovo/yoga-laptop-series/yoga-3-pro-laptop/>>, 2 pages.
"Prepara iPrep Tablet Stand with Stylus", retrieved at <<http://www.rakuten.com/prod/prepara-iprep-tablet-stand-with-stylus-white/256971780.html>>, Dec. 29, 2015, 3 pages.
Korane, Kenneth, "Options for Designing the Best Hinge", retrieved at <<http://machinedesign.com/news/options-designing-best-hinge>>, Jul. 19, 2012, 4 pages.
Westover, Brian, "HP Spectre x360 13t (13-4003)", captured by the Internet archive on Jul. 21, 2015 at <<http://in.pcmag.com/hp-spectre-x360-13t-13-4003/40964/review/hp-spectre-x360-13t-13-4003>>, 6 pages.
Jones, Christie, "Options for Designing the Best Hinge", Published on: Jul. 19, 2012, 4 Pages; Available at: http://machinedesign.com/news/options-designing-best-hinge.
Notice of Allowance dated Apr. 20, 2017 from U.S. Appl. No. 15/099,238, 38 pages.
Non-Final Office Action dated Mar. 21, 2017 from U.S. Appl. No. 15/179,383, 40 pages.
"Are there any types of DC motors that self-lock themselves?", retrieved at <<http://electronics.stackexchange.com/questions/91916/are-there-any-types-of-dc-motors-that-self-lock-themselves>>, Nov. 26, 2013, 2 pages.
"Grass Products", retrieved at <<http://www.grass.at/uebersicht-nexis-click-on.html?L=1>>, on Dec. 24, 2015, 1 page.
"Humanscale M8 Monitor Arm", retrieved at <<http://www.thehumansolution.com/humanscale-m8-monitor-arm-sds.html>>, on Apr. 12, 2012, 3 pages.
"World's First "Ultra-Compact One-Way Clutch" Announced", retrieved at <<http://www.ntn.co.jp/english/news/new_products/news20020315.html#add1>>, Mar. 15, 2002, 2 pages.
Subramanian, et al., "Assembly Analysis of Interference Fits in Elastic Materials", Proceedings of 5th IFIP WG 5.5 International Precision Assembly Seminar, IFIP Advances in Information and Communication Technology, Feb. 14, 2010, 9 pages.

U.S. Appl. No. 62/357,880 titled "Hinge Clutch" filed Jul. 1, 2016 by Inventor Marlo E. Castillo, 47 pages.
International Search Report and Written Opinion dated Jul. 7, 2017 from PCT Patent Application No. PCT/US2017/027080, 25 pages.
International Search Report and Written Opinion dated Jul. 18, 2017 from PCT Patent Application No. PCT/US2017/027081, 27 pages.
International Search Report and Written Opinion dated Jun. 8, 2017 from PCT Patent Application No. PCT/US2017/026872, 20 pages.
International Search Report and Written Opinion dated Jul. 18, 2017 from PCT Patent Application No. PCT/US2017/028240, 13 pages.
International Search Report and Written Opinion dated Jun. 30, 2017 from PCT Patent Application No. PCT/US2017/027082, 24 pages.
International Search Report and Written Opinion dated Jun. 30, 2017 from PCT Patent Application No. PCT/US2017/026874, 22 pages.
Response filed Oct. 9, 2017 to Non-Final Office Action dated Jul. 13, 2017 from U.S. Appl. No. 15/099,441, 9 pages.
Invitation to Pay Additional Fees and partial International Search Report dated Sep. 1, 2017 from PCT Patent Application No. PCT/US2017/035571, 13 pages.
Notice of Allowance dated Sep. 19, 2017 from U.S. Appl. No. 15/099,238, 20 pages.
Response filed Oct. 9, 2017 to the Restriction Requirement dated Jun. 8, 2017 from U.S. Appl. No. 15/139,197, 6 pages.
Response filed May 18, 2017 to the Non-Final Office Action dated Mar. 21, 2017 from U.S. Appl. No. 15/179,383, 11 pages.
Requirement Restriction dated Jun. 8, 2017 from U.S. Appl. No. 15/139,197, 5 pages.
International Search Report and Written Opinion dated Dec. 6, 2017 from PCT Patent Application No. PCT/US2017/035571, 19 pages.
Non-Final Office Action dated Nov. 14, 2017 from U.S. Appl. No. 15/139,197, 56 pages.
"Counterbalance Torsion Spring System", Retrieved from <<http://www.cbal.com/uploads/3/3/6/7/3367458/brochure_cbal_2013.pdf>>, Retrieved Date: May 20, 2016, 02 Pages.
"Final Office Action Issued in U.S. Appl. No. 15/139,197", dated May 23, 2018, 8 Pages.

* cited by examiner

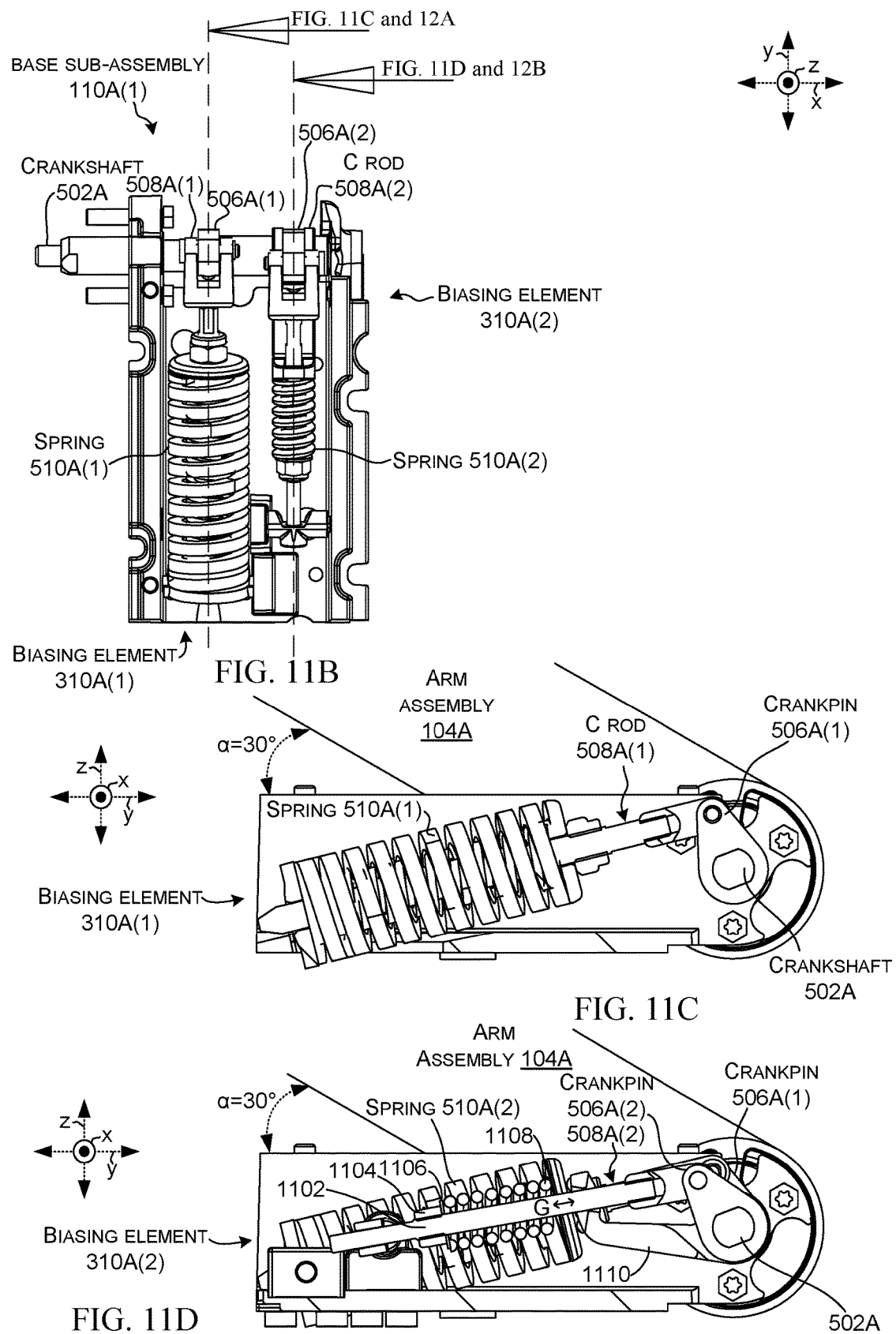

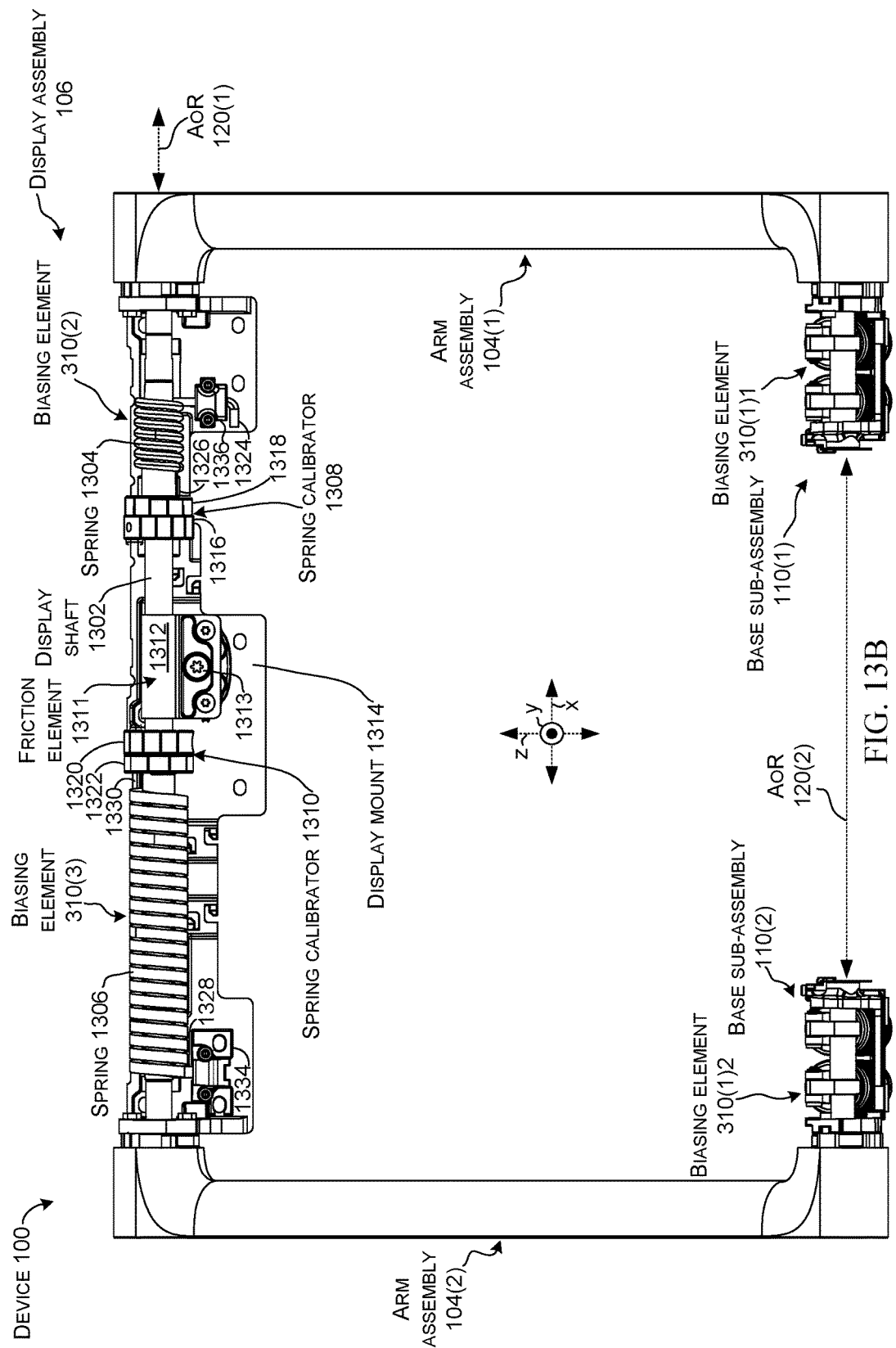

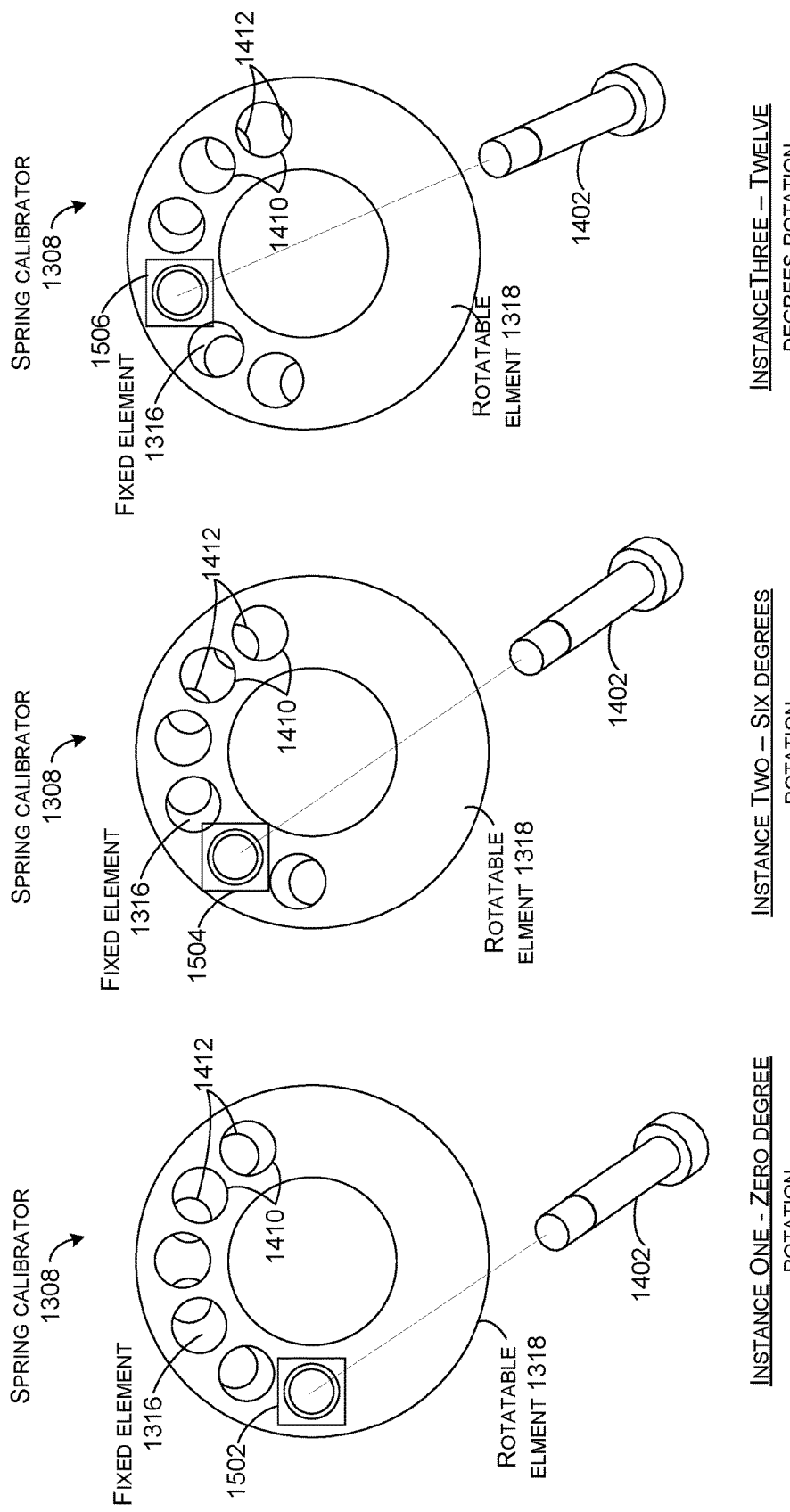
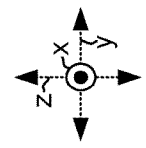
FIG. 15

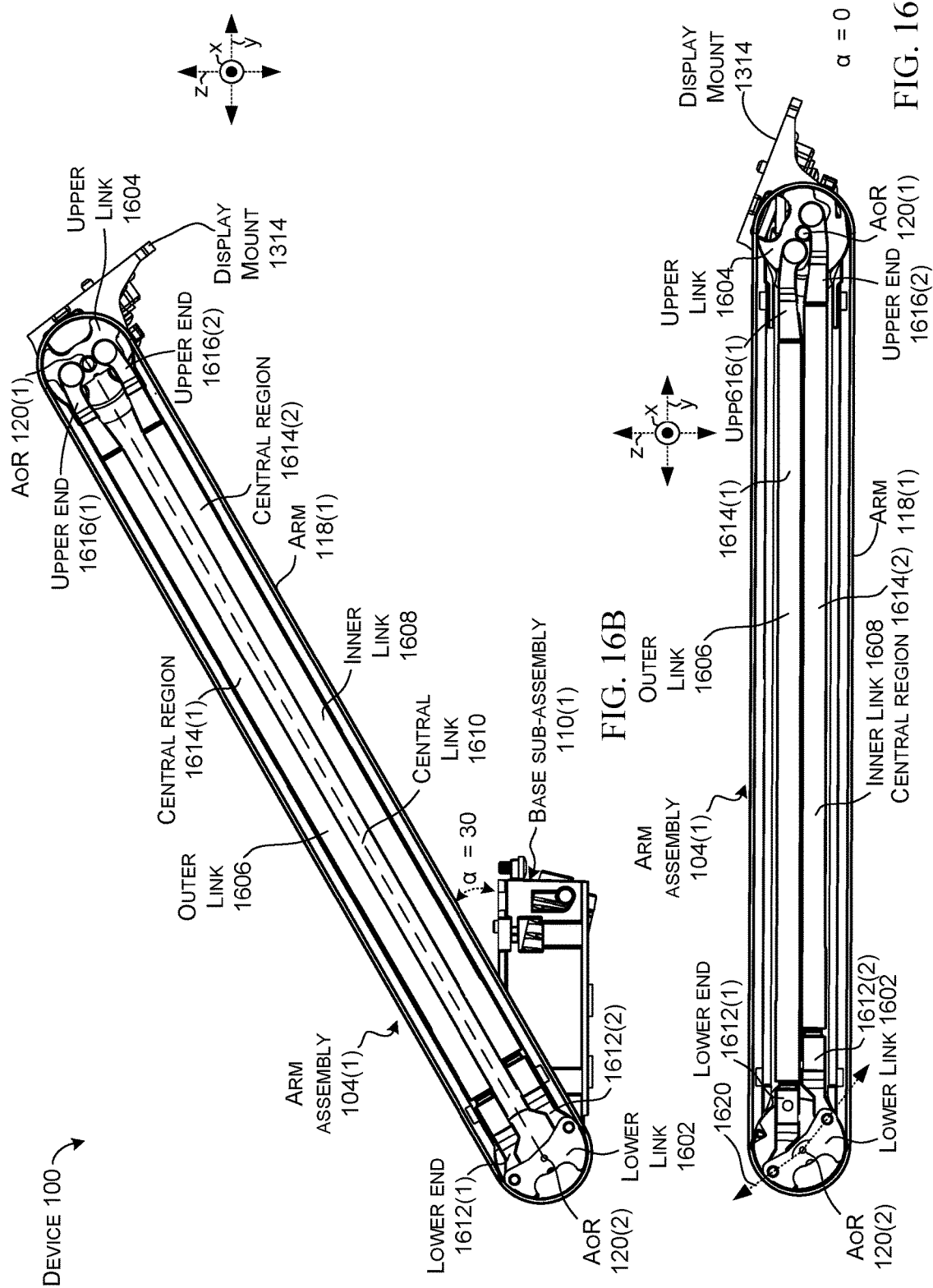

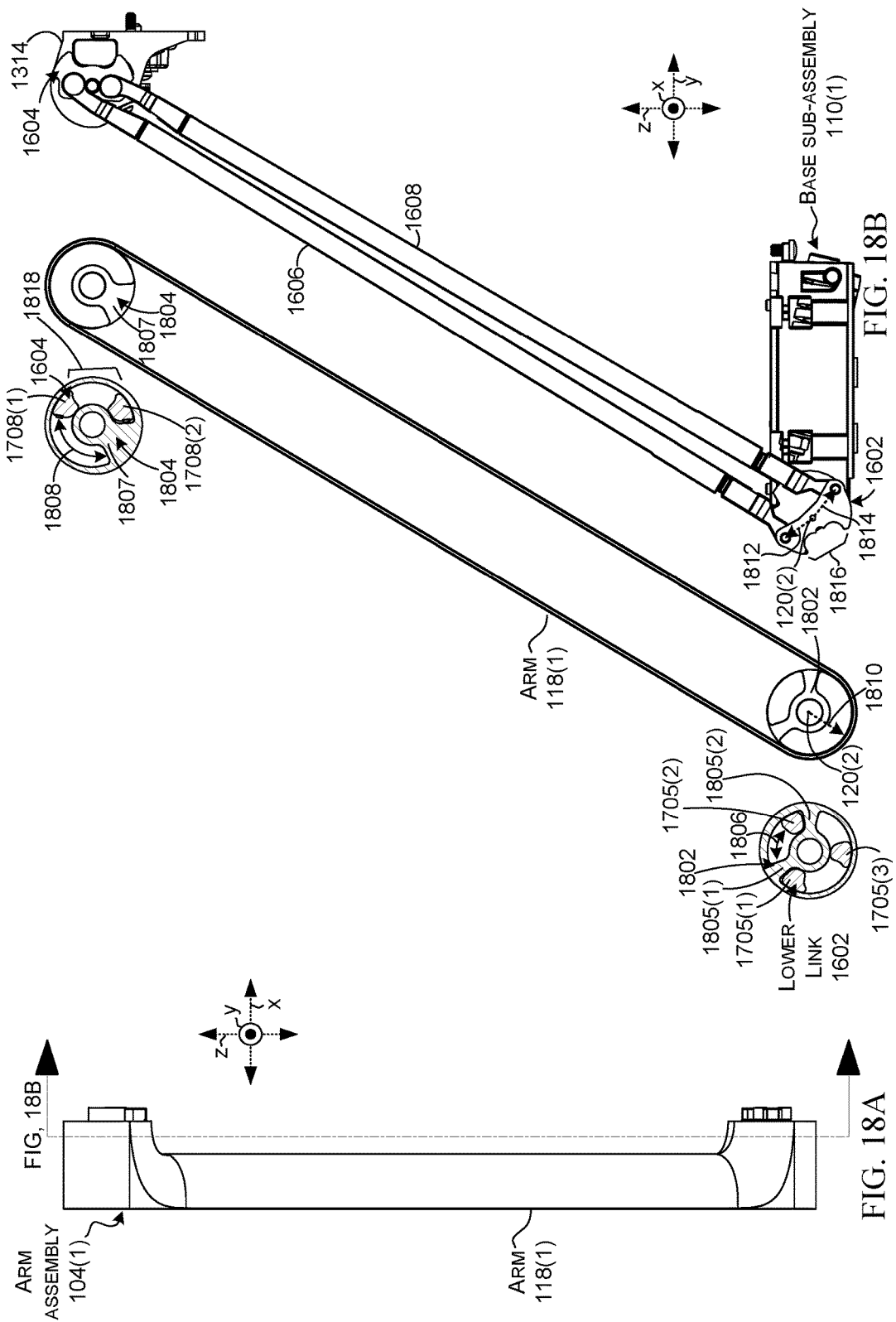

DEVICE WITH A ROTATABLE DISPLAY

BACKGROUND

The description relates to devices that include a display that can be readily adjusted to a desired physical position.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 5C, 11B, 13B, 16B, 16C, 18A are elevational views of portions of example devices in accordance with the present concepts.

FIGS. 5D, 6C, 7C, 8C, 9C, 10C, 11C, 11D, 12A, 12B, 15, 18B are sectional views of portions of example devices in accordance with the present concepts.

DESCRIPTION

Figure 1A:
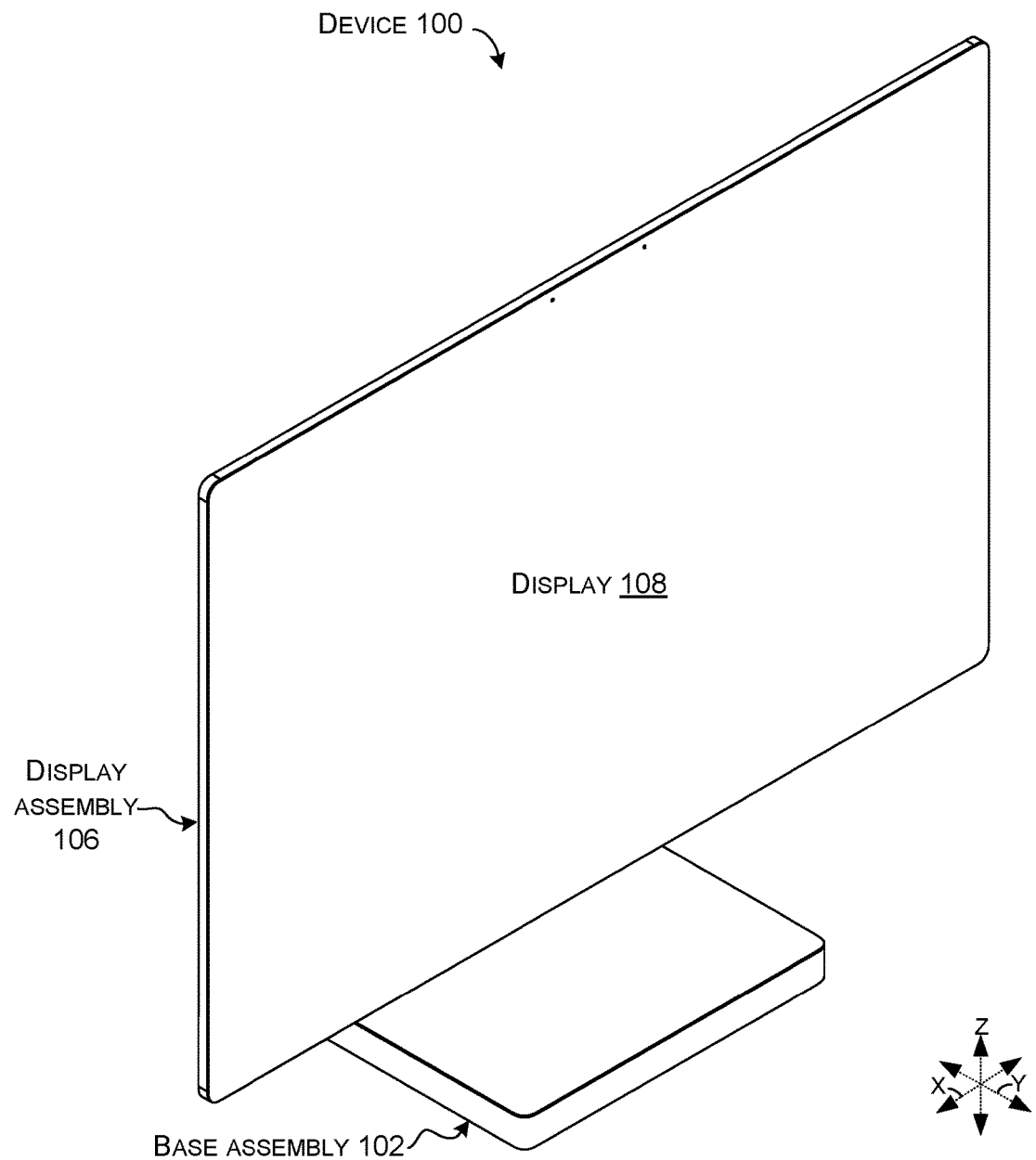
FIGS. 1A and 1B are perspective views of an example device in accordance with the present concepts.
Figure 1B:
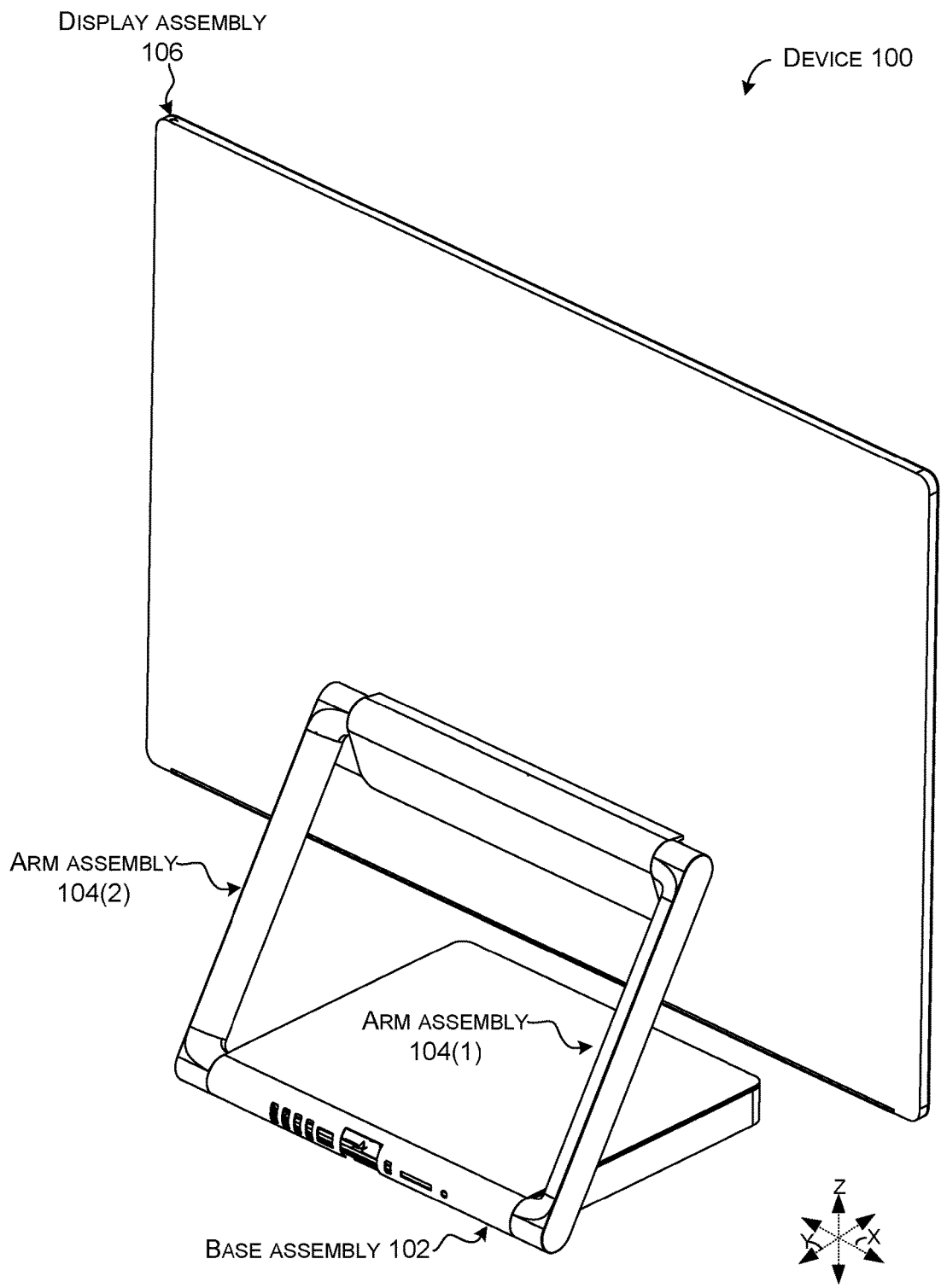
Figure 1C:
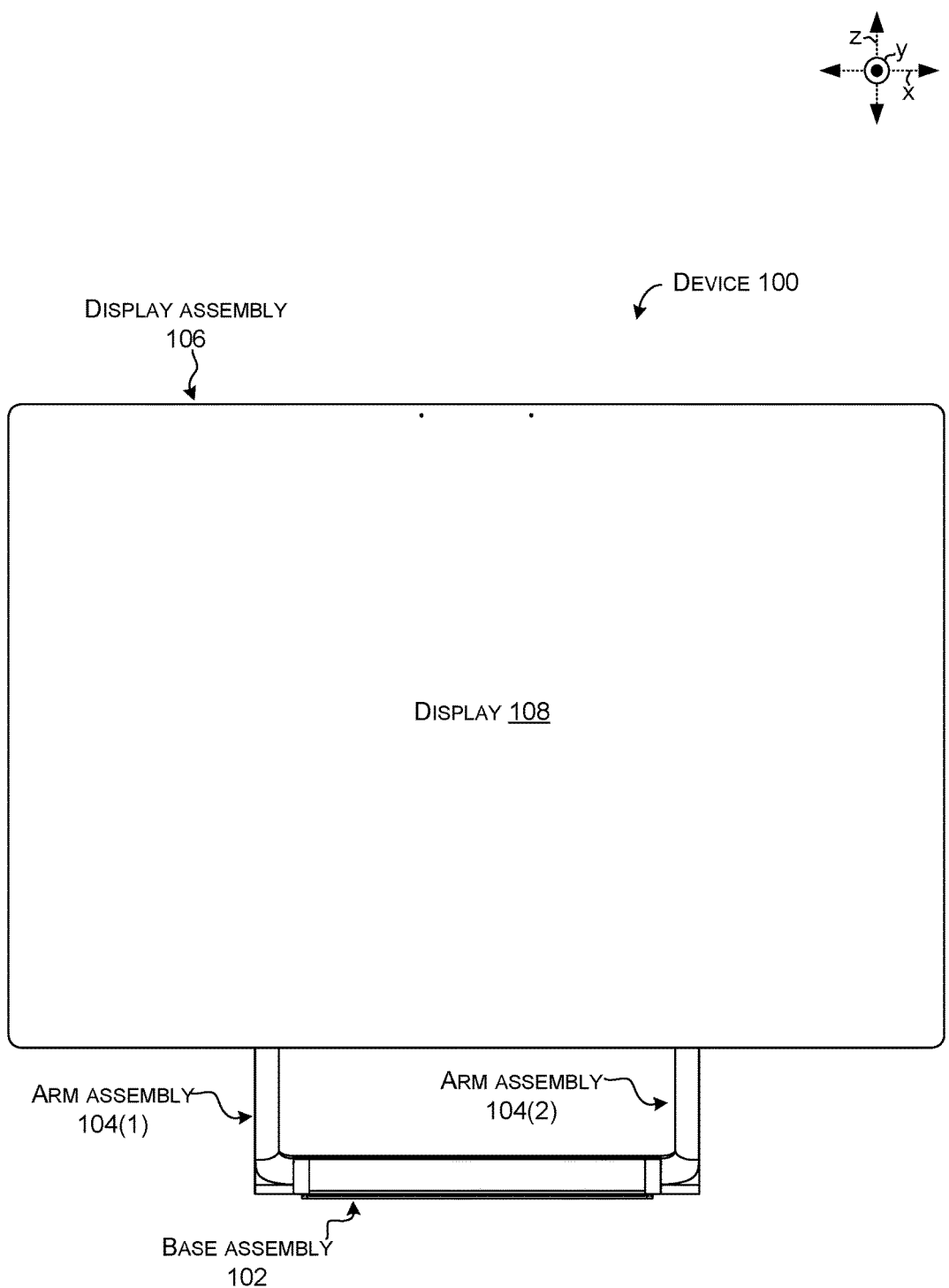
FIGS. 1C, 1D, 2, 3, 5A, 6A, 7A, 8A, 9A, 10A, 16A are elevational views of an example device in accordance with the present concepts.

The present concepts relate to devices, such as computing devices that include an adjustable display. The display can be a touch display that can be adjusted to multiple different physical positions. The device can automatically maintain an individual position unless the user moves the display to a different position. Yet from the user perspective, moving the display from one position to another can seem almost effortless. From another perspective, the device can include a hinge that positions the display for the user.

Introductory FIGS. 1A-1D collectively show a device 100 that includes a base assembly 102, an arm assembly 104, and a display assembly 106 that includes a display 108. Movement of the arm assembly relative to the base assembly and the display assembly can be thought of as a hinge or as providing a hinge functionality.

The base assembly 102 can include a base sub-assembly 110 and a housing 112. The base sub-assembly 110 can include components related to rotation of arm assembly 104. In some implementations the base assembly 102 can contain various electronic components 114, such as a processor 116 for controlling the display 108. Other example electronic components can include a battery and/or an AC-to-DC converter, among others. The processor's controlling can be achieved wirelessly or via conductors (not shown) that travel from the base assembly 102 to the display assembly 106 via the arm assembly 104. Other base assembly implementations may lack electronic components. For instance, electronic components can be located in the display assembly rather than the base assembly.

Note that there can be two arm assemblies 104(1) and 104(2) and two base sub-assemblies 110(1) and 110(2) (e.g., left and right), but these elements can generally be discussed interchangeably or generically in the description below. As a result, the suffix (e.g., "(1)" or "(2)") may not be used strictly in the following description and drawings.

The arm assembly 104 can include a hinge arm (e.g., 'arm') 118. The arm assembly 104 can rotatably couple the display assembly 106 to the base assembly 102 relative to the upper and lower axes of rotation 120(1) and 120(2). Specifically, rotation around the lower axis of rotation 120(2) can define an angle alpha or 'α' between the hinge arm 118 and the base assembly 102 (e.g., between the arm and a horizontal surface 122 upon which the device is positioned). Rotation around hinge axes 120(1) and 120(2) can define an angle beta or 'β' between the display assembly 106 (e.g., display 108) and the horizontal surface 122. The beta angle can also be viewed as the 'angle of the display' or 'display angle.'

Figure 2:
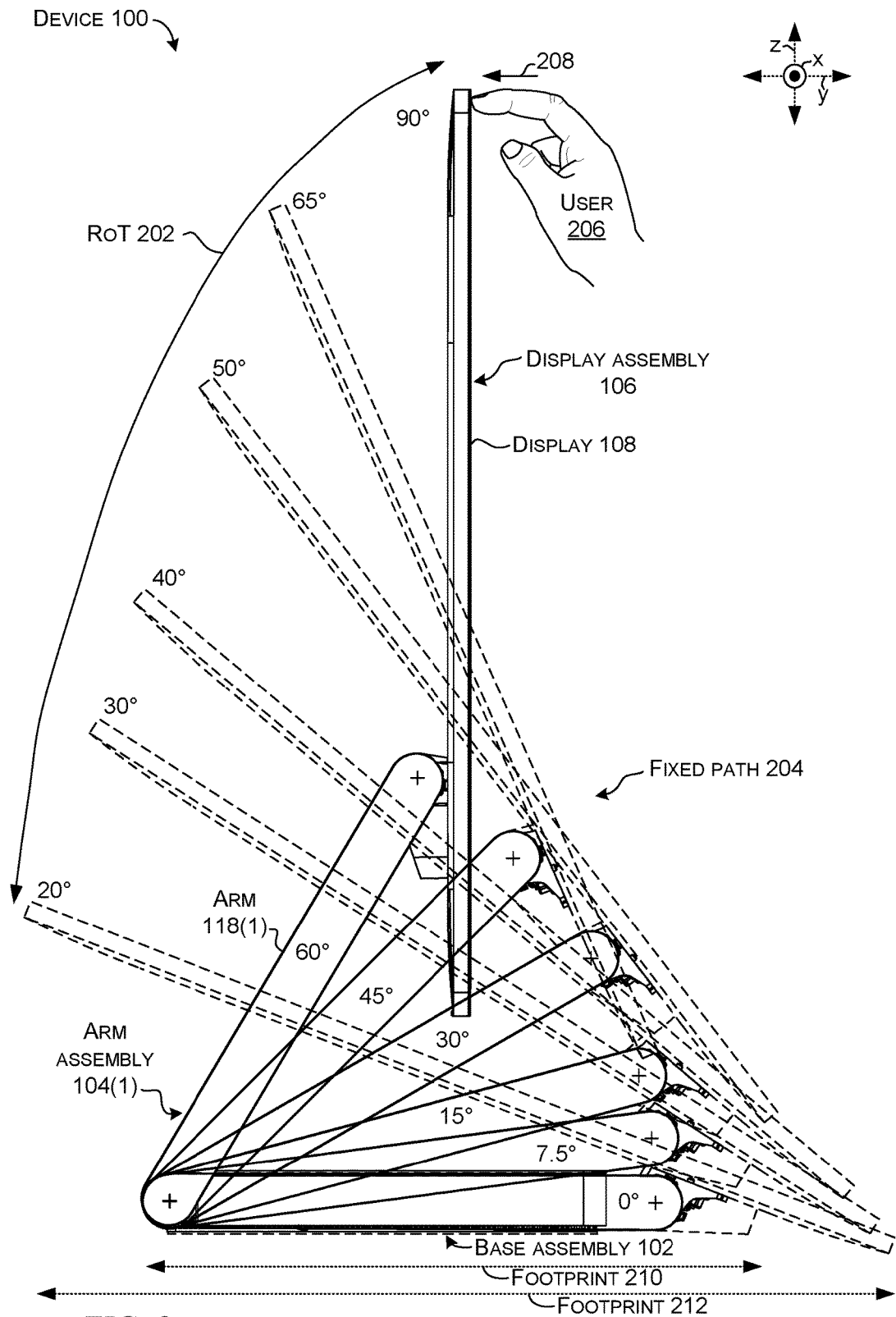

FIG. 2 shows the device 100 through a range of travel 202 along a fixed non-linear motion path 204 (e.g., with a single degree of freedom such that an individual angle of the hinge arm 118(1) translates to a specific individual angle of the display 108 or beta angle). For instance, in this example a 60 degree alpha angle is translated into a 90 degree beta angle (e.g. work mode), a 45 degree α angle is translated into a 65 degree beta angle, a 30 degree alpha angle is translated into a 50 degree beta angle, a 15 degree alpha angle is translated into a 40 degree beta angle, a 7.5 degree alpha angle is translated into a 30 degree beta angle, and a zero degree alpha angle is translated into a 20 degree beta angle (draw mode), among others. In other cases, the draw mode can be generally horizontal (e.g., +/− ten degrees from horizontal). In still other implementations, the draw mode can be in a range from about zero degrees to about 30 degrees. Other implementations can employ multiple degree of freedom configurations.

Further, while the device 100 can maintain an orientation during use, such as when a user 206 touches a touch sensitive version of the display 108, the user can almost effortlessly rotate the display 108 by supplying a small force 208 to the display assembly 106 or the arm assembly 104. From one perspective the device 100 can provide a nearly weightless experience to the adjusting user (e.g., the weight of the display assembly 106 can be effectively balanced (e.g., counter-balanced) throughout the range of travel 202). Stated another way, the device 100 can provide nearly net-zero torque throughout the range of travel 202. The weightlessness can be achieved by counter-balancing the weight of the display assembly 106 and the arm assembly 104 that creates a rotational force (e.g., torque) around the upper and lower axes of rotation 120(1) and 120(2). However, this rotational force can change through the range of travel 202 as the alpha and beta angles change. Various biasing elements for counter-balancing the changing rotational forces are described below relative to FIGS. 5A-10C. These biasing elements can operate to counter-balance the range of rotational force encountered through the range of travel 202. Various implementations can employ different combinations of biasing elements. For instance, some implementations can employ a single biasing element, while other implementations employ two, three, or more biasing elements. In some implementations, multiple biasing elements can operate cooperatively to counter-balance the range of rotational force encountered through the range of travel 202.

Some of the present implementations can achieve this weightless experience with a relatively small footprint 210. For instance, in some implementations, no portion of the device extends beyond a largest footprint 212 defined by the display (e.g., in this case footprint 212 of the display assembly 106 defined when the alpha angle is zero and the beta angle is 20 degrees compared to footprint 210 of a remainder of the device). The present implementations can be robust to allow the user to apply high touch forces in both work and draw modes and allow the end user to lean on the device 100 without damaging it.

Figure 3:
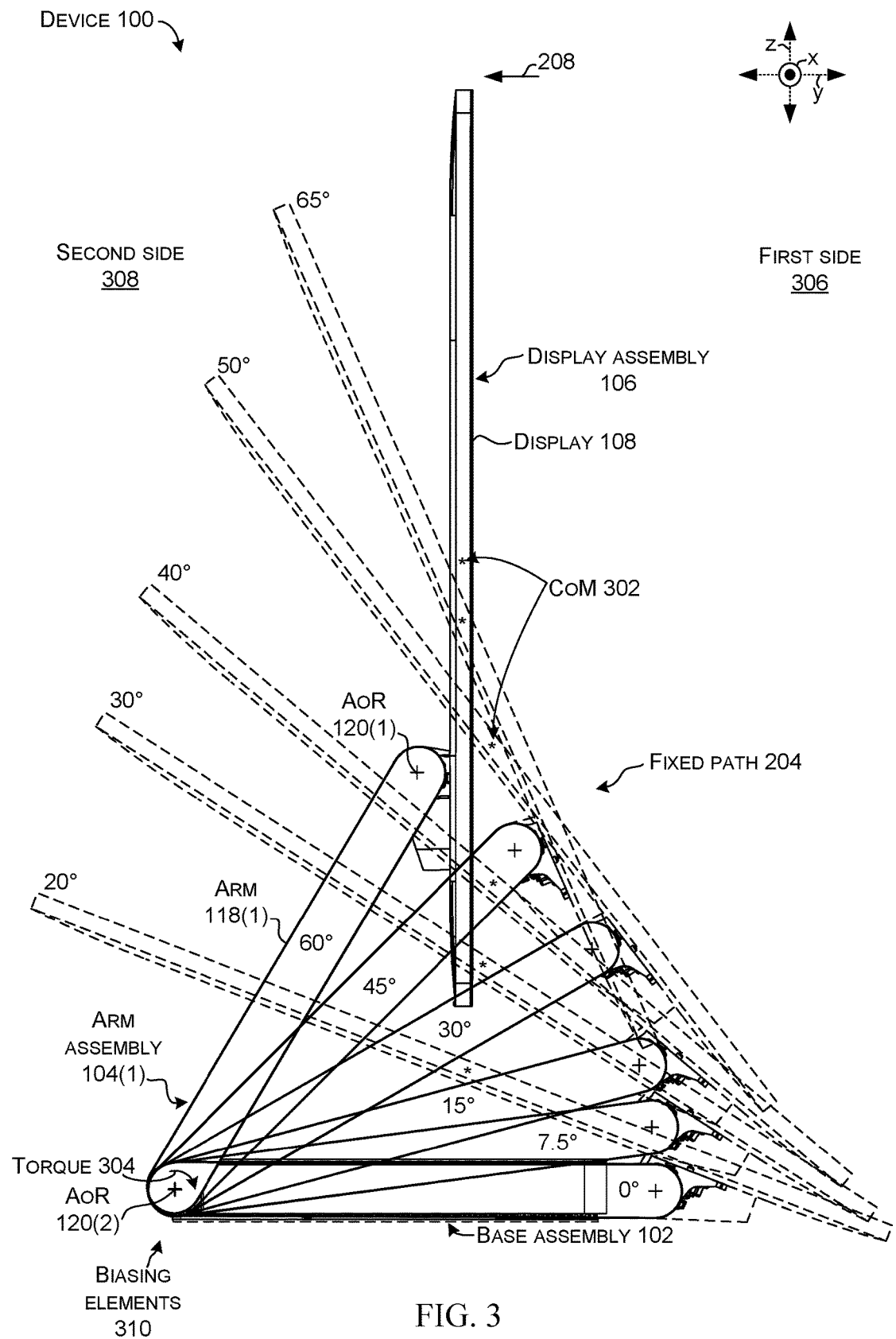

FIG. 3 is similar to FIG. 2, and adds the center of mass 302 of the display assembly 106 at various alpha angles. (The center of mass 302 is shown as a '*'). The mass of the display assembly can create torque 304 on the lower axis of rotation 120(2). In relation to the center of mass 302, note that in this implementation, in the 60 degree alpha angle the center of mass is on a first side (e.g., frontside) 306 of the axis or rotation 120(1). At approximately 50-55 degrees, the center of mass transitions to a second opposite side (e.g., backside) 308 of the axis of rotation 120(1). This transition can be one of several factors that cause torque 304 imparted on the lower axis of rotation 120(2) and/or the upper axis of rotation 120(1) to be non-linear. In order to effectively compensate for this non-linear torque, some of the present implementations can employ multiple biasing elements (indicated generally at 310) to create the near weightless user experience by counter-balancing this non-linear torque. Individual biasing elements are described below. For instance, FIGS. 5A-10C relate to a first biasing element 310(1), FIGS. 11A-12B relate to a variation of first biasing element 310A(1) and a second biasing element 310A(2), and FIGS. 13A-14B relate to second and third biasing elements 310(2) and 310(3).

Figure 4:
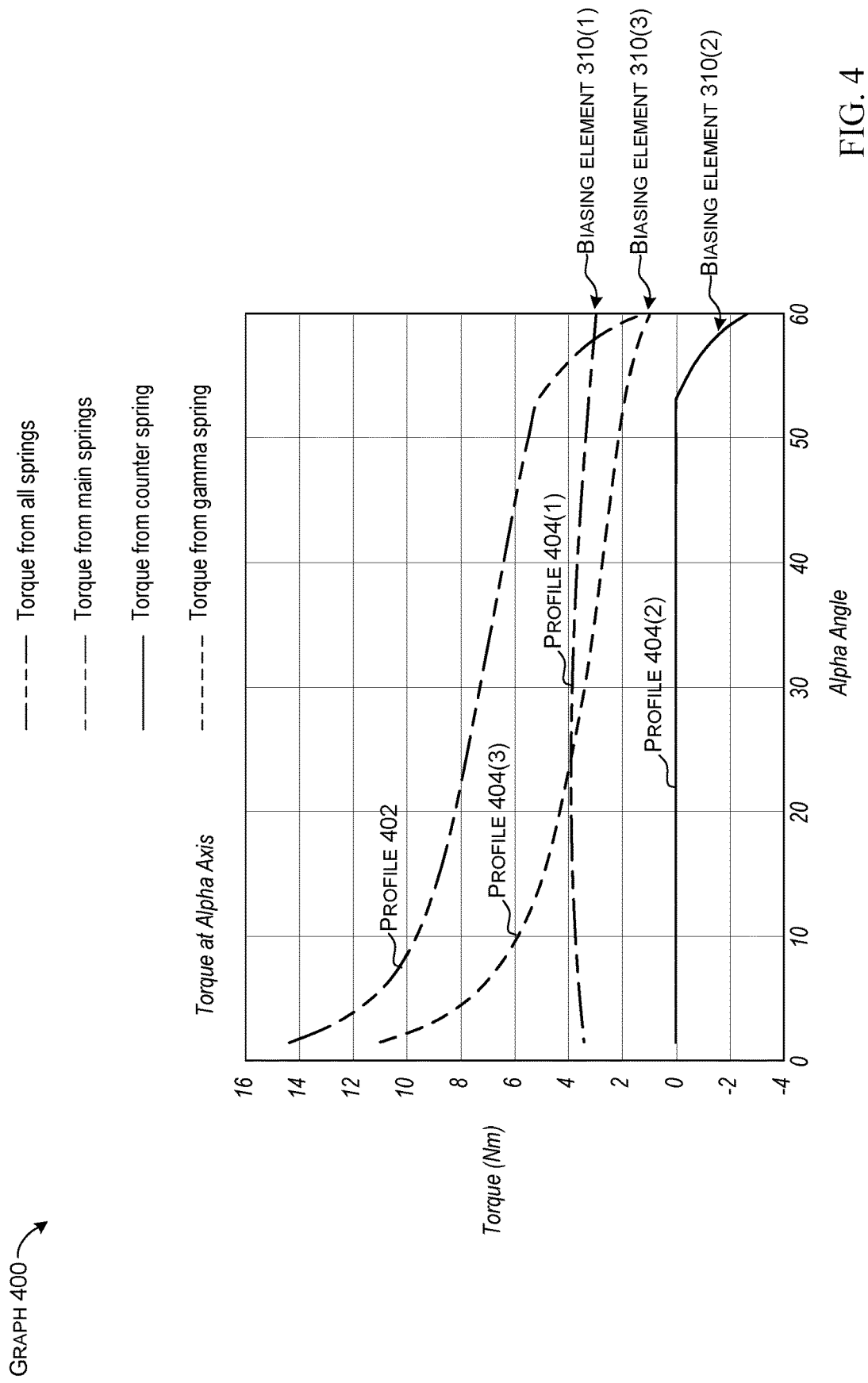
FIGS. 4 and 20 are graphs relating to example devices in accordance with the present concepts.

FIG. 4 is a graph 400 that maps device torque at the lower axis of rotation (120(2), FIG. 3) on the vertical axis versus the alpha angle on the horizontal axis. The graph 400 shows an example non-linear torque curve or profile 402 that can counter-balance torque 304 of FIG. 3. In this case, three different biasing elements 310(1), 310(2,) and 310(3) can contribute respective torque curves or profiles 404(1), 404(2), and 404(3) that collectively can approximate torque profile 402. Example biasing elements are described below starting with FIG. 5A. A point of note relative to graph 400 is that the biasing elements can work collectively to supply the counter-balancing to torque profile 402.

Figure 10A:
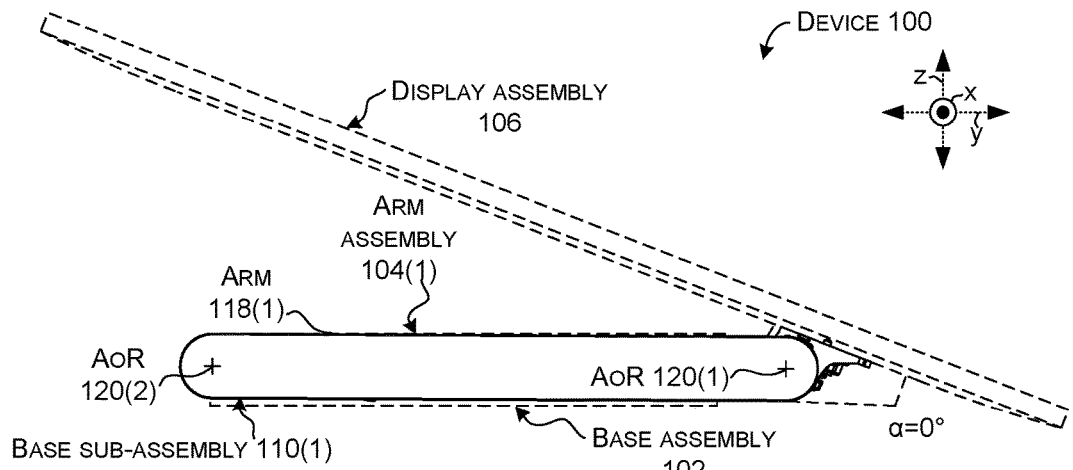
Figure 10B:
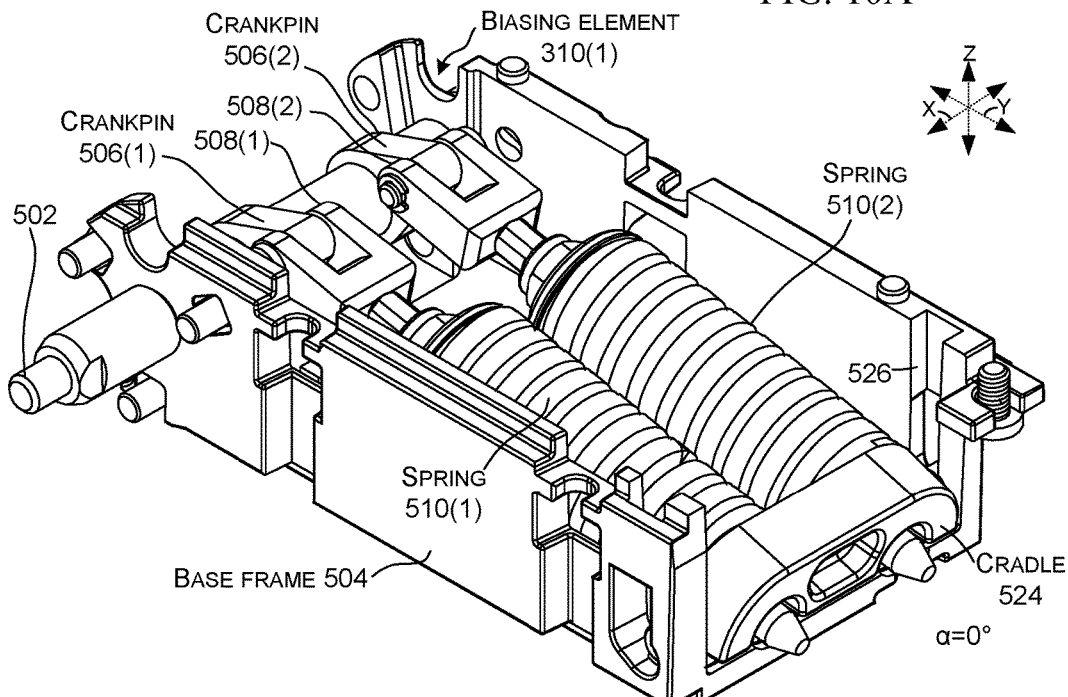
Figure 10C:
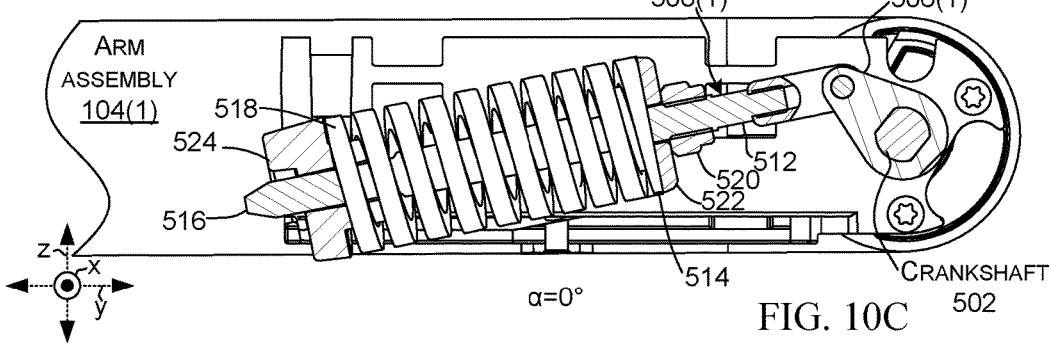
Figure 11A:
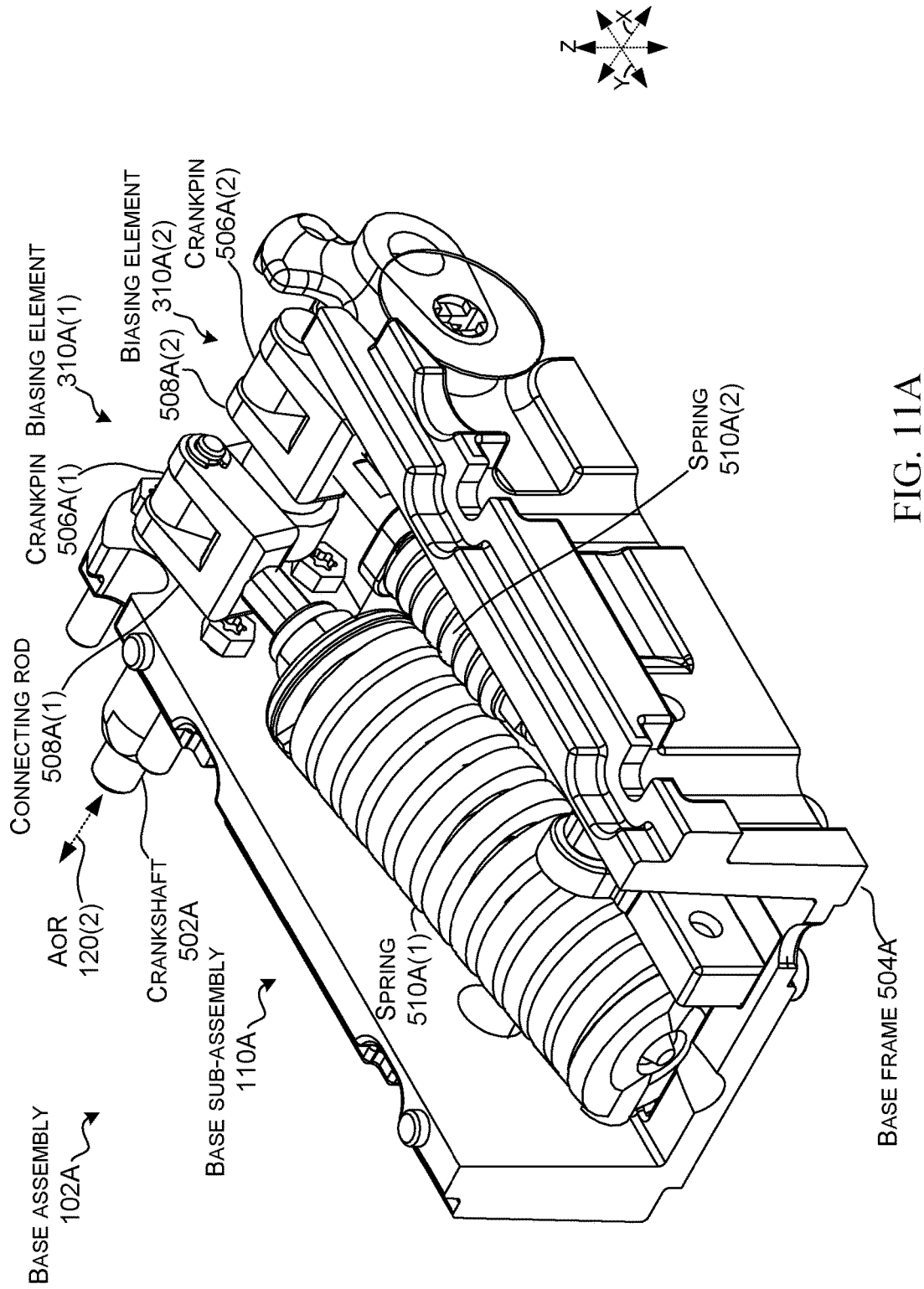
Figure 12A:
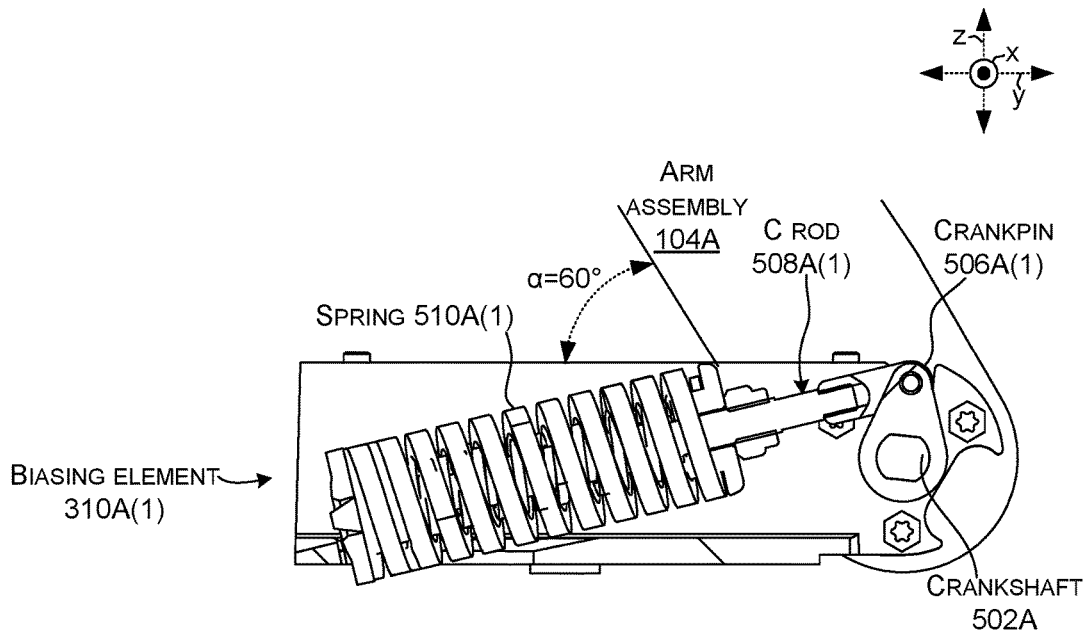
Figure 12B:
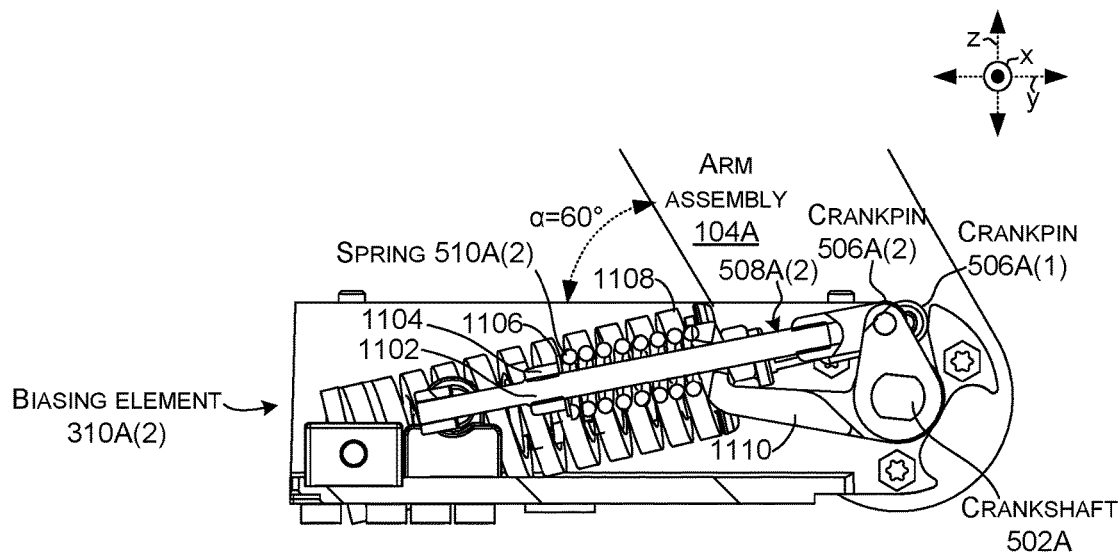

FIGS. 5A-10C collectively show features of an example base assembly 102 that can contribute to the advantages outlined above and/or additional advantages. FIGS. 5A-5D show the base assembly 102 in the 60 degree alpha angle orientation. FIGS. 6A-6C show the base assembly in a 45 degree alpha angle orientation. FIGS. 7A-7C show the base assembly in a 30 degree alpha angle orientation. FIGS. 8A-8C show the base assembly in a 15 degree alpha angle orientation. FIGS. 9A-9C show the base assembly in a 7.5 degree alpha angle orientation. FIGS. 10A-10C show the base assembly in a zero degree alpha angle orientation.

In this case, the base sub-assembly 110 can include a crankshaft 502 that defines the lower axis of rotation 120(2). The crankshaft can be rotatably secured to a base frame 504. The crankshaft can include one or more crank lobes or pins 506 positioned in cranks 507. In this case, two crankpins 506(1) and 506(2) are employed in two cranks 507(1) and 507(2). Connecting rods 508 are coupled to the crankpins 506. The connecting rods 508 can be acted upon by springs 510. In this case, the springs 510 are compression springs that are co-extensive with the connecting rods 508. For instance, spring 510(1) is co-extensive with connecting rod 508(1) and spring 510(2) is co-extensive with connecting rod 508(2). The springs 510 can impart rotational forces (e.g., torque) on the crankshaft 502 via the connecting rod 508, the crankpin 506, and the crank 507. As such, the springs 510, connecting rods 508, crankpins 506, cranks 507, and crankshaft 502 can be viewed as an example biasing element 310(1).

Figure 5A:
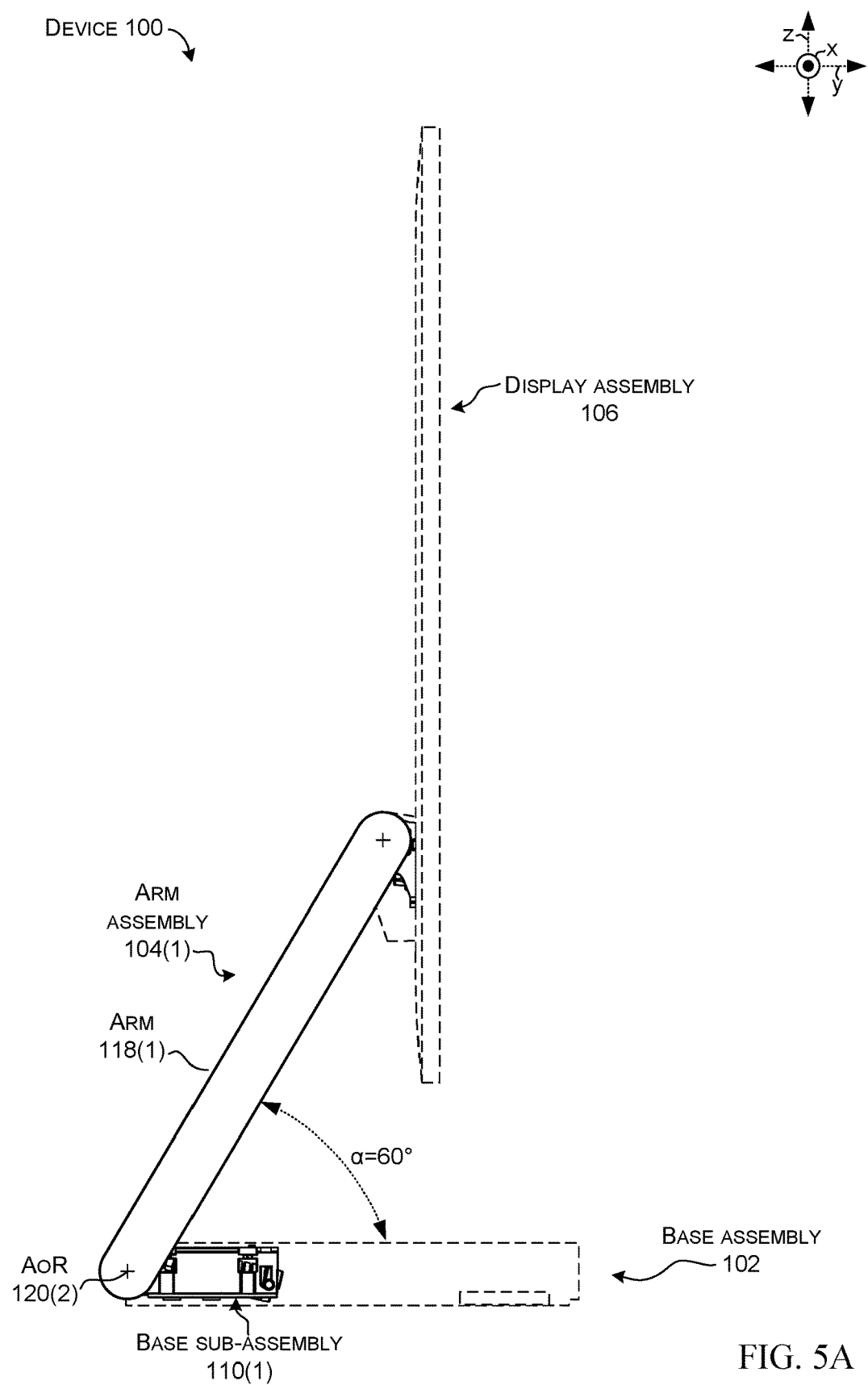
Figure 5B:
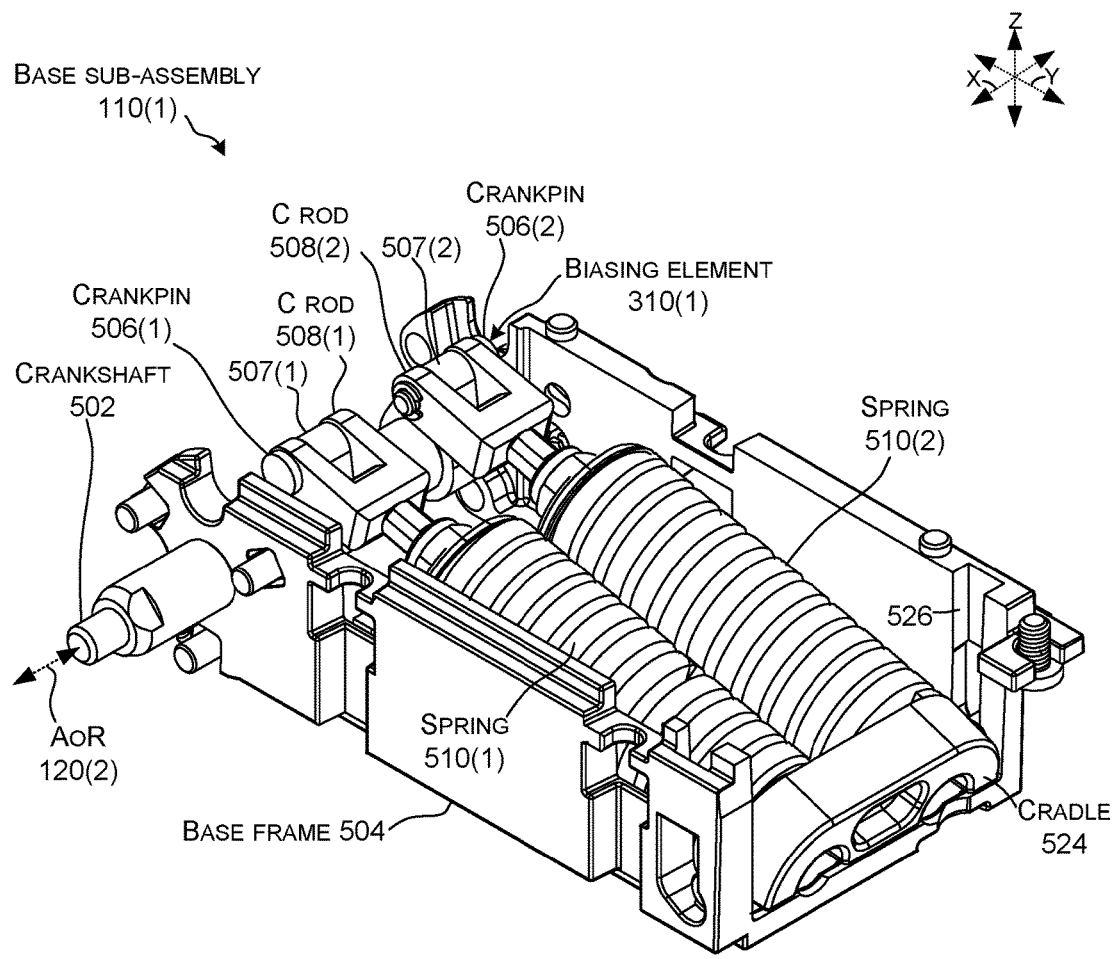
FIGS. 5B, 6B, 7B, 8B, 9B, 10B, 11A, 13A, 14A, 19A are perspective views of portions of example devices in accordance with the present concepts.
Figure 5C:
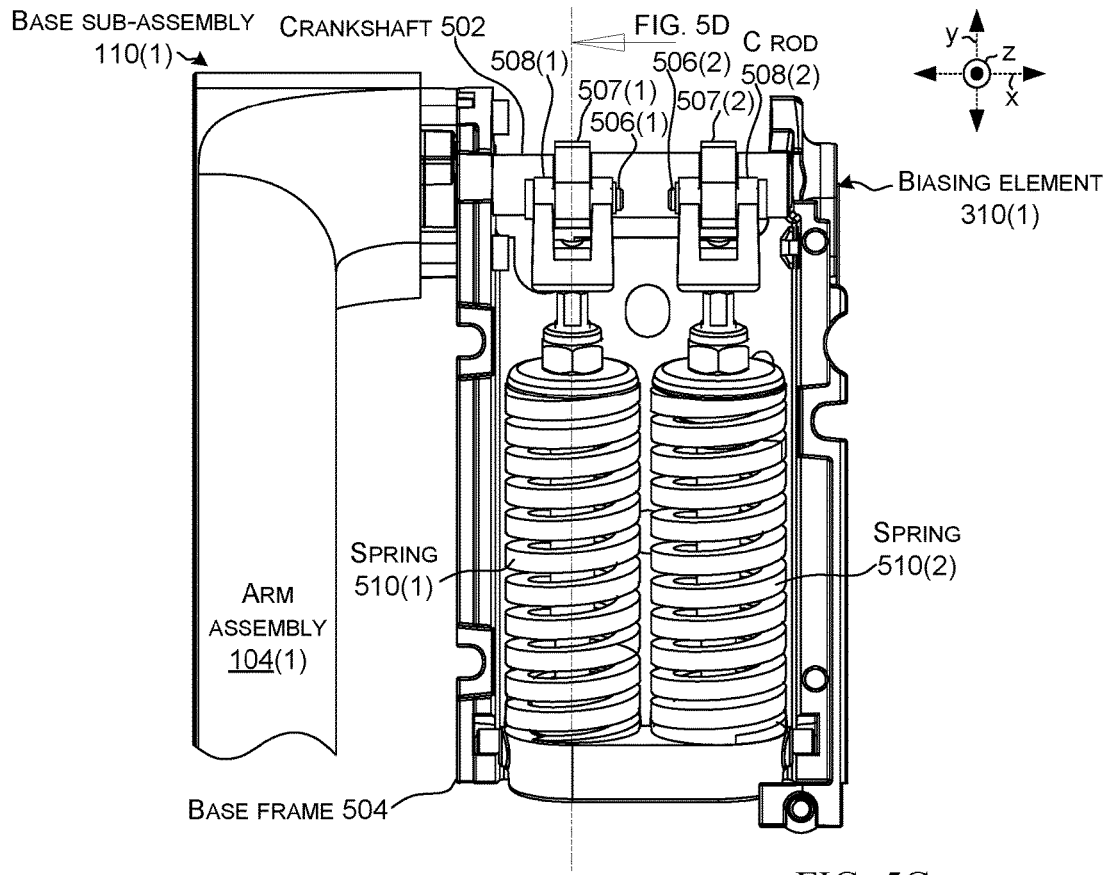
Figure 5D:
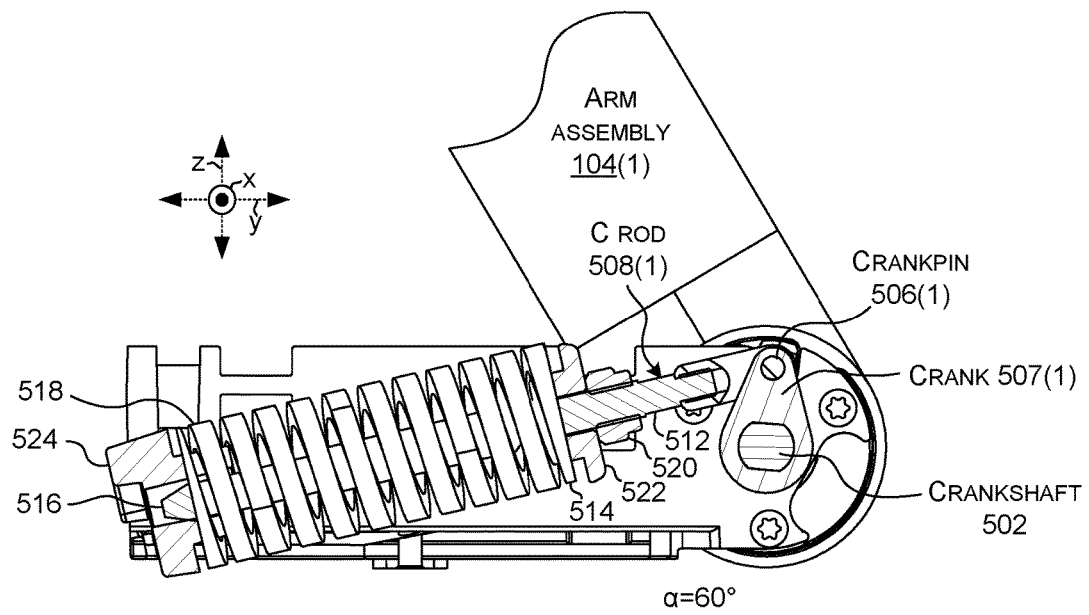
Figure 6A:
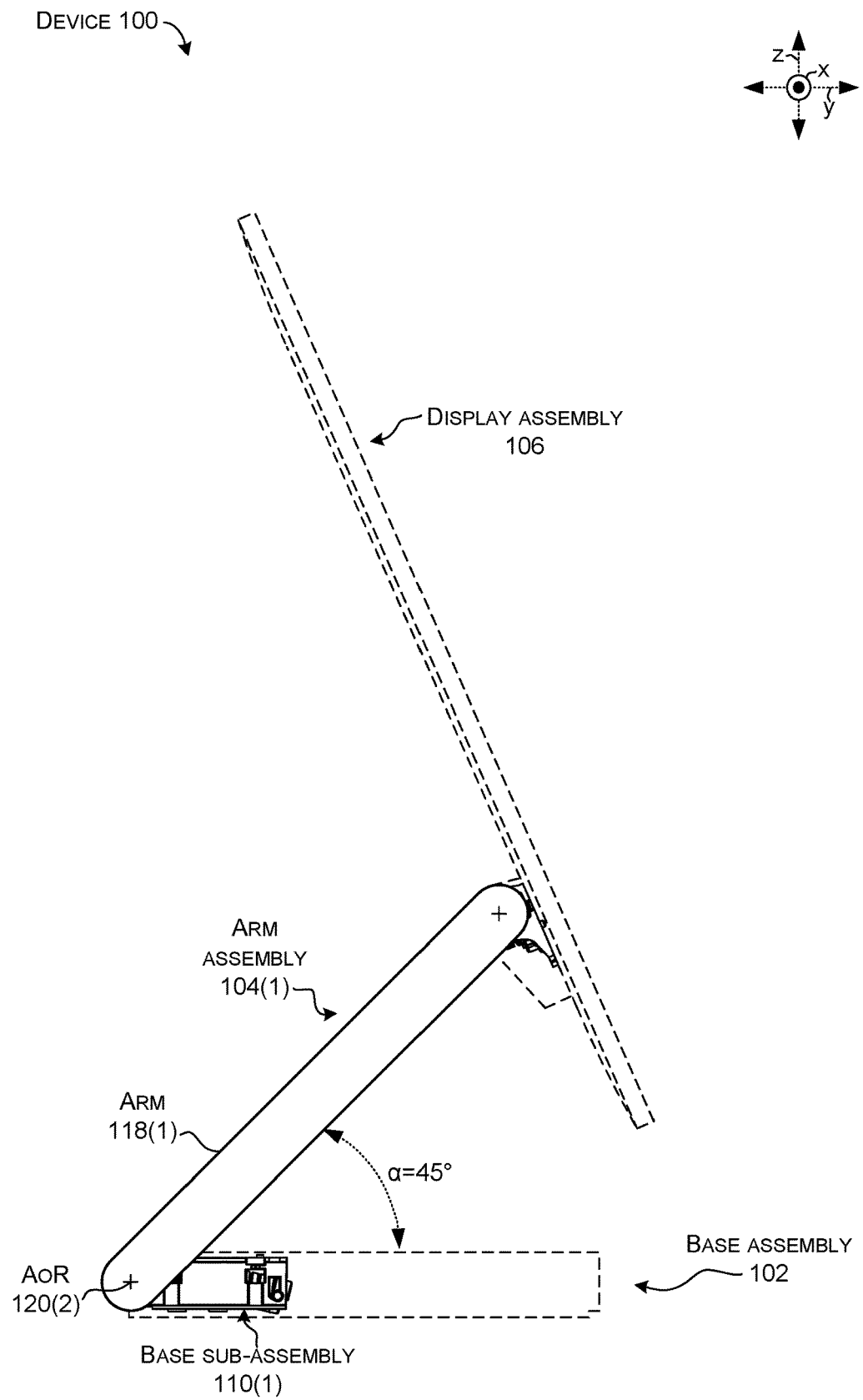
Figure 6B:
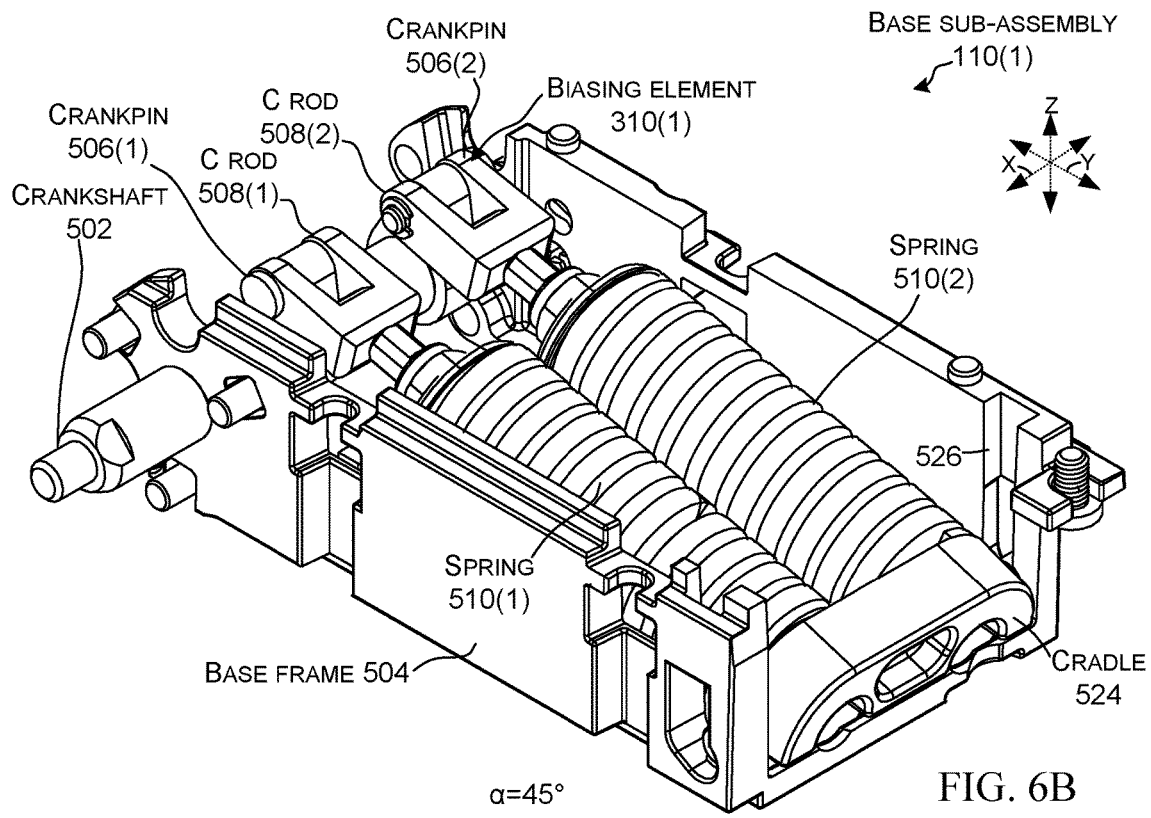
Figure 6C:
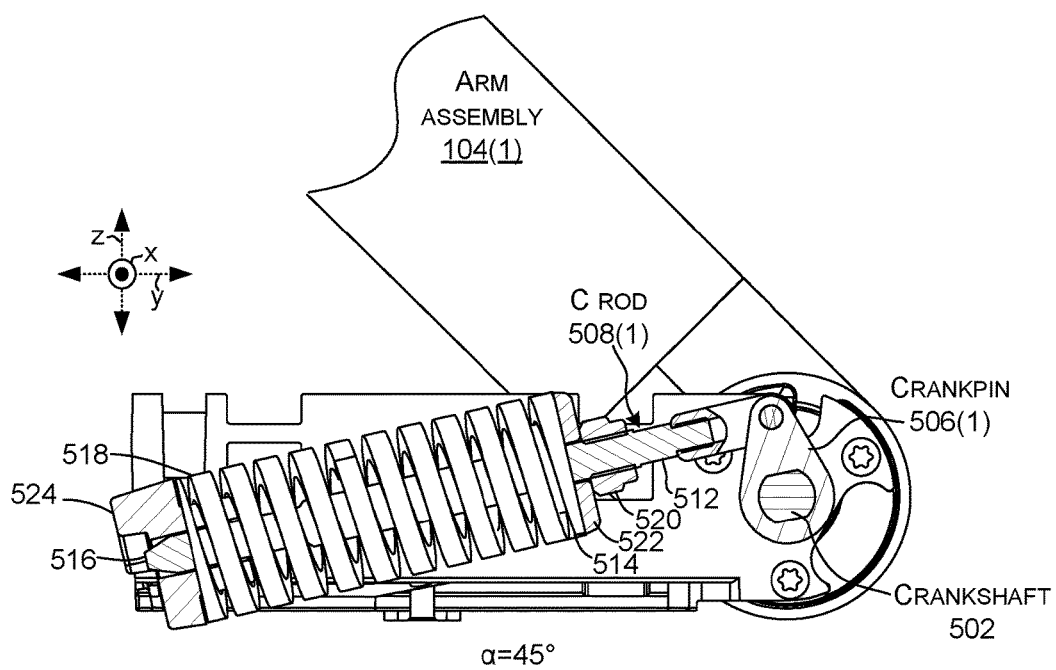
Figure 7A:
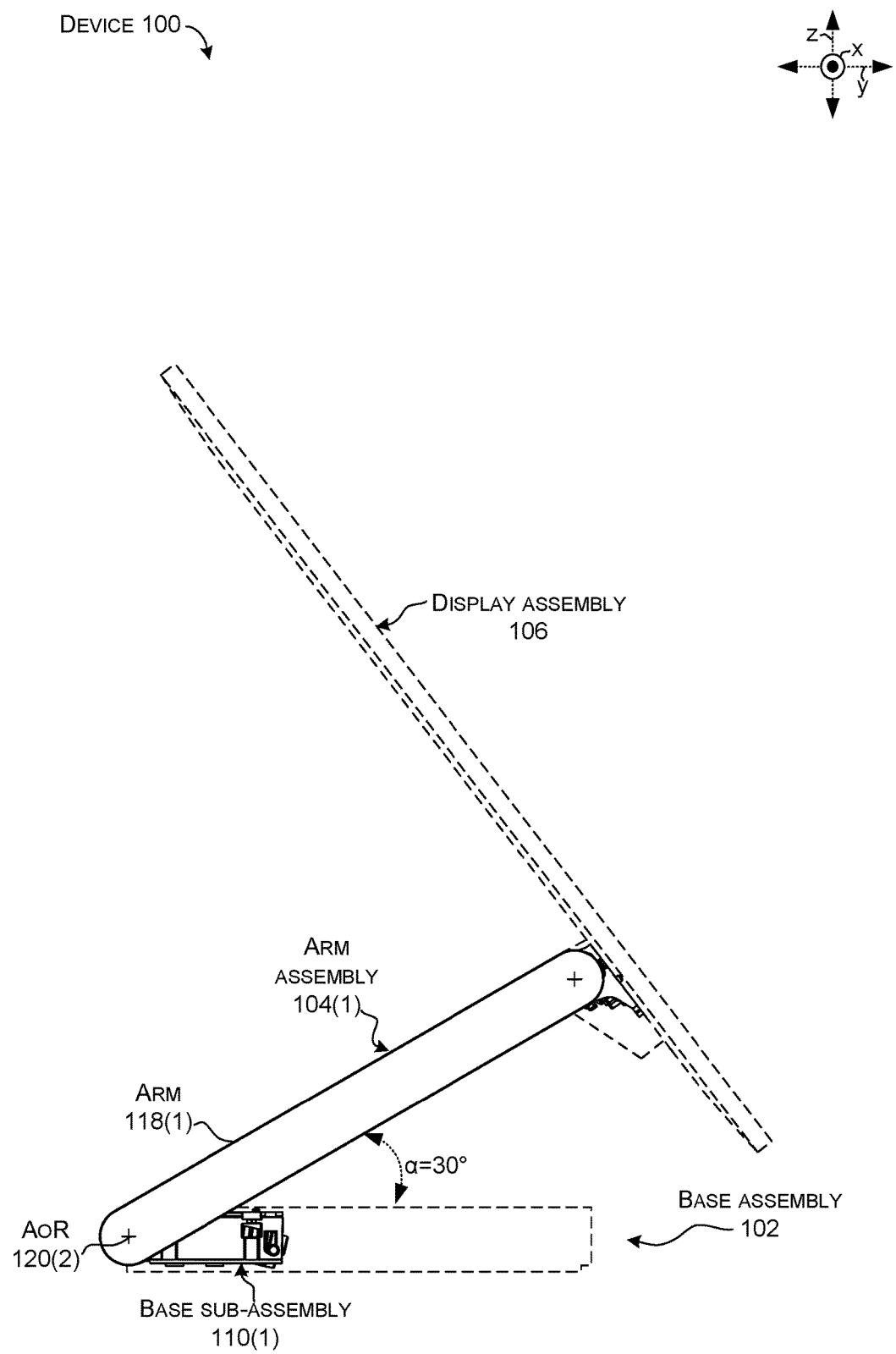
Figure 7B:
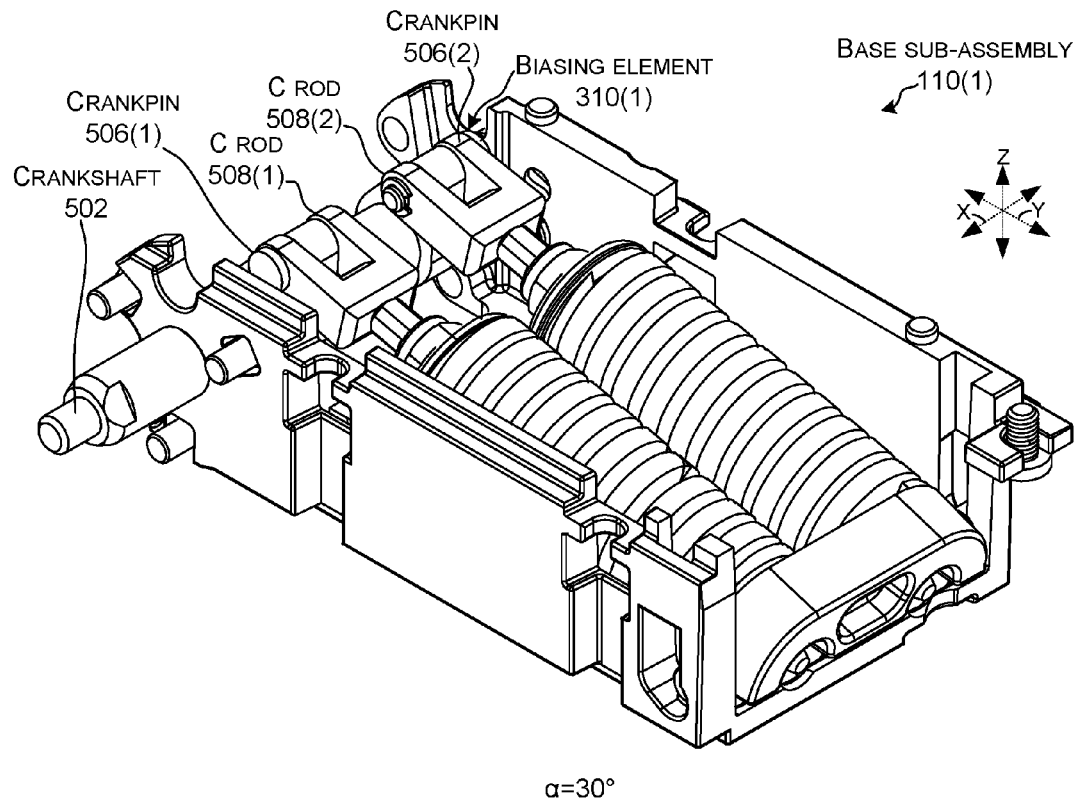
Figure 7C:
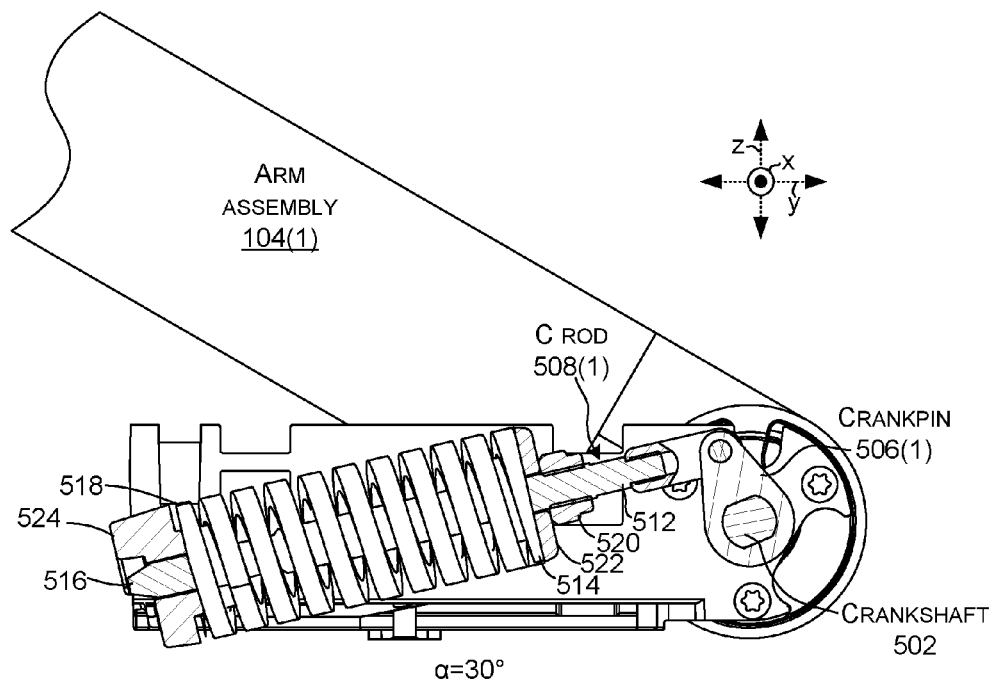
Figure 8A:
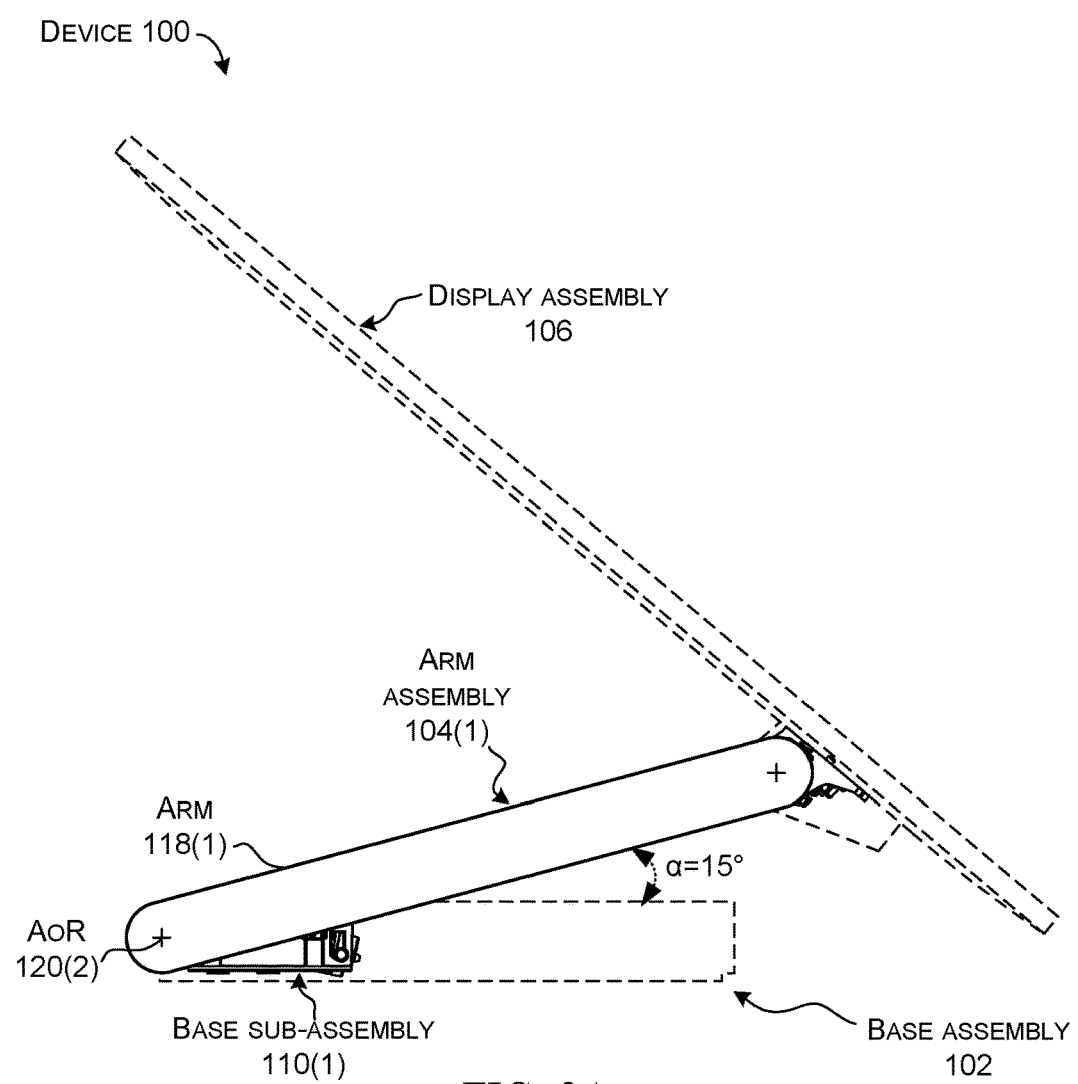
Figure 8B:
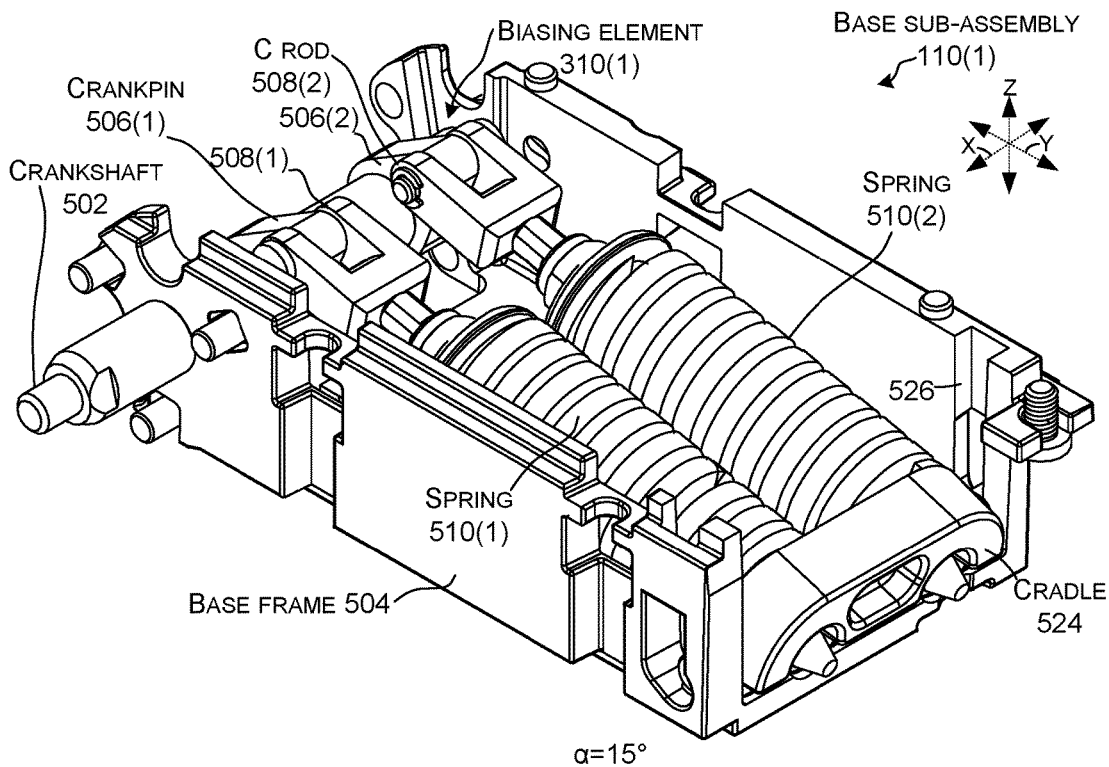
Figure 8C:
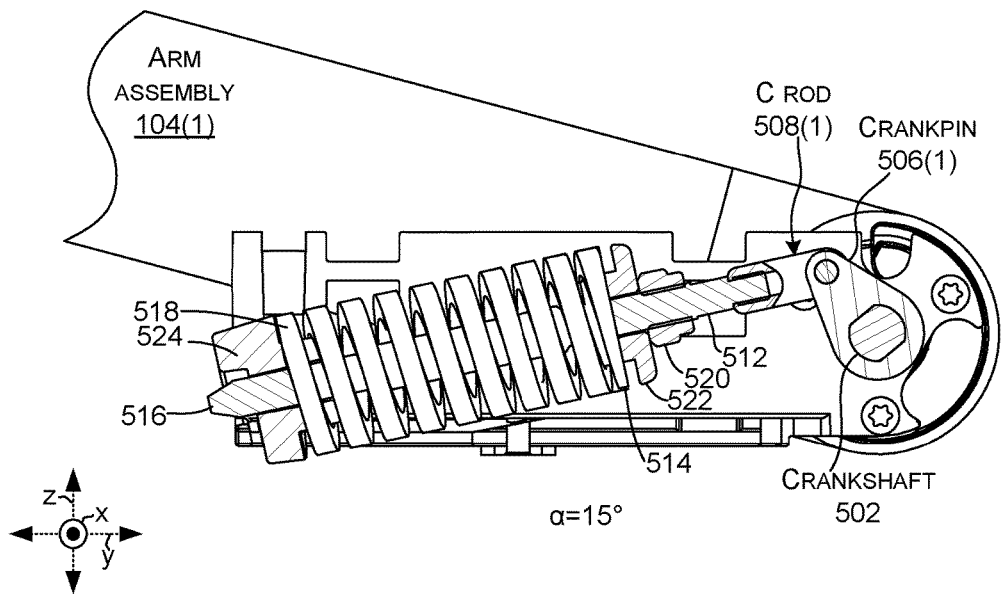
Figure 9A:
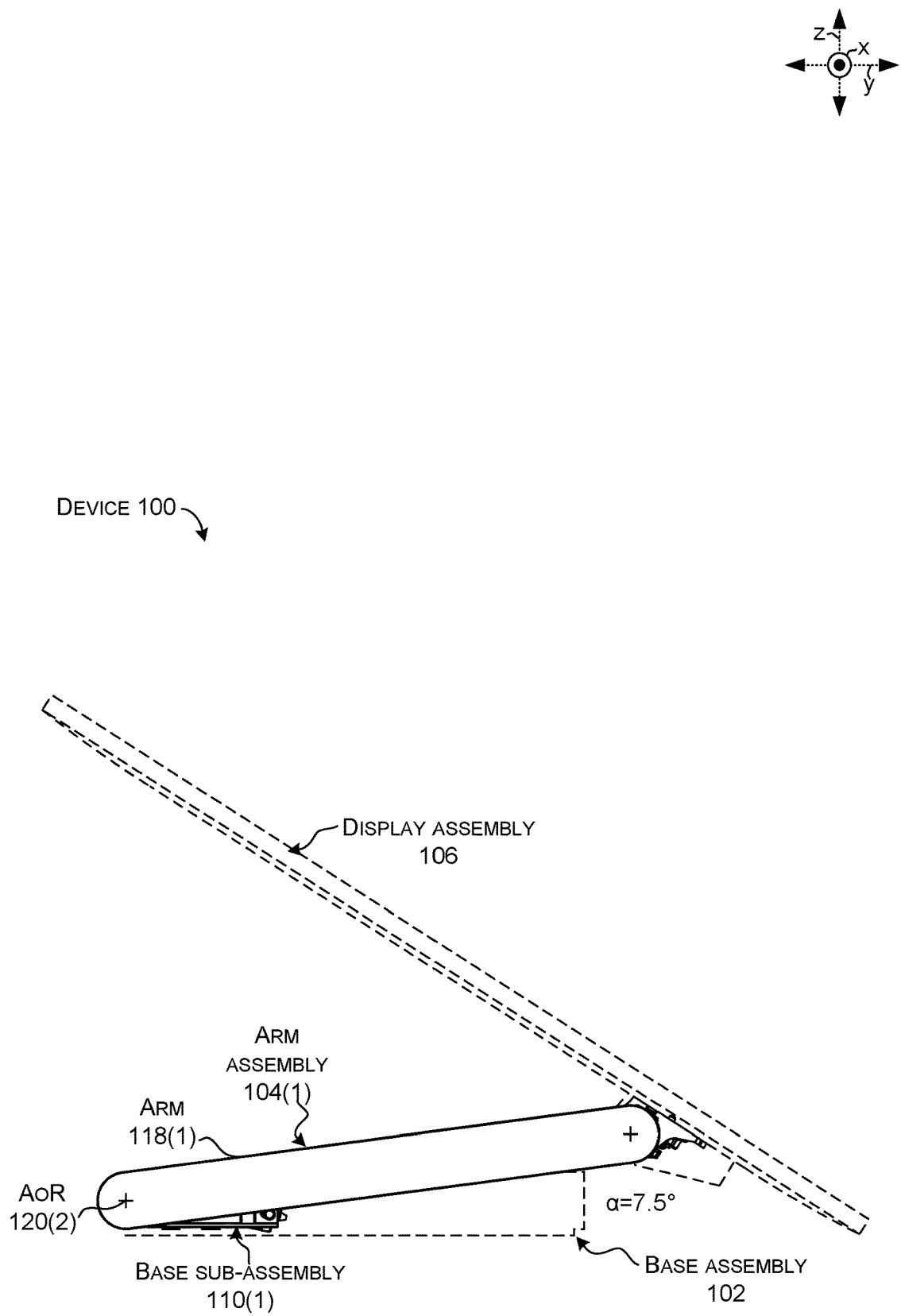
Figure 9B:
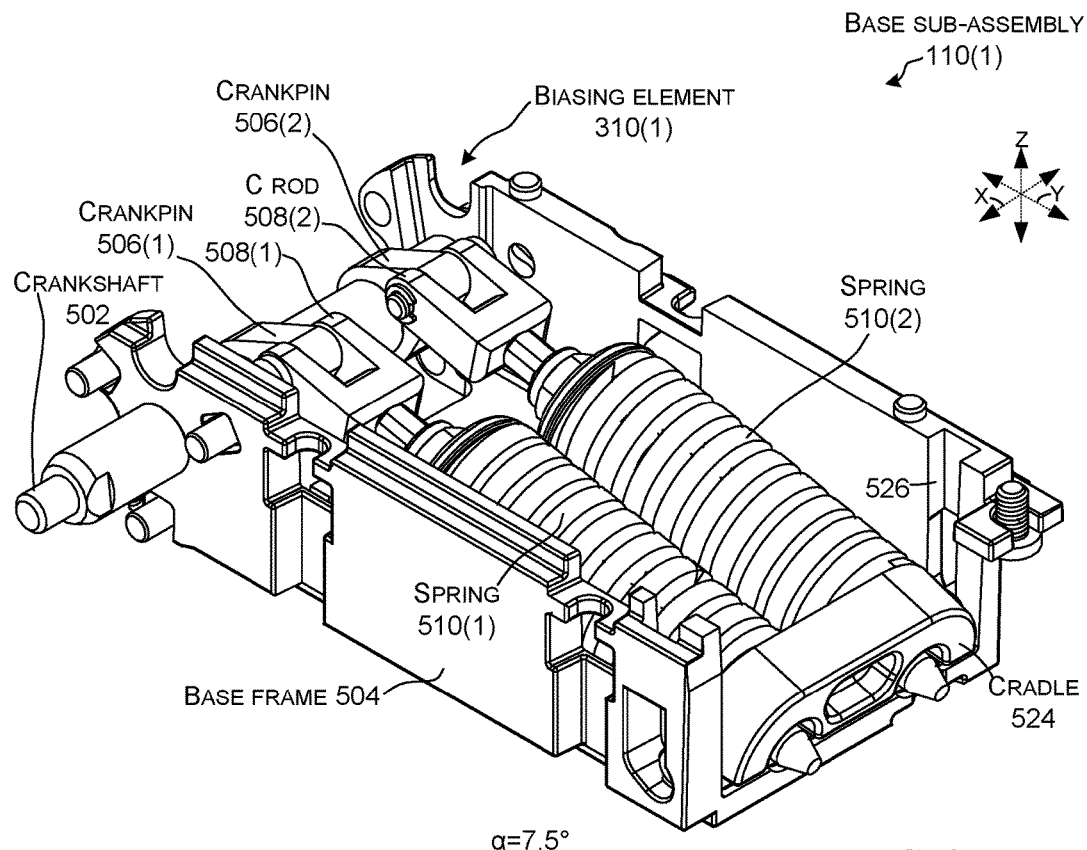
Figure 9C:
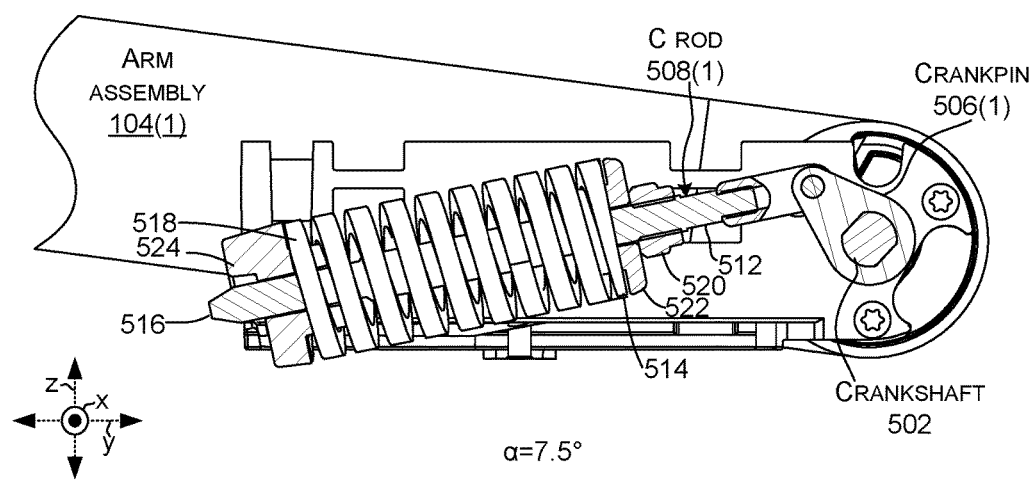

As can be appreciated from FIG. 5D, an upper portion 512 of the connecting rod 508 can be configured so that it cannot pass through an upper end 514 of the spring 510. A lower end or portion 516 of the connecting rod 508 can pass through a lower end 518 of the spring 510. In this case, the upper portion 512 of the connecting rod 508 is threaded and a corresponding nut 520 can be adjustably secured to the connecting rod 508 against the upper end 514 of the spring 510. A washer 522 may be positioned between the nut 520 and the spring 510. The nut 520 can be rotated to fine tune the biasing element 310(1) so that tension against the spring occurs at a specific crankpin orientation, such as the 60 degree α angle orientation of FIGS. 5A-5D. Other types of fasteners can alternatively or additionally be employed.

In this implementation, as evidenced in FIG. 5B, the springs 510 and connecting rods 508 can be positioned in a cradle 524 that can be slideably received in a groove 526 in the base frame 504. Once installed, the angle of the groove 526 and tension provided by the springs 510 can automatically retain the cradle 524 in the groove 526 without dedicated fasteners. However, if service is needed, the cradle 524 can be easily removed from the base frame 504 by slightly compressing the springs 510 and sliding the cradle 524 upward in the groove 526 until separated from the base frame 504.

In this implementation, the weight (e.g., mass) of the arm assembly 104 (FIG. 3) and/or the display assembly 106 (FIG. 3) can impart rotational force (e.g., torque 304, FIG. 3) on the crankshaft 502 to cause the crankshaft to rotate in a counter-clockwise direction. However, as illustrated relative to FIG. 4, the force tends to be non-linear in the range of travel (202, FIG. 2). For instance, the force can increase as alpha angles decrease. Employing crankshaft 502 and its offset crankpins 506, as well as the orientation of the crankpins, can cause the springs 510 to at least partially offset this rotational force.

In this case, the springs 510 can impart identical forces on the crankshaft 502, and crankpins 506 are oriented similarly (e.g., when crankpin 506(1) is at the 11 o'clock position, crankpin 506(2) is also at the 11 o'clock position). In an alternative configuration, the crankpins can be offset (e.g., when one is at the 12 o'clock position the other is at the 2 o'clock position). Alternatively or additionally, the springs 510 could be dissimilar from one another (e.g., different resistance to compression).

An alternative implementation that involves two different biasing elements 310 in the base assembly is described below relative to FIGS. 11A-12C.

As can be appreciated by comparing FIGS. 5D, 6C, 7C, 8C, 9C, and 10C, reducing the a angle causes the crankpin 506 to turn in a counterclockwise direction. This action forces the connecting rod 508 to the left. Nut 520 engages spring 510 so that movement of the connecting rod compresses spring 510. The compression force of the spring 510 is generally linear, but the rotational moment or torque imparted on the crankshaft 502 is non-linear due to the crank geometry. Stated another way, the crankpin 506 can translate a linear force from the spring 510 to the crankshaft 502 as a non-linear torque. Further, the orientation of the crankpin 506 affects the torque force on the crankshaft 502. For instance, when the crankpin 506 is orthogonal to the spring 510 (e.g., orthogonal to a long axis of the connecting rod 508 that extends from lower portion 516 to the end 512), in this case at the 12 o'clock position, the spring force can create a greater torque on the crankshaft 502 than when the crankpin 506 is oriented toward or away from the spring. For instance, compare the 11 or 12 o'clock position of FIG. 5D to the 10 o'clock position of FIG. 10C. As evidenced by comparing FIGS. 5D, 6C, 7C, 8C, 9C, and 10C, as the a angle decreases, crankpin 506(1) rotates counterclockwise, which forces the connecting rod 508(1) to compress spring 510(1) and a larger amount of the lower portion 516(1) of the connecting rod extends through the cradle 524.

Biasing element 310(1) can provide a portion of the counter-balancing torque profile 402 of FIG. 4. More specifically, biasing element 310(1) can supply torque profile 404(1) of FIG. 4 and can work cooperatively with other biasing elements that are located in the arm assembly 104 and/or the display assembly 106 to collectively supply torque profile 402. An example with two biasing elements 310(2) and 310(3) located in the display assembly is described below relative to FIGS. 13A-14B.

FIGS. 11A-12C show an alternative implementation where base assembly 102A's base sub-assembly 110A includes two different biasing elements 310A(1) and 310A(2). FIGS. 11C and 11D show the base assembly 102A at a 30 degree α angle relative to the arm assembly 104A. FIGS. 12A and 12B show the base assembly 102 at a 60 degree α angle relative to the arm assembly 104.

In this implementation, biasing element 310A(1) can be similar to biasing element 310(1) described above relative to FIGS. 5A-10C and can perform a similar function. As such, biasing element 310A(1) is labeled for reference but is not reintroduced here. Of course, this version of biasing element 310A(1) includes a single spring 510A(1), whereas biasing element 310(1) includes a pair of essentially identical springs 510. Spring force can be increased by nesting one spring within a second spring so that the combination is considered to be spring 510A(1).

In this case, biasing element 310A(2) can include crankpin 506A(2), spring 510A(2), and connecting rod 508A(2). In this example, the connecting rod 508A(2) travels through the spring 510A(2). A lower portion 1102 (see FIG. 11D) of the connecting rod (e.g., opposite the crankpin 506A(2)) is configured so that it cannot pass through the spring 510A(2) (e.g. cannot move to the right). In this example, the lower portion 1102 is threaded to receive a nut 1104. A washer 1106 is positioned between the nut 1104 and the spring 510A(2). An upper portion 1108 of the spring 510A(2) is blocked from moving toward the crankpin 506A(2) by bracket 1110.

In the 30 degree orientation of FIG. 11D, the spring 510A(2) is not imparting any force on crankpin 506A(2) and the crankpin can rotate either clockwise or counterclockwise without engaging the springe 510A(2). For instance, a gap G occurs between bracket 1110 and the upper end 1108 of the spring 510A(2). Also, connecting rod 508A(2) is free to pass out the bottom of the spring 510A(2) (e.g. can move to the left). As such, the crankpin 506A(2) can move (a limited rotation) without experiencing resistance from spring 510A (2). In this example, spring 510A(2) of biasing element 310A(2) does not provide any resistance to rotation of the crankpin 506A(2) when the alpha angle is less than about 55 degrees. This can be contrasted with the 60 degree alpha angle of FIG. 12B. In this orientation (e.g., the 60 degree alpha angle orientation), the nut 1104 and washer 1106 are engaged against spring 510A(2), and the spring 510A(2) is compressed between the nut 1104 and the bracket 1110, and thus, the spring 510A(2) is providing resistance against further clockwise rotation of the crankpin 506A(2).

Recall also, that in this implementation the biasing element 310A(1) can be viewed as a push mechanism in that when weight of the display assembly 106 and the arm assembly 104A create a torque force on the crankpin 506A (1) in the counterclockwise direction, it can cause spring 510A(1) to be compressed which can cause a counter force on the crankpin. In contrast, biasing element 310A(2) can be viewed as a pull mechanism in that when the crankpin 506A(2) is rotated counterclockwise, biasing element 310A (2) offers no resistance.

When crankpin 506A(1) is rotated clockwise to a specific orientation, spring 510A(1), which can be termed the 'main spring,' is compressed and offers a counterforce. Thus, spring 510A(2) can be viewed as a 'counter spring' to spring 510A(1) of biasing element 310A(1) at specific orientations (e.g. when the alpha angle is between 55 and 60 degrees, in this implementation). Thus, the counter spring 510A(2) can be working against main spring 510A(1) (e.g., cancelling a portion of the force) at some orientations (e.g., where the alpha angle is between 55 and 60 degrees). This can be evidenced from FIG. 4 where the biasing element 310(2) supplies profile 404(2) which is at a zero value from zero degrees to 55 degrees and then supplies a negative torque (e.g., opposite to biasing element 310A(1)) from 55 degrees to 60 degrees.

In this implementation the crankpins 506A are at different relative orientations. For instance, in the 30 degree alpha angle orientation of FIG. 11D, crankpin 506A(2) is at a 10 o'clock orientation while crankpin 506A(1) can be partially visualized in the background at an 11 o'clock orientation. In a similar manner in FIG. 12B, crankpin 506A(2) is at an 11 o'clock orientation while crankpin 506A(1) is at a 12 o'clock orientation. In this way, the crankpin orientation can be selected at the design phase to supply a relatively higher rotational force from the available spring force of a specific biasing element at a specific orientation (e.g., in this implementation at the 12 o'clock position or 55-60 alpha angle).

Figure 1D:
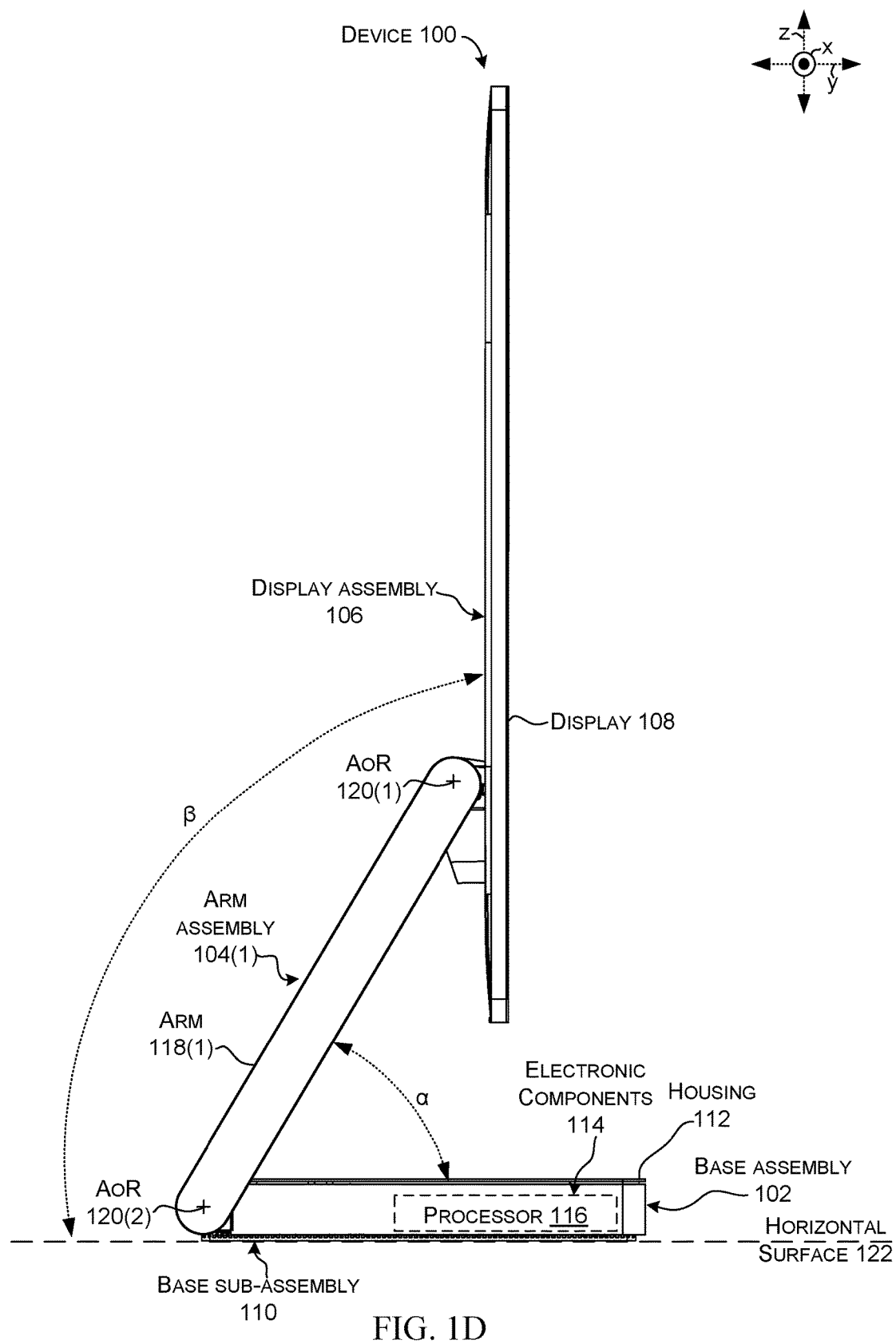
Figure 13A:
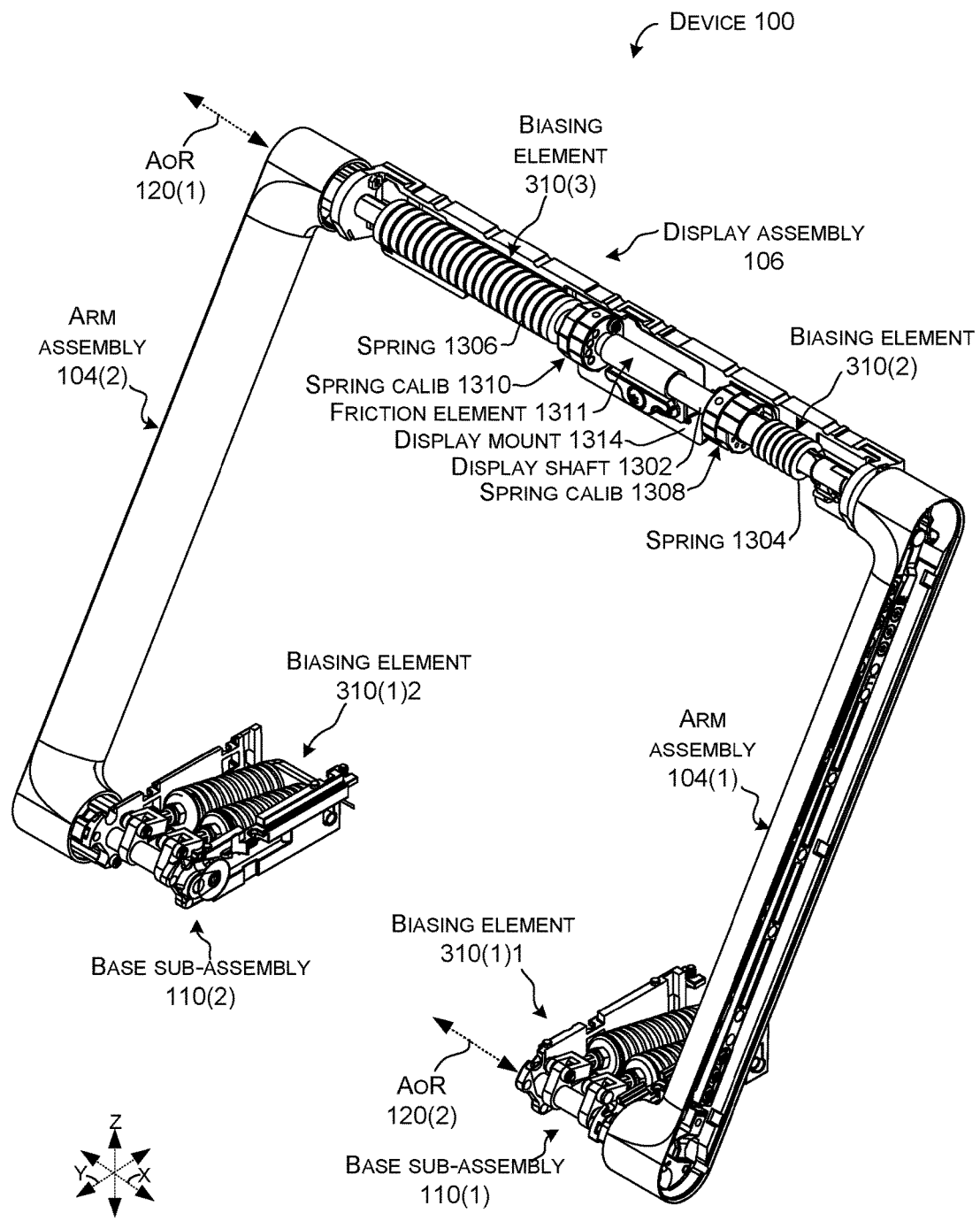

FIGS. 13A and 13B collectively show the device 100 without the base assembly's housing 112 and without the display 108 (contrast with FIG. 1D). This discussion focuses on the display assembly 106. The base assembly 102 is described above. The arm assembly 104 is described below relative to FIGS. 16A-19B.

The display assembly 106 can include a display shaft 1302 that can define upper axis of rotation 120(1). Springs 1304 and 1306 can be employed to supply rotational forces to the display shaft 1302. In this case, the springs can be counter wound to one another to supply opposing forces. Other configurations can employ other spring orientations. Spring 1304 can be associated with a spring calibrator 1308. Spring 1306 can be associated with a spring calibrator 1310. In this case, biasing element 310(2) can include spring 1304 and spring calibrator 1308. Biasing element 310(3) can include spring 1306 and spring calibrator 1310. A friction element 1311 can also operate on the display shaft 1302. In this implementation the friction element 1311 can include a friction material 1312 that contacts the display shaft 1302 and an adjustment mechanism, in this case a screw 1313 that can adjust the contact between the friction material 1312 and the display shaft 1302. The display shaft can be secured relative to a display mount 1314 (to which the display can be attached).

In this implementation, spring calibrator 1308 can include a fixed element 1316 and a rotatable element 1318. Similarly, spring calibrator 1310 can include a fixed element 1320 and a rotatable element 1322. Spring 1304 can include a first end 1324 and a second end 1326. Spring 1306 can include a first end 1328 and a second end 1330.

First end 1328 of spring 1306 can be secured to display mount 1314, such as by a clamp 1334 or other mechanism. The second end 1330 of spring 1306 can be secured to rotatable element 1322 of spring calibrator 1310. Thus, spring 1306 can be secured between the display mount 1314 and the display shaft 1302 via spring calibrator 1310. Relative to spring 1304, the first end 1324 can be secured to display mount 1314, such as by a clamp 1336 or other mechanism. The second end 1326 of spring 1304 can be positioned to rotationally engage rotatable element 1318 of spring calibrator 1308. Stated another way, during a portion of rotation of the display shaft, spring 1304 does not engage spring calibrator 1308 and is free to rotate with the display shaft. At some point in the rotation, spring 1304 can engage spring calibrator 1308 and create a counter-force to continuing rotation. For example, in this implementation, spring 1304 does not engage spring calibrator 1308 when the alpha angle is zero and the beta angle is 20 degrees through a range until the alpha angle is about 55 degrees and the beta angle is about 70 degrees, at this point the spring 1304 engages spring calibrator 1308 and creates a counter-rotation force as rotation continues to an alpha angle of 60 degrees and a beta angle of 90 degrees.

The spring calibrators 1308 and 1310 can allow adjustments to be made relating to the display position (e.g., beta angles) at which the respective springs exert rotational forces on the display shaft 1302. For instance, manufacturing tolerances in individual components, such as the springs 1304 and 1306 and/or the inter-relations of components, such as components of the display assembly 106, can result in rotational forces being exerted outside of specified ranges. The spring calibrators can allow adjustments to within the specified ranges. The friction element 1311 can be adjusted to control the ease at which the display mount 1314 (and hence display) rotate around the display shaft 1302. The friction element can operate cooperatively with the biasing elements 310(2) and 310(3) to counter rotation of the display so that the display stays in a specific orientation unless acted upon by the user, and yet when acted upon by the user, the user can impart a relatively small force to move the display. Further, since in some implementations a rate of rotation around the display axis can increase as the alpha angle approaches its highest angles (e.g., in the illustrated implementation where the alpha angle is 50 to 60 degrees), the friction element can have a greater effect on the display axis at these high rotation angles. Stated another way, the rate of rotation around the display shaft can be non-linear through the range of alpha angles, and the effects of the friction element can be more pronounced with higher rates of rotation around the display shaft.

Figures 14A, 14B:
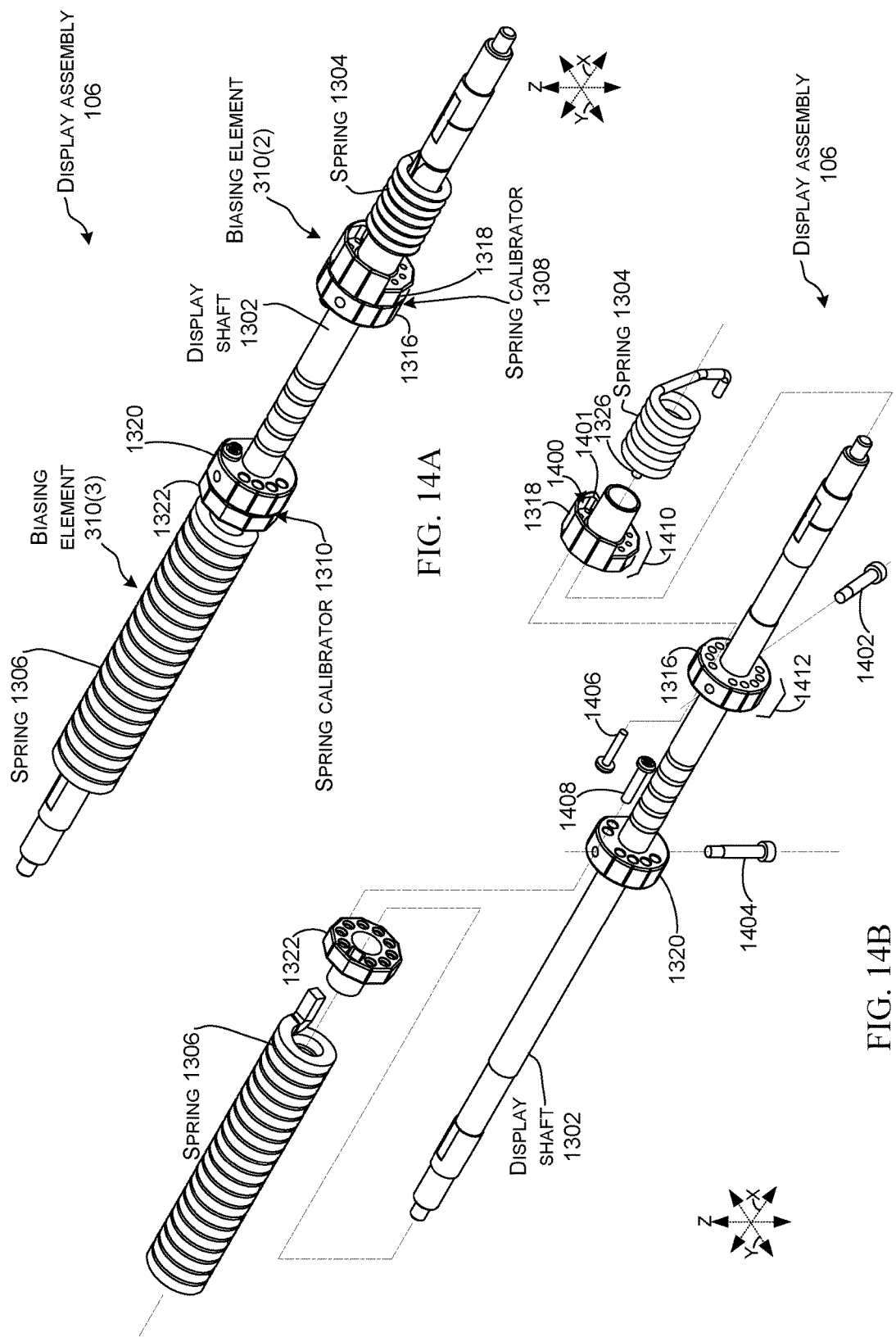
FIGS. 14B, 17A, 17B, 19B are exploded perspective views of portions of example devices in accordance with the present concepts.

FIGS. 14A and 14B show some of the elements of display assembly 106 associated with display shaft 1302. FIGS. 14A and 14B also introduce securing elements relating to the spring calibrators 1308 and 1310. FIGS. 14A and 14B show the elements associated with display shaft 1302 in an assembled view and an exploded view, respectively. FIG. 14B shows how second end 1326 of spring 1304 can rotate relative to rotatable element 1318 as indicated by region 1400 until the end 1326 contacts stop 1401 at which point the spring engages the spring calibrator 1308 and can create a force against further rotation (e.g., counter-force). Thus, spring second end 1326 can rotate through a range of rotation through region 1400 in the clockwise direction until the second end 1326 contacts stop 1401. The spring 1304 then resists further rotation. Upon counter-clockwise rotation, second end 1326 disengages from stop 1401 and is free to rotate through region 1400.

FIGS. 14A and 14B also specifically illustrate that fasteners 1402 and 1404 can connect spring calibrators 1308 and 1310 to display shaft 1302. In this case, a hole is formed orthogonal to the axis of rotation (120(1), FIG. 13) through the fixed elements 1316 and 1320 and the display shaft 1302. Fastener 1402 passes through fixed element 1316 and display shaft 1302. Fastener 1404 passes through fixed element 1320 and display shaft 1302. Calibration of the springs 1304 and 1306 is described below relative to FIG. 15.

Upon calibration, fasteners 1406 and 1408 can be used to secure the rotatable element 1318 and 1322 to fixed elements 1316 and 1320 respectively. For instance, the rotatable element 1318 can include a first set of indexed holes 1410 that are spaced apart angularly by a specific number of degrees. The fixed element 1316 can include a second set 1412 of indexed holes that are spaced apart angularly by a smaller or larger specific number of degrees. As will be illustrated below relative to FIG. 15, this configuration allows that only one hole from the first set of indexed holes 1410 will align with an individual hole from the second set of holes 1412 for a given relative orientation of the rotatable element 1318 to the fixed element 1316.

In this implementation, as can be evidenced from FIGS. 13A, 13B, 14A, and 14B in combination with FIG. 3, biasing elements 310(2) and 310(3) can function to balance torque imparted on display shaft 1302 by display assembly 106 (e.g. display 108). As mentioned above, the torque to be balanced tends to vary with the alpha angle and beta angle. Further, the direction of the torque can change as the display approaches vertical (e.g., 55 to 60 degree alpha angle). In this implementation, biasing element 310(3) can balance the torque for a majority of the alpha orientations, but as the display approaches approximately 55 degrees, the counter torque provided by biasing element 310(3) may exceed the torque of the display. In this case, biasing element 310(2) can supply a counter torque from 55-60 degrees that reduces the torque of biasing assembly 310(3) and collectively more closely balances the torque of the display.

FIG. 15 shows how spring calibrator 1308 allows adjustment between fixed element 1316 and rotatable element 1318 and thus of the spring 1304 between the display shaft 1302 and the display mount 1314 (see FIG. 13). (This same explanation can be applied to spring calibrator 1310). In the illustration, rotatable element 1318 is in the foreground and fixed element 1316 is in the background. While not shown, the display shaft would extend into and out of the drawing page and through the rotatable element and the fixed element.

Recall that at any relative orientation of the rotatable element 1318 to the fixed element 1316, one hole from the first set of holes 1410 is aligned with an individual hole from the second set of holes 1412. (Note that only two holes from each set are designated with specificity). For example, in Instance One, the aligned holes are surrounded by a 'square' and designated at 1502 and can be secured by fastener 1402. In Instance Two, the aligned holes are designated at 1504, and in Instance Three the aligned holes are designated at 1506.

In the illustrated configuration, the first set of holes 1410 can be viewed as being at zero degrees, 30 degrees, 60 degree, 90 degrees, 120 degrees, and 150 degrees. The second set of similarly sized holes 1412 in the fixed element 1316 are at slightly offset values. In this case, the values are offset by 6 degrees, so the holes are at zero degrees, 36 degrees, 72 degrees, 108 degrees, 144 degrees, and 180 degrees. (Other implementations can use other combinations of hole spacings for the first and second sets of holes).

In this configuration, only one hole from the first set and one hole from the second set are aligned at any one time. For example, at Instance One the first holes are lined up, in Instance Two with six degrees of rotation the second holes are lined up, and in Instance Three with 12 degrees of rotation the third holes are lined up. Thus, the rotatable element 1318 can be rotated to obtain the specified spring condition and then fastener 1402 can be inserted into the aligned holes to secure the orientation. In some cases, the fastener 1402 can be threaded and the holes of the fixed element 1316 can be threaded to retain the fastener and thereby the orientation. This type of spring calibrator can be termed a 'Vernier style' spring calibrator and can offer several potential advantages, such as simplicity of adjustment and/or security (e.g., tends not to loosen and instead to maintain the setting despite time and device vibrations).

Other implementations may use other types of spring calibrators, such as interlocking toothed surfaces on the fixed element and the rotatable element.

Considering FIGS. 13-15 collectively, the biasing elements 310(2) and 310(3) can collectively counter balance the weight of the display around the display shaft. Production variations in part tolerances (especially spring forces which can vary as much as +/−10%), can cause displays to not be properly counter-balanced upon initial device assembly. The spring calibrators 1308 and/or 1310 can allow spring preload to be easily adjusted to within specified values. One challenge with a continuously variable counter-balance profile is that the spring torque (which varies from low in the work mode to high in the draw mode of the device) tends to loosen the spring calibrator mechanism. The described implementations resist this tendency. For instance, the Vernier style spring calibrator can enable fine resolution spring preload adjustment while at the same time ensuring there can be no slipping of the spring calibrator relative to the spring over the lifetime of the product.

Recall that in the implementation of FIGS. 11A-12B, biasing element 310A(2) is located in the base assembly rather than the display assembly. The display assembly 106 of FIGS. 13A-14B can be utilized with such an implementation by eliminating biasing element 310(2) from the display assembly and instead utilizing biasing element 310A(2) in the base assembly.

As mentioned, counter-balancing torque can be used to counteract the weight of the display assembly 106 to achieve a feeling of weightlessness. Counter-balance can be achieved with a crankshaft 502 and three springs due to the highly non-linear path of the display assembly center of gravity. One or two springs can be on the crankshaft and one or two on the display shaft 1302, among other configurations.

FIGS. 16A-19B collectively show the arm assembly 104, and the discussion below details how the arm assembly 104 can translate alpha angle orientation to display orientation or position (e.g., beta angle). Recall that the alpha angle is defined between the base assembly 102 and the arm assembly 104 and the display orientation is defined in relation to the display 108 relative to the vertical reference axis.

Figure 16A:
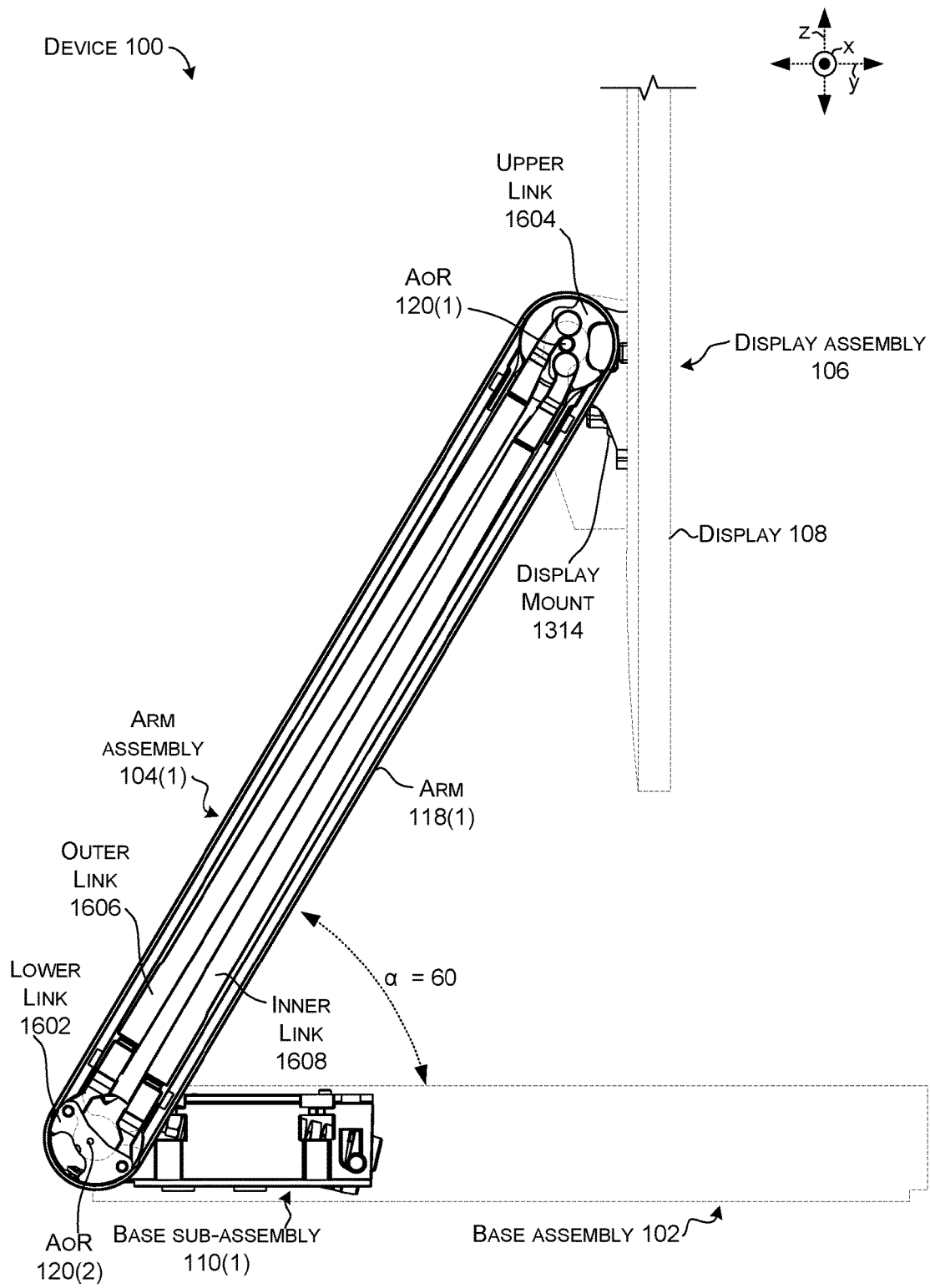

FIGS. 16A, 16B, and 16C show the device 100 at 60, 30, and zero degree alpha angle orientations, respectively. In this case, the arm 118(1) is hollow and contains a lower link 1602, an upper link 1604, an outer link 1606, and an inner link 1608. Further, with the outer link 1606 and the inner link 1608 positioned within the hollow arm 118(1), the arm itself functions as another link (e.g., central link) 1610, that functionally extends between the upper axis of rotation 120(1) and the lower axis of rotation 120(2) (see FIG. 16B). As such, in this implementation, the outer link 1606 and the inner link 1608 can be thought of as a pair of redundant elongate links that extend between the lower axis of rotation 120(2) and the upper axis of rotation 120(1) (e.g., between the lower link 1602 and the upper link 1604). The pair of redundant elongate links can function as one link of a four bar linkage in concert with the arm 118(1) functioning as another link (e.g., central link 1610), and the lower link 1602 and the upper link 1604 functioning as the remaining links.

As will be explained below, in some implementations, this four bar linkage can be viewed as an over constrained five bar linkage due to the addition of the arm 118 acting as an additional link and pre-tensioning of the redundant elongate links. Pre-tensioning of the elongate redundant links can cause these links to be under tension throughout the range of travel of the arm as represented by the alpha angle. Maintaining tension can reduce/eliminate free play in the device that diminishes the user experience. Further, some implementations can supply increasing tension with increasing alpha angles to create less play in the device in the work mode (e.g., alpha equals 60 degree) orientation of FIG. 16A and more play in the draw mode (e.g., alpha equals zero degrees) orientation of FIG. 16C where the device may contact a horizontal surface of a desktop, for instance. The contact and associated forces can be accommodated by an amount of free play in the device components that might be undesirable in the work orientation.

In this implementation, outer and inner links 1606 and 1608 can include lower ends 1612(1) and 1612(2), central regions 1614(1) and 1614(2) and upper ends 1616(1) and 1616(2). The lower ends 1612(1) and 1612(2) can be secured to the lower link 1602 on opposing sides of the lower axis of rotation 120(2). Similarly, the upper ends 1616(1) and 1616(2) can be secured to the upper link 1604 on opposing sides of the upper axis of rotation 120(1).

Further, tension on the redundant elongate outer and inner links 1606 and 1608 can be affected by the location where the upper and lower ends are secured relative to the upper and lower axes of rotation. For instance, as illustrated in FIG. 16C relative to the lower axis of rotation, the outer and inner links could be secured at locations on opposite sides of the lower axis of rotation 120(2) such that a single line passes through the outer link, the axis of rotation and the inner link. In contrast, in the illustrated implementation, the outer link 1606 and the inner link 1608 form an obtuse angle 1620 (e.g., facing toward the central regions 1614) with the lower axis of rotation 120(2) as its vertex. This configuration can cause tension of the outer and inner links to increase with an increasing alpha angle. While not specifically designated, a similar configuration can be applied to the relationship of the upper link 1604 and the upper ends 1616(1) and 1616(2). The angles (e.g., location of the pivot points) selected for securing the upper and lower ends of the outer and inner links to the upper and lower links can dictate tension (e.g. pretension) on the four bar linkage as the arm assembly 104(1) rotates through the different alpha angles. The location of the pivot points of the outer and inner links to the upper and lower links also translates arm angle (e.g. alpha angle) into display angle (e.g. beta angle).

Note by comparing FIGS. 16A, 16B, and 16C, in this implementation, the lower link 1602 and hence the lower ends 1612 of the outer and inner links 1606 and 1608 maintain the same relationship within the arm 118(1) during alpha angle rotation. In contrast, the upper link 1604, hence upper ends 1616, and the display mount 1314 rotate as the alpha angle changes. Thus, changes in the alpha angle are translated by links 1602-1610 into rotation of the display mount 1314 (and hence the display) and vice versa.

Figure 17A:
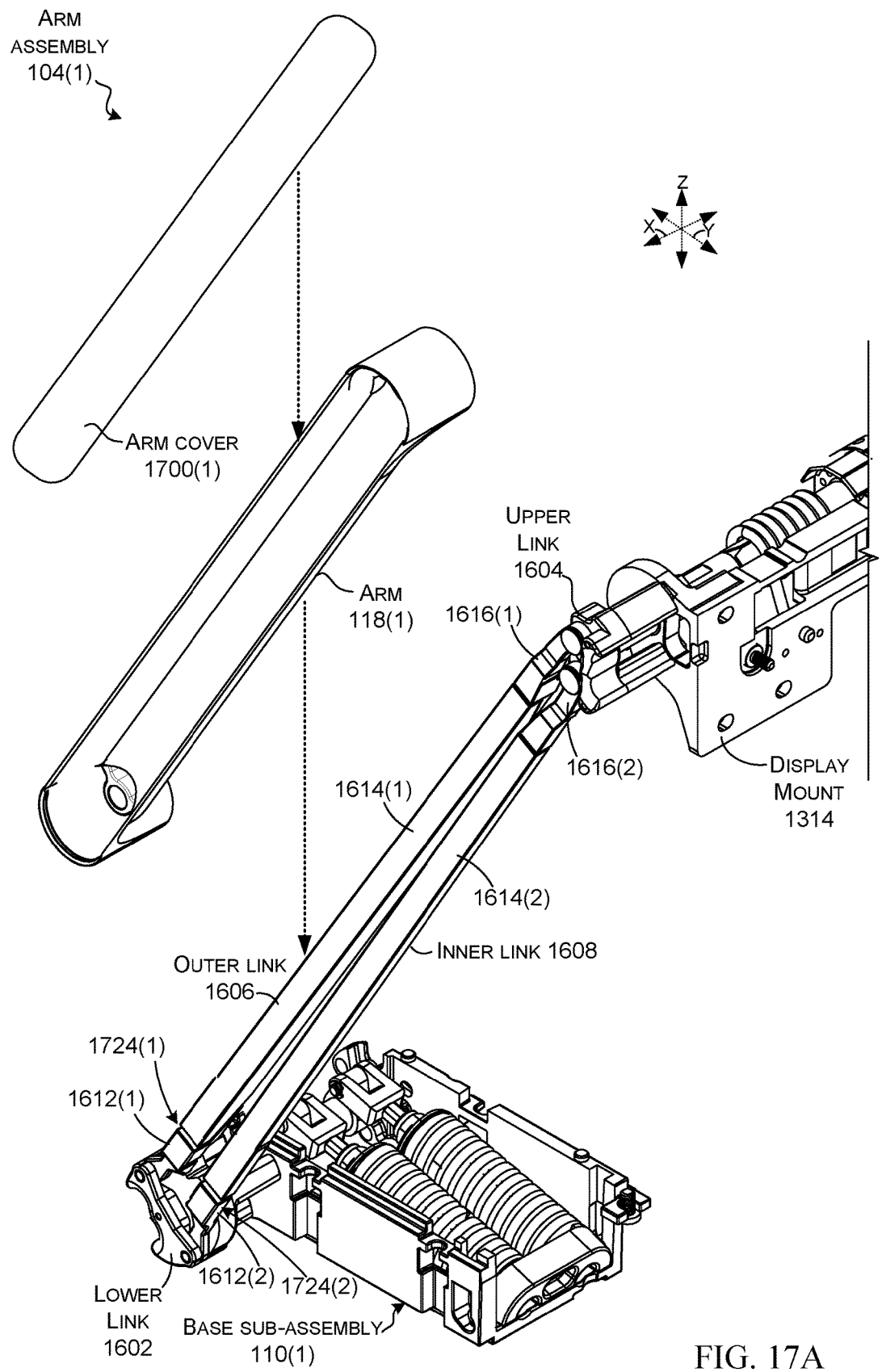
Figure 17B:
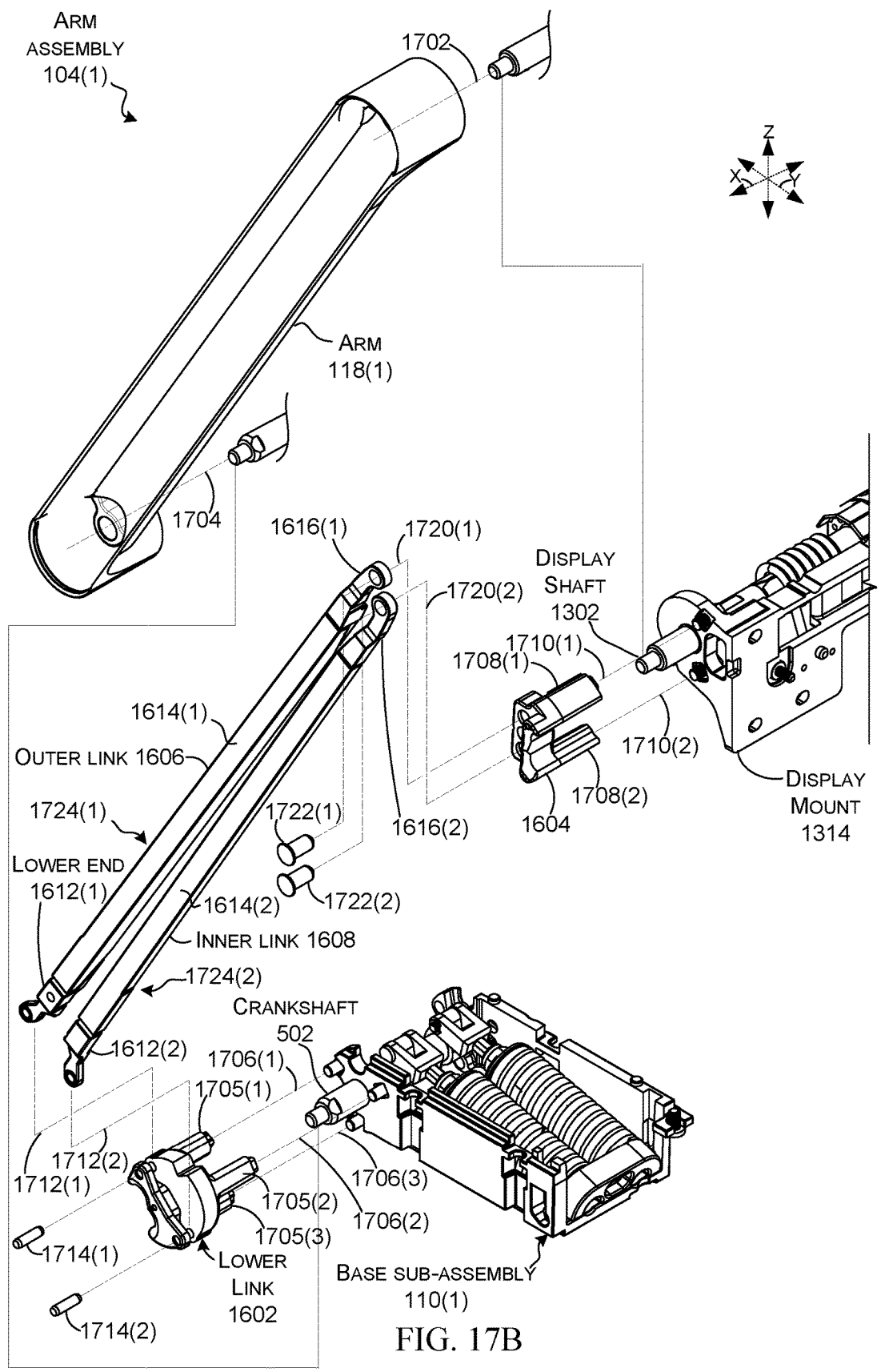

FIGS. 17A and 17B collectively show additional details of arm assembly 104(1). FIG. 17A is a perspective view of the arm assembly with the arm 118(1) separated from the links 1602-1608 and an arm cover 1700(1) removed from the arm 118(1) to visualize underlying components. FIG. 17B is a similar exploded view. FIG. 17B shows arm 118(1) is secured to display shaft 1302 as indicated by line 1702 and crankshaft 502 as indicated by line 1704. To help visualize this, a portion of the display shaft and the crank shaft are added in-line with the arm 118(1). For instance, the arm can be pressure fit onto the shafts. Alternatively or additionally the shafts and arm can be keyed or otherwise configured so that the arm maintains a relative orientation with the shafts (e.g., does not slip when the shafts rotate). Inside arm 118(1), lower link 1602 is secured to the base sub-assembly 110(1) via three legs 1705(1)-1705(3) as indicated by lines 1706(1), 1706(2), and 1706(3) of FIG. 17B.

The upper link 1604 is secured to the display mount 1314 of the display assembly 106 via two legs 1708(1) and 1708(2) as indicated by lines 1710(1) and 1710(2) of FIG. 17B. Lower ends 1612(1) and 1612(2) of the outer and inner links 1606 and 1608 can be secured to the lower link 1602 as indicated by lines 1712(1) and 1712(2) with fasteners 1714(1) and 1714(2) (which define axis points between the inner and outer links and the lower link). Upper ends 1616(1) and 1616(2) of the outer and inner links can be secured to the upper link 1604 as indicated by lines 1720(1) and 1720(2) with fasteners 1722(1) and 1722(2) (which define axis points between the inner and outer links and the upper link).

In some implementations, a length of the outer and inner links 1606 and 1608 can be affected by a tensioning element 1724. For example, the tensioning element could be a spring that extends within central region 1614 and is attached to lower end 1612 and upper end 1616 to bias them toward one another. This tensioning element can be used to pre-tension the inner and outer links for device operation. Another tensioning element 1724A implementation is described below relative to FIGS. 19A and 19B.

FIG. 18A shows a side view of arm assembly 104(1). FIG. 18B shows views of the arm 118(1), lower and upper links 1602 and 1604, and outer and inner links 1606 and 1608. The arm 118(1) includes a lower hub 1802 and an upper hub 1804. The lower link's legs 1705 protrude through spokes 1805 of lower hub 1802 to reach the base sub-assembly 110(1). Further, the legs 1705 define a range of rotation 1806 for the hub (e.g., the legs can act as stops for the hub and hence define the, for example, zero degree to 60 degree alpha angle range of rotation described above between the arm 118(1) and the base assembly 102 relative to FIG. 3). Of course, other implementations can have different ranges of rotations from the illustrated configuration.

Similarly, the upper link's legs 1708 protrude through spoke 1807 of the upper hub 1804 to reach the display mount 1314. Further, the legs 1708 define a range of rotation 1808 for the hub 1804 (e.g., the legs can act as stops for the hub and hence define the, for example, 20 degree to 90 degree display angle (e.g., beta angle) range of rotation described above relative to FIG. 3. Of course, other implementations can have different ranges of rotations from the illustrated configuration.

Note also, that the inside diameter of the hollow arm 118(1) defines an available radius 1810 for the lower and upper links 1602 and 1604 and their connections to the outer and inner links 1606 and 1608. The radius 1810 is illustrated only relative to the lower link but is applicable to the upper link as well. The present configuration allows a radius 1812 between the lower axis of rotation and the connection between the outer link and the lower link and a radius 1814 between the lower axis of rotation and the connection between the inner link and the lower link to be very close to radius 1810 (e.g., radius 1810 equals radii 1812 and 1814 plus tolerances). This configuration offers a robust four bar linkage compared to implementations that employ smaller radii 1812 and/or 1814.

Note also, that this configuration leaves a region 1816 for conductors (not shown) to travel from the base sub-assembly 110(1) through the lower link 1602 and the hub 1802, up the arm 118(1), and through another region 1818 through the hub 1804 and upper link 1604 to the display mount 1314 and ultimately to the display 108.

Figure 19A:
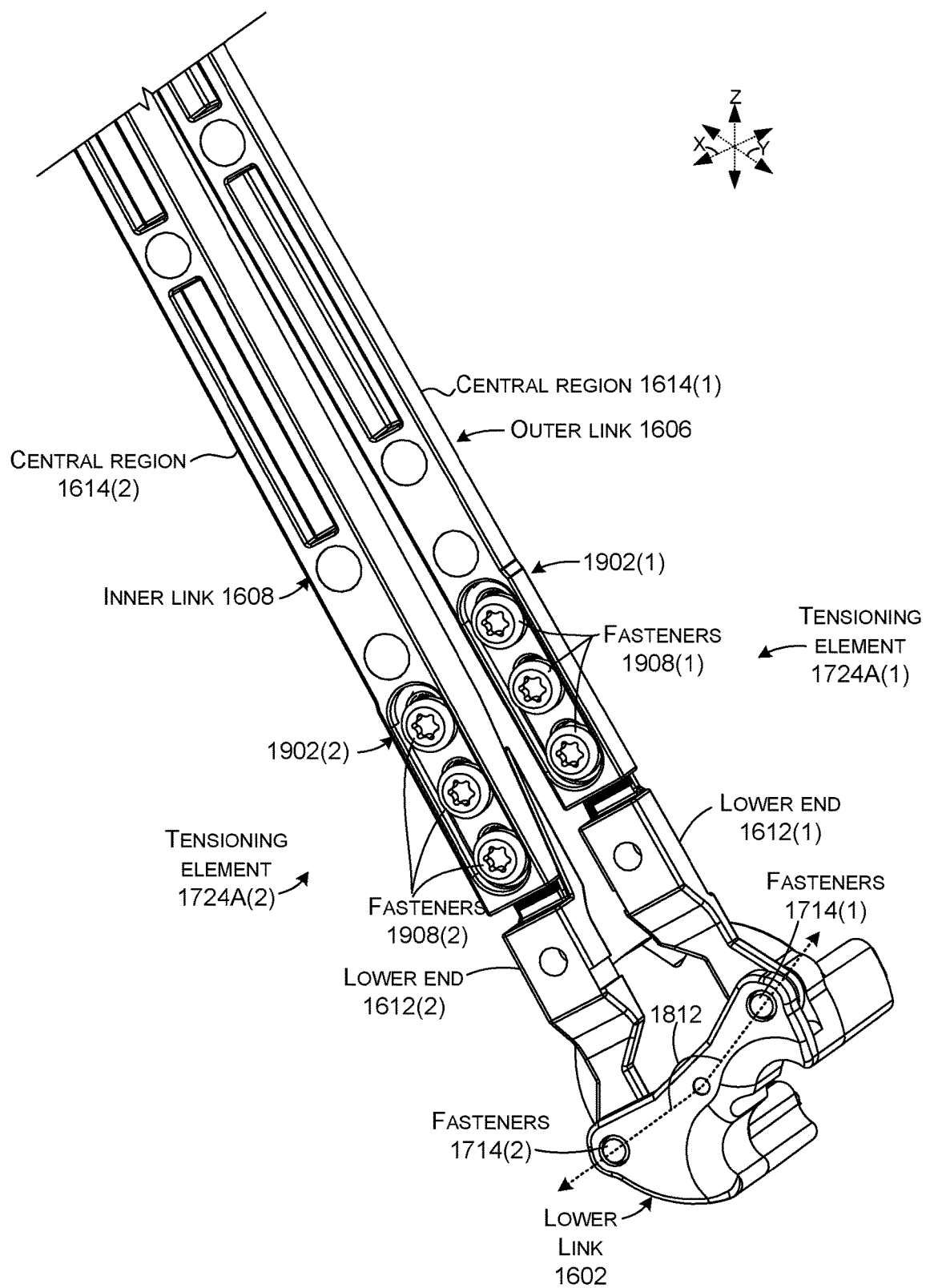
Figure 19B:
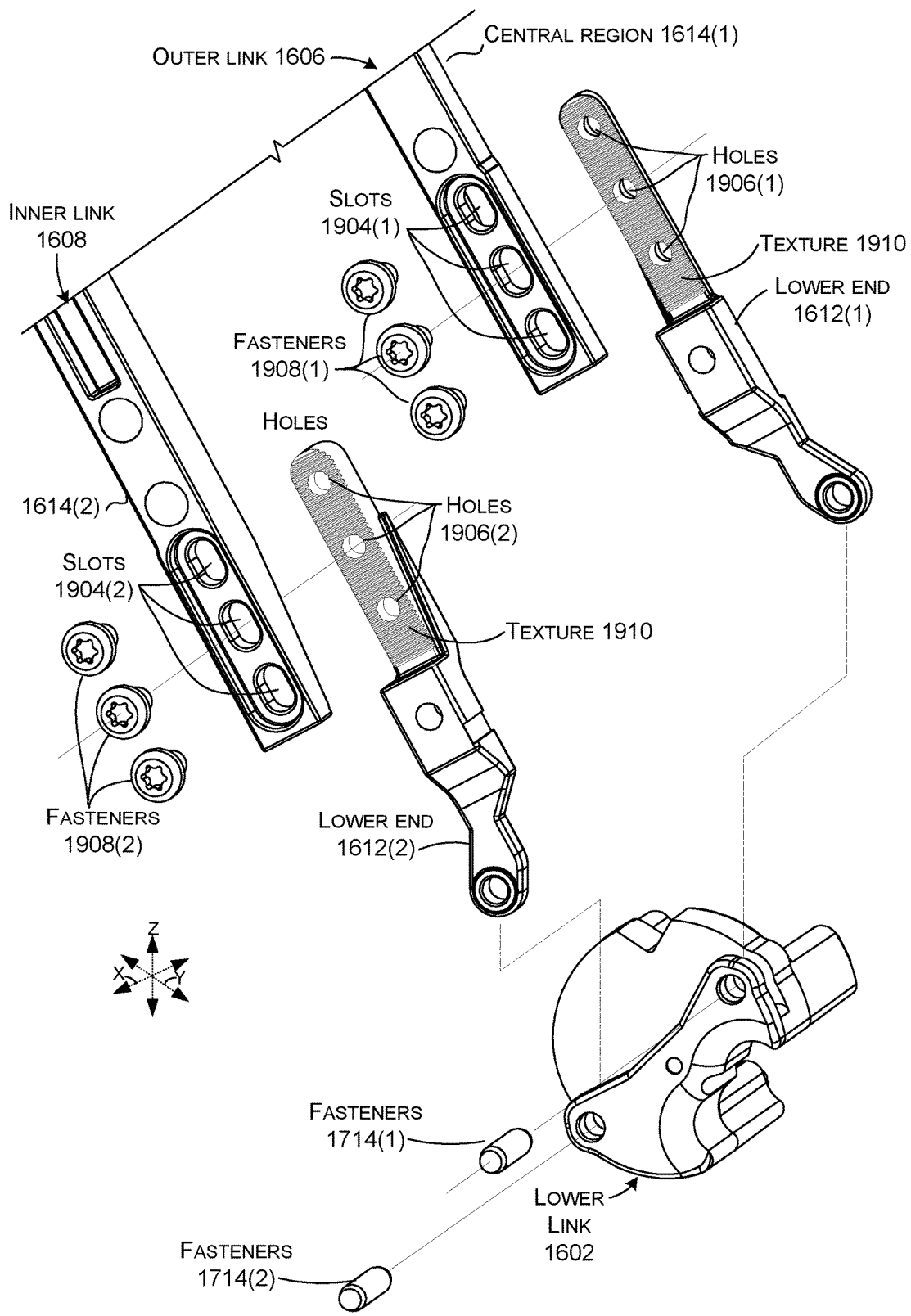

FIGS. 19A and 19B show an example tensioning element 1724A that is manifest as length adjusters 1902(1) and 1902(2) on the outer link 1606 and the inner link 1608. In this configuration, the lower ends 1612 are distinct and separate components from the central region 1614 of the outer and inner links. The lower ends 1612 can be secured to the lower link 1602 via fasteners 1714. The lower ends 1612 can be connected to the central region 1614 in a manner that controls an overall length of the outer and inner links 1606 and 1608. In this implementation, the central region 1614 can include slots 1904 that can be aligned with holes 1906 in the lower ends 1612. Fasteners 1908 can secure the central region to the lower ends to achieve a desired length of the outer and inner links. This feature can also be used to pre-tension the outer and inner links. For instance, relative to the outer link 1606, the fasteners 1908(1) could be secured through the slots 1904(1) into the holes 1906(1) to define an overall length of the outer link. Forces can then be applied to the lower link 1602 to turn slightly in a clockwise direction. (Forces could also be applied to the upper link 1604, FIG. 18B in a counter-clockwise direction). Fasteners 1908(2) could then be employed through the slots 1904(2) into the holes 1906(2) to secure the inner link 1608 at the length defined by the rotated lower link. Upon release of the lower link 1602, the outer link 1606 and the inner link 1608 will come to an equilibrium where both are under tension (e.g., pre-tensioned). This configuration (e.g., the pre-tensioning) can remove much or all of the free play from the device and create a 'tighter' more satisfying user experience. For instance, the pre-tensioning can reduce and/or eliminate bounce when a user engages the touch display. Further, the pre-tensioning in combination with the orientation of the connection points (e.g., fasteners 1714) between the outer and inner link 1606 and 1608 can create a tension profile that increases with an increasing alpha angle. An example of such a tension profile is shown in FIG. 20.

Note that various configurations can be employed to enhance the positional stability of the lower ends 1612 relative to the central regions 1614. For instance, texturing and/or dissimilar materials can be employed. In the illustrated configurations, the lower ends 1612 can be made of a relatively harder material, such as steel and the central regions 1614 can be made of a relatively softer material, such as aluminum. Texturing 1910 on the relatively harder material can be forced into the softer material of the central regions when fasteners 1908 bias the lower ends against the central regions. Note further, that other types of length adjusters are contemplated. For instance, an alternative implementation can employ a turnbuckle mechanism where the lower ends 1612 are threaded into the central regions 1614 and clockwise/counterclockwise rotation can be used to adjust the overall length of the outer link 1606 and/or the inner link 1608.

Figure 20:
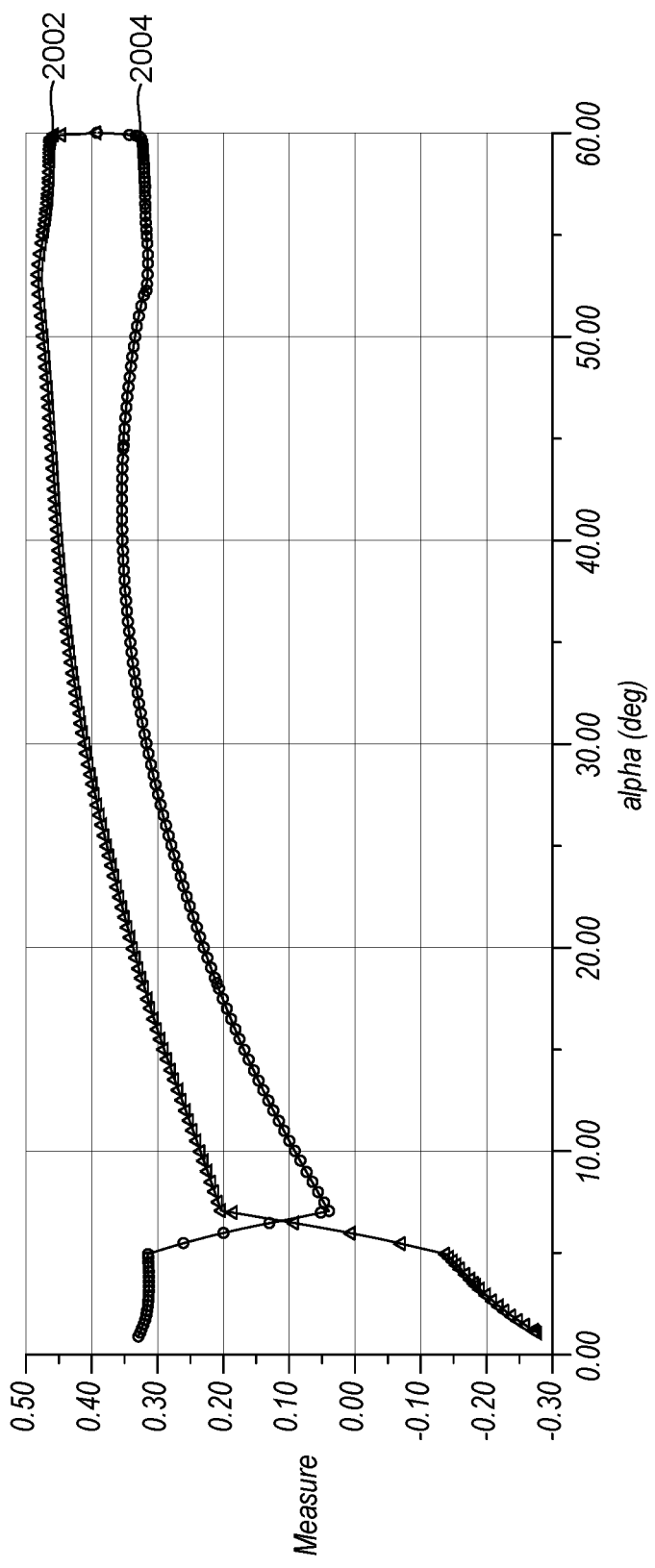

FIG. 20 shows a graph 2000 of tension profiles 2002 and 2004 for the outer and inner links 1606 and 1608 relative to alpha angles. From zero degrees to about six degrees (e.g., in the draw mode) the display may contact a horizontal surface that the device is sitting on (see for instance FIGS. 1D, 2 and 3). At this point 'play' in the device components can be beneficial and reduce stress induced component failure. However, once the device angle increases, such as starting at around 10 degrees, pre-tensioning can create a tighter feel and better user experience, especially when the user engages the display (touch display) 108. The user tends to want less play and for the device to hold its position as the orientation approaches a generally vertical display (e.g., alpha angle of 60 degrees). For instance, the user may want to be able to slightly adjust the display to hold an angle that is plus or minus a few degrees from vertical to reduce glare experienced by the user. (Thus, in some implementations the 'generally vertical' display angle (e.g., beta angle) can be up to 10 degrees +/− from vertical). The increased outer and inner link tension can supply the desired device feel. In some implementations, the friction element (1311, FIGS. 13A and 13B) can be used to fine tune the tightness of the display in combination with the pre-tensioning of the outer and inner link pre-tensioning described above. Also, an alternative pre-tensioning technique is described below.

Stated another way, some implementations can reduce/ eliminate free play motion by redundant links that maintain tension in the linkage such that little or no motion is allowed within the clearances needed for assembly. The free play motion can be corrected by adding a second long link (e.g. the inner and outer links). The second long link can be nearly identical to the first long link and can be essentially a mirror of the first long link about the arm center plane. The second long link can create an over-constraint condition that is generally avoided as part of good design practice. In this case, the over-constraint condition can be used to eliminate free play by using the adjustment of the second long link to create tension in both long links (e.g., inner and outer links). The tension can be created by applying a load on the linkage such that the first long link has excessive tension and tends to stretch a bit. Then the second long link adjustment can be set in a free state. After releasing the load, the first long link relaxes such that its tension is shared with the second long link. The tension in both long links can pull out any clearances, and free play is eliminated.

From one perspective, it is possible to control the friction, or resistance to motion, in the four bar linkage by adjusting the tensile load on the first long link (e.g., inner or outer link) when the second long link (e.g., other of the inner and outer link) is set. The higher the tensile load, the higher the shared load by both links after releasing the load. The greater the shared load, the greater the friction on the joints in the four bar mechanism. A certain amount of friction is desired to resist un-intended motion due to touch forces.

Some implementations offer the ability to not only control the average friction, but to design the mechanism such that the amount of friction changes in a desired way through the motion of the hinge. Through careful design of the four bar mechanism geometry, the tension in the long links and therefore the friction can increase or decrease as the hinge moves from a lowered position to a raised position. For instance, it may be desired to have high friction at a raised position ('work mode') in order to resist touch forces on the display. However, it may be desired to have lower friction between raised and lowered positions to allow effortless movement between but yet still have enough tension to remove any free play. It may also be desired to remove all long link tension and allow some free play as the hinge approaches a lowered position. This may be desired to enable the bottom edge ('chin') of the display to rub along the table or desk (e.g., resting surface) and create a stable condition for drawing without overloading the linkage. Toward this end, linkage geometry can be selected such that the pre-load tension changes in a desired manner through the range of motion.

Recall that some implementations can provide a small footprint that provides a fixed motion path for the display from an upright working position to a near flat drawing position. The implementations can achieve the small footprint while employing slender arms that help the display appear from the front as if it is "floating." These implementations can provide a weightless experience so that display weight is perfectly balanced throughout the range of travel.

ADDITIONAL EXAMPLES

Various device examples are described above. Additional examples are described below. One example includes a device comprising a base assembly including a processor and a base sub-assembly configured to define a lower axis of rotation. The device also comprises a display assembly including a display that is driven by the processor, and the display assembly is configured to define an upper axis of rotation for the display. The device further comprises an arm assembly rotatably connected between the base assembly and the display assembly and configured to translate an orientation of the display on the upper axis of rotation to an arm angle defined between the arm assembly and the base assembly relative to the lower axis of rotation.

Another example can include any of the above and/or below examples where the arm angle defined between the arm assembly and the base assembly can be adjusted by a user from a range of angles between zero degrees and 60 degrees.

Another example can include any of the above and/or below examples where the orientation of the display is generally vertical when the arm angle is 60 degrees.

Another example can include any of the above and/or below examples where the orientation of the display is in a range from about zero degrees to about 30 degrees when the arm angle is zero degrees.

Another example can include any of the above and/or below examples where the orientation of the display is generally vertical when the arm angle is 60 degrees, and where the arm assembly translates rotation of the display around the upper axis of rotation to rotation of the arm assembly around the lower axis of rotation.

Another example can include any of the above and/or below examples where when the arm angle is in a range from 60 degrees to 55 degrees, a center of mass of the display assembly is on a first side of the upper axis of rotation and when the arm angle is in another range from 55 degrees to zero degrees the center of mass is on a second opposite side of the upper axis of rotation.

Another example can include any of the above and/or below examples where a center of mass of the display assembly stays on a first side of the upper axis of rotation through all arm angles of the range of arm angles.

Another example can include any of the above and/or below examples where the base assembly includes a first biasing element configured to counter-balance the center of mass on the first side and a second biasing element configured to counter-balance the center of mass on the second side.

Another example can include any of the above and/or below examples where the base assembly includes a crankshaft, and the first and second biasing elements operate on the crankshaft.

Another example can include any of the above and/or below examples where the base assembly includes a first biasing element configured to counter-balance the center of mass on the first side and the display assembly includes a second biasing element configured to counter-balance the center of mass on the second side.

Another example can include any of the above and/or below examples where the base assembly includes a crankshaft and the first biasing element comprises a spring that operates on the crankshaft and the display assembly includes a display shaft and the second biasing element comprises a second spring that operates on the display shaft.

Another example can include any of the above and/or below examples where the second biasing element comprises the second spring that operates on the display shaft and a third opposing spring that operates on the display shaft.

Another example can include a device comprising a base assembly including a processor and a base sub-assembly configured to define a lower axis of rotation. The device also comprises a display assembly including a display that is driven by the processor and that is configured to define an upper axis of rotation for the display. The device further comprises an arm assembly rotatably connected between the base assembly and the display assembly. The base assembly, the arm assembly and the display assembly are configured to collectively define a fixed non-linear motion path of the display.

Another example can include any of the above and/or below examples where the fixed non-linear motion path ties an orientation of the display to an angle of the arm assembly.

Another example can include any of the above and/or below examples where the arm assembly is configured to translate an orientation of the display on the upper axis of rotation to an angle of the arm assembly.

Another example can include any of the above and/or below examples where the lower axis of rotation defines a position of the display and the upper axis of rotation defines an orientation of the display.

Another example can include a device comprising a base assembly, a display assembly that is configured to define an upper axis of rotation for a display, and an arm assembly extending between the base assembly and the display assembly. The device is configured to translate an arm angle between the base assembly and the arm assembly to a display angle.

Another example can include any of the above and/or below examples where the device translates a highest angle between the base assembly and the arm assembly to a generally vertical display angle and a lowest angle between the base assembly and the arm assembly to a generally horizontal display angle.

Another example can include any of the above and/or below examples where the device translates a highest angle between the base assembly and the arm assembly to a generally vertical display angle and a lowest angle between the base assembly and the arm assembly to a display angle in a range of about zero degrees to about 30 degrees.

Another example can include any of the above and/or below examples where a footprint of the base assembly and the arm assembly is contained within a footprint of the display at the generally horizontal display angle.

Another example can include any of the above and/or below examples where the device counter-balances torque caused by the display through a range of travel from the generally horizontal display angle to the generally vertical display angle.

Another example can include any of the above and/or below examples where the torque is non-linear through the range of travel.

Another example can include a device comprising a display coupled to a first end of an arm and a base including a crankshaft coupled to a second end of the arm. The crankshaft includes a crankpin that operates on a spring to counter-balance the display during rotation of the arm around the crankshaft.

Another example can include any of the above and/or below examples where the crankpin comprises a first crankpin and the spring comprises a first spring, and where the crankshaft includes a second crankpin that operates on a second spring to counter-balance the display.

Another example can include any of the above and/or below examples where the first crankpin and the second crankpin are aligned relative to a base axis of rotation defined by the crankshaft and where the first spring and the second spring are redundant.

Another example can include any of the above and/or below examples where the first crankpin and the second crankpin are offset from one another when viewed along a base axis of rotation defined by the crankshaft.

Another example can include any of the above and/or below examples where the first spring imparts a force on the first crankpin in a first rotational direction and the second spring imparts a counter force in an opposite second rotational direction that partially cancels the force.

Another example can include any of the above and/or below examples where the second spring imparts the counter force for a subset of angles of the rotation.

Another example can include any of the above and/or below examples where the second spring imparts the counter force for all angles of the rotation.

Another example can include any of the above and/or below examples where the device comprises a first connecting rod coupled to the first crankpin and a second connecting rod coupled to the second crankpin and where the first spring is coextensive with the first connecting rod and the second spring is coextensive with the second connecting rod.

Another example can include any of the above and/or below examples where the first crankpin and the second crankpin are oriented identically when viewed along the base axis of rotation defined by the crankshaft.

Another example can include any of the above and/or below examples where the first crankpin and the second crankpin are oriented differently.

Another example can include any of the above and/or below examples where the spring is a compression spring.

Another example can include any of the above and/or below examples where the spring comprises multiple nested springs.

Another example can include a device comprising a display coupled to a first end of an arm and a base including a crankshaft coupled to a second end of the arm. The crankshaft includes a first crankpin coupled to a first compression spring and a second crankpin coupled to a second compression spring. The first and second compression springs are configured to impart forces on the crankpins to at least partially counter-balance rotational forces imparted on the crankshaft by the display.

Another example can include any of the above and/or below examples where the first spring is configured to impart a first force on the first crankpin in a first direction and the second spring is configured to impart a second force on the second crankpin in a second direction.

Another example can include any of the above and/or below examples where the first force and the second force are in a same direction and have a same value.

Another example can include any of the above and/or below examples where the first force and the second force are in a same direction and have different values.

Another example can include any of the above and/or below examples where the first force and the second force are in opposite directions.

Another example can include any of the above and/or below examples where the first force comprises a first range of values imparted on the first crankpin for a first set of angles defined between the arm and the base, and the second force comprises a second range of values imparted on the second crankpin for a second set of angles defined between the arm and the base.

Another example can include any of the above and/or below examples where the first set of angles equal the second set of angles.

Another example can include any of the above and/or below examples where the first set of angles are different from the second set of angles.

Another example can include any of the above and/or below examples where the first set of angles overlap with the second set of angles.

Another example can include any of the above and/or below examples where the device further comprises a first connecting rod, where a first end of the first connecting rod is connected to the first crankpin.

Another example can include any of the above and/or below examples where the device further comprises a second connecting rod, where a first end of the second connecting rod is connected to the second crankpin.

Another example can include any of the above and/or below examples where the first connecting rod passes through the first spring and the second connecting rod passes through the second spring. The device further comprises a bracket configured to maintain the second spring away from the crank.

Another example can include any of the above and/or below examples where the base comprises a slot and a cradle, where the cradle is configured to be removeably received in the slot and where a second end of the first connecting rod and a second end of the second connecting rod each pass through the cradle.

Another example can include any of the above and/or below examples where the cradle is retained in the slot by the forces imparted by the first and second compression springs on the cranks pins.

Another example can include a device comprising a display coupled to a first end of an arm. The device also comprises a base including a crankshaft coupled to a second end of the arm. The crankshaft includes a first crankpin coupled to a first connecting rod that is configured to engage a first compression spring and a second crankpin coupled to a second connecting rod that is configured to engage a second compression spring, where angular rotation of the arm relative to the base is configured to cause the first connecting rod to engage the first compression spring and the second connecting rod to engage the second compression spring.

Another example can include any of the above and/or below examples where a first amount of the angular rotation of the arm causes the first connecting rod to engage the first compression spring and the second connecting rod to engage the second compression spring.

Another example can include any of the above and/or below examples where a first amount of the angular rotation of the arm causes the first connecting rod to engage the first compression spring and a second amount of angular rotation causes the second connecting rod to engage the second compression spring.

Another example can include any of the above and/or below examples where the first crankpin is coupled to a first crank of the crankshaft, and the second crankpin is coupled to a second crank of the crankshaft, and where the first crank is offset from the second crank when viewed along an axis of rotation of the crankshaft, and where a highest torque on the first crank created by the first compression spring is at a different rotational orientation of the crankshaft than a highest torque on the second crank created by the second compression spring.

Another example can include a device comprising a base rotatably coupled to a lower end of an arm, a display secured relative to a display shaft that is rotatably coupled to an upper end of the arm, and a biasing element secured relative to the display and the display shaft and configured to counter-balance rotation of the display around the display shaft.

Another example can include any of the above and/or below examples where the biasing element comprises a first biasing element configured to counter-balance rotation of the display when the arm is at a first angle relative to the base and a second biasing element configured to counter-balance rotation of the display when the arm is at a second display angle relative to the base.

Another example can include any of the above and/or below examples where the first biasing element comprises a first spring that is wound around the display shaft in a first direction and the second biasing element comprises a second spring that is wound around the display shaft in a second direction opposite the first direction.

Another example can include any of the above and/or below examples where the biasing element comprises a spring that is wound around the display shaft and a first end of the spring is secured relative to the display and a second end of the spring is secured relative to the display shaft.

Another example can include any of the above and/or below examples where the device further comprises a spring calibrator secured to the display shaft, and where the second end of the spring is secured to the spring calibrator.

Another example can include any of the above and/or below examples where the device further comprises a spring calibrator secured to the display shaft, and where the second end of the spring is free to rotate relative to a region of the spring calibrator until engaging a stop on the spring calibrator that engages the second end and blocks continuing rotation in a direction of rotation of the spring, but allows the second end to disengage and rotate in an opposite direction of the direction of rotation.

Another example can include any of the above and/or below examples where the spring calibrator comprises a fixed element that is secured to the display shaft and a rotatable element that is selectively rotatable relative to the fixed element and wherein the second end of the spring is secured to the rotatable element of the spring calibrator.

Another example can include any of the above and/or below examples where the rotatable element includes a first set of indexed holes that are spaced apart angularly by a specific number of degrees, and where the fixed element includes a second set of indexed holes that are spaced apart angularly by a larger specific number of degrees so that one hole from the first set of holes is aligned with an individual hole from the second set of holes for a given relative orientation of the rotatable element to the fixed element and other holes from the first set of holes are not aligned with other holes from the second set of holes.

Another example can include any of the above and/or below examples where the rotatable element includes a first set of indexed holes that are spaced apart angularly by a specific number of degrees, and where the fixed element includes a second set of indexed holes that are spaced apart angularly by a smaller specific number of degrees so that only one hole from the first set of holes is aligned with an individual hole from the second set of holes for a given relative orientation of the rotatable element to the fixed element and other holes from the first set of holes are not aligned with other holes from the second set of holes.

Another example can include any of the above and/or below examples where the spring calibrator comprises a fixed element that is secured to the display shaft and a rotatable element that is selectively rotatable relative to the fixed element, and where the second end of the spring is secured to the rotatable element, and the spring calibrator is co-extensive with the display shaft.

Another example can include a device comprising a display secured relative to a display shaft, a first spring wound around the display shaft in a first rotational direction and coupled between the display and the display shaft, and a second spring wound around the display shaft in a second opposite rotational direction and coupled between the display and the display shaft.

Another example can include any of the above and/or below examples where the first spring comprises a first biasing element configured to counter-balance display rotation at a first set of display angles and the second spring comprises a second biasing element configured to counter-balance display rotation for a second set of display angles.

Another example can include any of the above and/or below examples where the first set of display angles comprises 90 degrees to 77 degrees, and where the second set of display angles comprises 77 degrees to zero degrees.

Another example can include any of the above and/or below examples where the display is attached to a display mount and the display shaft passes through the display mount.

Another example can include any of the above and/or below examples where the device further comprises a first spring calibrator associated with the first spring and a second spring calibrator associated with the second spring.

Another example can include any of the above and/or below examples where the first spring is secured between the display mount and the first spring calibrator, and where the second spring is secured between the display mount and the second spring calibrator.

Another example can include any of the above and/or below examples where the first spring calibrator and the second spring calibrator are implemented as Vernier spring calibrators.

Another example can include a device comprising a touch display secured relative to a display shaft, a base assembly, an arm extending from the base to the display shaft, a spring exerting a spring force between the touch display and the display shaft to counter-balance rotation of the display around the display shaft, and a Vernier spring calibrator configured to allow adjustment of the spring to control the spring force.

Another example can include any of the above and/or below examples where the Vernier spring calibrator comprises a first Vernier spring calibrator that comprises first and second discs coextensive with the display shaft.

Another example can include any of the above and/or below examples where the first disc is secured to the display shaft and the second disc is selectively rotatable relative to the first disc, and where a first end of the spring is secured to the display and a second end of the spring is attached to the second disc.

Another example can include any of the above and/or below examples where the first disc includes a first set of indexed holes that are spaced apart angularly by a specific number of degrees, and where the second disc includes a second set of indexed holes that are spaced apart angularly by a larger specific number of degrees so that only one hole from the first set holes is aligned with an individual hole from the second set of holes for a given relative orientation of the first disc to the second disc.

Another example can include any of the above and/or below examples where the specific number of degrees of the first set of indexed holes of the first disc is 30 degrees, and where the larger specific number of degrees of the second set of indexed holes of the second disc is 36 degrees.

Another example can include any of the above and/or below examples where the device further comprises a second spring exerting a second spring force on the display shaft and associated with a second Vernier spring calibrator.

Another example can include any of the above and/or below examples where the second Vernier spring calibrator includes a pair of indexed discs, and where indexing on the first Vernier spring calibrator and the second Vernier spring calibrator are the same.

Another example can include any of the above and/or below examples where the indexing the first Vernier spring calibrator is different than the second Vernier spring calibrator.

Another example can include a device comprising a base assembly that includes a processor and is configured to define a lower axis of rotation, a display assembly including a display that is driven by the processor and configured to rotate around an upper axis of rotation, and also comprising an arm assembly extending from the base assembly at the lower axis of rotation to the display assembly at the upper axis of rotation. The arm assembly comprises a hollow arm and a four bar linkage contained within the hollow arm. The four bar linkage comprises a pair of redundant elongated links that extend between the lower axis of rotation and the upper axis of rotation and that function as one link of the four bar linkage and the hollow arm functions as another link of the four bar linkage.

Another example can include any of the above and/or below examples where the pair of redundant elongated links are positioned on opposing sides of a line that extends between the upper axis of rotation and the lower axis of rotation.

Another example can include any of the above and/or below examples where the hollow arm is configured to rotate through a range of angles relative to the base assembly, and where both elongate links of the pair of redundant elongated links are under tension for an entirety of the range of angles.

Another example can include any of the above and/or below examples where the tension increases with increasing angles of the range of angles.

Another example can include any of the above and/or below examples where the pair of redundant elongated links comprises a first link and a second link, and where a lower end of the first link is fixedly secured on an opposite side of the lower axis of rotation from a lower end of the second link.

Another example can include any of the above and/or below examples where a relative position of the lower ends is maintained when the hollow arm rotates around the lower axis of rotation.

Another example can include any of the above and/or below examples where an upper end of the first link is secured on an opposite side of the upper axis of rotation from an upper end of the second link.

Another example can include any of the above and/or below examples where the upper end of the first link and the upper end of the second link rotate around the upper axis of rotation when the hollow arm rotates around the upper axis of rotation.

Another example can include any of the above and/or below examples where the pair of redundant elongated links includes a biasing element that operates on a length of the pair of redundant links.

Another example can include any of the above and/or below examples where the biasing element comprises a length adjuster.

Another example can include any of the above and/or below examples where each elongate link of the pair of redundant elongated links includes a dedicated length adjuster.

Another example can include any of the above and/or below examples where each elongate link of the pair of redundant elongated links includes a central portion that is adjustably secured to upper and lower portions.

Another example can include any of the above and/or below examples where one elongate link of the pair of redundant elongated links is length adjustable.

Another example can include a device comprising a base assembly that includes a processor and is configured to define a lower axis of rotation. The device also comprises a display assembly including a display that is driven by the processor and configured to rotate around an upper axis of rotation. The device further comprises an arm assembly extending from the base assembly at the lower axis of rotation to the display assembly at the upper axis of rotation. The arm assembly comprises a hollow arm and a pair of first and second redundant elongated links extending between the lower axis of rotation and the upper axis of rotation, where the first redundant elongated link is secured on a first side of the lower axis of rotation and the upper axis of rotation and the second redundant elongated link is secured on a second opposite side of the lower axis of rotation and the upper axis of rotation.

Another example can include any of the above and/or below examples where the first redundant elongate link includes a length adjuster.

Another example can include any of the above and/or below examples where shortening the length adjuster causes both the first and second redundant elongate links to operate under tension.

Another example can include any of the above and/or below examples where the first redundant elongate link includes a first length adjuster and the second redundant elongate link includes a second length adjuster.

Another example can include any of the above and/or below examples where an upper end of the first redundant elongate link includes a first length adjuster, a lower end of the first redundant elongate link comprises a second length adjuster, an upper end of the second redundant elongate link comprises a third length adjuster, and a lower end of the second redundant elongate link comprises a fourth length adjuster.

Another example can include a device comprising a base assembly that defines a lower axis of rotation, a display assembly including a display that rotates around an upper axis of rotation, and further comprising an arm assembly. The arm assembly comprises a set of over constrained links extending from the lower axis of rotation of the base assembly to the upper axis of rotation of the display assembly. The arm assembly further comprises a hollow arm that functions as a first link between the lower axis of rotation and the upper axis of rotation and a pair of first and second redundant elongated links extending between the lower axis of rotation and the upper axis of rotation, where the first redundant elongated link is secured on a first side of the lower axis of rotation and the upper axis of rotation and the second redundant elongated link is secured on a second opposite side of the lower axis of rotation and the upper axis of rotation.

Another example can include any of the above and/or below examples where the arm assembly comprises a hollow arm that functions as one of the set of over constrained links.

Another example can include any of the above and/or below examples where a first pivot point of the first redundant elongate link proximate to the lower axis of rotation and a second pivot point of the second redundant elongate link proximate to the lower axis of rotation form an angle having the lower axis of rotation as a vertex, and where the angle changes a preload of the first and second redundant elongate links as the arm assembly moves the display assembly through a range of angles relative to the base assembly.

Another example can include any of the above and/or below examples where the device further comprises a third pivot point of the first redundant elongate link proximate to the upper axis of rotation and a fourth pivot point of the second redundant elongate link proximate to the upper axis of rotation, and where the pivot points translate the range of angles of the arm assembly to an angle of the display.

Another example can include a device comprising a base assembly including a processor and a base shaft configured to define a lower axis of rotation. The device also comprises a display assembly including a display that is driven by the processor, the display secured by a display mount relative to a display shaft that is configured to define an upper axis of rotation. The device further comprises a hollow arm secured to the base shaft and the display shaft, and comprises a lower link positioned within the hollow arm and secured to the base assembly, and an upper link positioned within the hollow arm and secured to the display mount.

Another example can include any of the above and/or below examples where the lower link defines a range of rotation of the hollow arm at the lower axis of rotation.

Another example can include any of the above and/or below examples where the lower link and the upper link are configured to secure two additional links that extend between the lower link and the upper link.

Another example can include any of the above and/or below examples where the lower link includes first and second fasteners for receiving the two additional links.

Another example can include any of the above and/or below examples where the first and second fasteners and the lower axis of rotation lie along a single line.

Another example can include any of the above and/or below examples where the first and second fasteners and the lower axis of rotation form an obtuse angle relative to the display assembly where the lower axis of rotation comprises a vertex of the obtuse angle.

Another example can include any of the above and/or below examples where the upper link includes third and fourth fasteners for receiving the two additional links.

Another example can include any of the above and/or below examples where the third and fourth fasteners and the upper axis of rotation lie along a single line.

Another example can include any of the above and/or below examples where the third and fourth fasteners and the upper axis of rotation form an obtuse angle relative to the base assembly where the upper axis of rotation comprises the vertex of the obtuse angle.

Another example can include any of the above and/or below examples where the upper link defines a range of rotation of the hollow arm at the upper axis of rotation.

Another example can include a device comprising a base assembly including a base shaft configured to define a lower axis of rotation. The device also comprises a display assembly including a display mount securing a display and rotatably secured to a display shaft that is configured to define an upper axis of rotation. The device further comprises a hollow arm secured to the base shaft and the display shaft, and comprises a lower link positioned within the hollow arm and fixedly secured to the base assembly, and an upper link positioned within the hollow arm and fixedly secured to the display mount, wherein the hollow arm rotates with the base shaft while the lower link is stationary and the upper link rotates with the display mount.

Another example can include any of the above and/or below examples where the lower link defines stops that limit a range of travel of the hollow arm relative to the base assembly, and where the upper link defines stops that limit a range of travel of the hollow arm relative to the display assembly.

Another example can include any of the above and/or below examples where the hollow arm defines an upper hub attached to the upper axis of rotation and a lower hub attached to the lower axis of rotation.

Another example can include any of the above and/or below examples where the lower link passes between spokes of the lower hub to attach to the base assembly.

Another example can include any of the above and/or below examples where angular distance between the spokes and the lower link defines a range of rotation of the arm relative to the base assembly.

Another example can include any of the above and/or below examples where the upper link passes between spokes of the upper hub to attach to the display mount.

Another example can include any of the above and/or below examples where angular distance between the spokes and the upper link defines a range of rotation of the arm relative to the display.

Another example can include a device comprising a base assembly including a base shaft configured to define a lower axis of rotation. The device also comprises a display mount secured to a display and rotatably secured to a display shaft that is configured to define an upper axis of rotation. The device further comprises a hollow arm including an upper hub attached to the display shaft and a lower hub attached to the base shaft, and comprises a lower link positioned within the lower hub and fixedly secured through the lower hub to the base assembly, and an upper link positioned within the upper hub and fixedly secured through the upper hub to the display mount.

Another example can include any of the above and/or below examples where the lower link defines stops that limit a range of travel of the hollow arm relative to the base assembly.

Another example can include any of the above and/or below examples where the upper link defines stops that limit a range of travel of the hollow arm relative to the display.

Another example can include any of the above and/or below examples where the lower hub includes spokes, and where the lower link extends between the spokes to the base assembly.

CONCLUSION

Although techniques, methods, devices, systems, etc., pertaining to counter-balanced displays are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
a base rotatably coupled to a lower end of an arm;
a display secured relative to a display shaft that is rotatably coupled to an upper end of the arm such that an orientation of the display relative to the arm is automatically changed by the display shaft responsive to a change in orientation of the arm relative to the base; and,
a biasing element secured relative to the display and the display shaft and configured to counter-balance rotation of the display around the display shaft.

2. The device of claim 1, wherein the biasing element comprises a first biasing element configured to counter-balance rotation of the display when the orientation of the arm relative to the base comprises a first display angle and a second biasing element configured to counter-balance rotation of the display when the orientation of the arm relative to the base comprises a second display angle.

3. The device of claim 2, wherein the first biasing element comprises a first spring that is wound around the display shaft in a first direction and the second biasing element comprises a second spring that is wound around the display shaft in a second direction opposite the first direction.

4. The device of claim 1, wherein the biasing element comprises a spring that is wound around the display shaft and a first end of the spring is secured relative to the display and a second end of the spring is secured relative to the display shaft.

5. The device of claim 4, further comprising a spring calibrator secured to the display shaft and wherein the second end of the spring is secured to the spring calibrator.

6. The device of claim 4, further comprising a spring calibrator secured to the display shaft and wherein the second end of the spring is free to rotate relative to a region of the spring calibrator until engaging a stop on the spring calibrator that engages the second end and blocks continuing rotation in a direction of rotation of the spring, but allows the second end to disengage and rotate in an opposite direction of the direction of rotation.

7. The device of claim 5, wherein the spring calibrator comprises a fixed element that is secured to the display shaft and a rotatable element that is selectively rotatable relative to the fixed element and wherein the second end of the spring is secured to the rotatable element of the spring calibrator.

8. The device of claim 7, wherein the rotatable element includes a first set of indexed holes that are spaced apart angularly by a specific number of degrees and wherein the fixed element includes a second set of indexed holes that are spaced apart angularly by a larger specific number of degrees so that one hole from the first set of indexed holes is aligned with an individual hole from the second set of indexed holes for a given relative orientation of the rotatable element to the fixed element and other holes from the first set of indexed holes are not aligned with other holes from the second set of indexed holes.

9. The device of claim 7, wherein the rotatable element includes a first set of indexed holes that are spaced apart angularly by a specific number of degrees and wherein the fixed element includes a second set of indexed holes that are spaced apart angularly by a smaller specific number of degrees so that only one hole from the first set of indexed holes is aligned with an individual hole from the second set of indexed holes for a given relative orientation of the rotatable element to the fixed element and other holes from the first set of indexed holes are not aligned with other holes from the second set of indexed holes.

10. The device of claim 5, wherein the spring calibrator comprises a fixed element that is secured to the display shaft and a rotatable element that is selectively rotatable relative to the fixed element and wherein the second end of the spring is secured to the rotatable element and the spring calibrator is co-extensive with the display shaft.

11. A device, comprising:
a display secured relative to a display shaft;
a base rotatably coupled to an arm, the arm secured relative to the display shaft;
a first spring wound around the display shaft in a first rotational direction and coupled between the display and the display shaft, the first spring configured to produce torque dependent upon an orientation of the display relative to the arm and a corresponding orientation of the arm relative to the base; and,
a second spring wound around the display shaft in a second opposite rotational direction and coupled between the display and the display shaft.

12. The device of claim 11, wherein the first spring comprises a first biasing element configured to counter-balance display rotation at a first set of display angles and the second spring comprises a second biasing element configured to counter-balance the display rotation for a second set of display angles.

13. The device of claim 12, wherein the first and second sets of display angles relate to the orientation of the display relative to the arm, the first set of display angles comprising 90 degrees to 77 degrees and the second set of display angles comprising 77 degrees to zero degrees.

14. The device of claim 11, wherein the corresponding orientation of the arm relative to the base is automatically changed responsive to a change in the orientation of the display relative to the arm.

15. The device of claim 11, further comprising a display mount, the display attached to the display mount and the display shaft passing through the display mount.

16. The device of claim 15, further comprising a first spring calibrator associated with the first spring and a second spring calibrator associated with the second spring, wherein the first spring is secured between the display mount and the first spring calibrator, and wherein the second spring is secured between the display mount and the second spring calibrator.

17. The device of claim 16, wherein the first spring calibrator and the second spring calibrator provide a spring preload adjustment that does not slip during rotation of the display relative to the display shaft.

18. A device, comprising:
a touch display secured relative to a display shaft;
a base assembly;
an arm extending from the base assembly to the display shaft;
a spring configured to exert a spring force between the touch display and the display shaft dependent on an orientation of the touch display relative to the arm and a corresponding orientation of the arm relative to the base assembly to counter-balance rotation of the touch display around the display shaft; and,
a spring calibrator configured to allow a spring preload adjustment of the spring to control the spring force.

19. The device of claim 18, wherein the spring calibrator comprises a first spring calibrator that comprises first and second discs coextensive with the display shaft.

20. The device of claim 19, wherein the first disc is secured to the display shaft and the second disc is selectively rotatable relative to the first disc and wherein a first end of the spring is secured to the display and a second end of the spring is attached to the second disc.

21. The device of claim 19, wherein the first disc includes a first set of indexed holes that are spaced apart angularly by a specific number of degrees and wherein the second disc includes a second set of indexed holes that are spaced apart angularly by a larger specific number of degrees so that only one hole from the first set of indexed holes is aligned with an individual hole from the second set of indexed holes for a given relative orientation of the first disc to the second disc.

22. The device of claim 21, wherein the specific number of degrees of the first set of indexed holes of the first disc is 30 degrees and wherein the larger specific number of degrees of the second set of indexed holes of the second disc is 36 degrees.

23. The device of claim 21, further comprising a second spring exerting a second spring force on the display shaft and associated with a second spring calibrator.

24. The device of claim 23, wherein the second spring calibrator includes a pair of indexed discs, and wherein indexing on the first spring calibrator and the second spring calibrator are the same.

25. The device of claim 23, wherein the second spring calibrator includes a pair of indexed discs, and wherein indexing on the first spring calibrator is different than on the second spring calibrator.

* * * * *